United States Patent
Bae et al.

(10) Patent No.: US 12,489,098 B2
(45) Date of Patent: Dec. 2, 2025

(54) DISPLAY DEVICE AND METHOD OF FABRICATING THE SAME

(71) Applicant: Samsung Display Co., LTD., Yongin-si (KR)

(72) Inventors: Su Bin Bae, Hwaseong-si (KR); Yun Jong Yeo, Hwaseong-si (KR); Da Woon Jung, Hwaseong-si (KR); Yu Gwang Jeong, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 561 days.

(21) Appl. No.: 17/735,294

(22) Filed: May 3, 2022

(65) Prior Publication Data

US 2023/0054453 A1 Feb. 23, 2023

(30) Foreign Application Priority Data

Aug. 19, 2021 (KR) .................. 10-2021-0109204

(51) Int. Cl.
*H10H 20/857* (2025.01)
*H01L 23/00* (2006.01)
(Continued)

(52) U.S. Cl.
CPC ............ *H01L 25/167* (2013.01); *H01L 24/24* (2013.01); *H01L 24/25* (2013.01); *H01L 24/82* (2013.01);
(Continued)

(58) Field of Classification Search
CPC . H01L 33/62; H01L 33/44; H01L 2933/0066; H01L 25/0753; H01L 25/167;
(Continued)

(56) References Cited

U.S. PATENT DOCUMENTS

2013/0234294 A1 9/2013 Hu et al.
2018/0019369 A1\* 1/2018 Cho .................... H01L 25/0753
(Continued)

FOREIGN PATENT DOCUMENTS

KR 10-2018-0007376 1/2018
KR 10-2019-0081674 7/2019
(Continued)

OTHER PUBLICATIONS

Extended European Search Report for European Patent Application or Patent No. 22191085.4, dated Dec. 19, 2022.

*Primary Examiner* — Matthew C Landau
*Assistant Examiner* — David W Ward
(74) *Attorney, Agent, or Firm* — Womble Bond Dickinson (US) LLP

(57) ABSTRACT

A display device includes a first electrode and a second electrode, a first insulating layer covering the first electrode and the second electrode, light emitting elements disposed on the first insulating layer, a first connection electrode disposed on the first electrode and contacting an end of each of the light emitting elements, a second connection electrode spaced apart from the first connection electrode and disposed on the second electrode and contacting another end of each of the light emitting elements, a second insulating layer disposed on the first insulating layer and at least partially covering the first connection electrode and the second connection electrode, and a third insulating layer disposed on part of the second insulating layer, wherein the second insulating layer comprises an opening overlapping a part between the first connection electrode and the second connection electrode spaced apart from each other.

20 Claims, 36 Drawing Sheets

(51) Int. Cl.
*H01L 25/16* (2023.01)
*H10H 20/01* (2025.01)
*H10H 20/825* (2025.01)
*H10H 20/84* (2025.01)

(52) U.S. Cl.
CPC . *H10H 20/857* (2025.01); *H01L 2224/24051* (2013.01); *H01L 2224/24145* (2013.01); *H01L 2224/25175* (2013.01); *H01L 2224/82106* (2013.01); *H10H 20/0364* (2025.01); *H10H 20/8252* (2025.01); *H10H 20/84* (2025.01)

(58) Field of Classification Search
CPC ............... H01L 27/156; H01L 33/20; H01L 2933/0016; H01L 33/38; H01L 33/005; H01L 33/387; H01L 24/24; H01L 24/25; H01L 24/82; H01L 2224/24051; H01L 2224/24145; H01L 2224/25175; H01L 2224/82106; H10B 80/00; H10K 39/10; H10K 39/12; H10K 39/15; H10K 39/18; H10K 39/601; H10K 39/621; H10K 59/90; H10K 59/95; H10N 19/00; H10N 39/00; H10N 59/00; H10N 69/00; H10N 79/00; H10N 89/00; H10H 20/857; H10H 29/49; H10H 29/857; H10H 29/922; H10H 29/942; H10H 20/0364; H10H 20/01; H10H 29/0364; H10H 20/8252; H10H 20/84; H10H 29/842; H10H 29/8517; H10H 29/8552
See application file for complete search history.

(56) References Cited

U.S. PATENT DOCUMENTS

| | | | |
|---|---|---|---|
| 2021/0134877 A1 | 5/2021 | Kim et al. | |
| 2021/0159268 A1* | 5/2021 | Heo | H10K 59/122 |
| 2021/0167253 A1* | 6/2021 | Basrur | H01L 33/38 |
| 2021/0280746 A1* | 9/2021 | Kim | H10H 20/84 |
| 2021/0288217 A1* | 9/2021 | Li | H10H 20/84 |
| 2022/0375990 A1 | 11/2022 | Im et al. | |
| 2023/0006119 A1 | 1/2023 | Oh et al. | |

FOREIGN PATENT DOCUMENTS

| | | | | |
|---|---|---|---|---|
| KR | 10-2020-0010704 | | 1/2020 | |
| KR | 20200010704 A | * | 1/2020 | ........... H01L 25/167 |
| KR | 20200011629 A | * | 2/2020 | ............ H01L 33/62 |
| KR | 10-2021-0029337 | | 3/2021 | |
| KR | 10-2021-0075291 | | 6/2021 | |
| WO | 2021/242074 | | 12/2021 | |

* cited by examiner

RME: RME1, RME2

CNE: CNE1, CNE2
RME: RME1, RME2
PAS3: IP1, IP2

DISPLAY DEVICE AND METHOD OF FABRICATING THE SAME

CROSS-REFERENCE TO RELATED APPLICATION(S)

This application claims priority to and benefits of Korean Patent Application No. 10-2021-0109204 under 35 U.S.C. § 119, filed on Aug. 19, 2021 in the Korean Intellectual Property Office (KIPO), the entire contents of which are incorporated herein by reference.

BACKGROUND

1. Technical Field

The disclosure relates to a display device and a method of fabricating the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device which includes electrodes spaced apart from each other by a distance smaller than a patterning process using a mask.

Aspects of the disclosure also provide a method of fabricating a display device, the method being employed to form, in a patterning process using a mask, patterns spaced apart from each other by a distance smaller than limit resolution of the process.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprises a first electrode and a second electrode spaced apart from each other on a substrate, a first insulating layer disposed on the substrate and covering the first electrode and the second electrode, light emitting elements disposed on the first insulating layer and having both ends disposed on the first electrode and the second electrode, a first connection electrode disposed on the first electrode and electrically contacting an end of each of the light emitting elements, a second connection electrode spaced apart from the first connection electrode and disposed on the second electrode and electrically contacting another end of each of the light emitting elements, a second insulating layer disposed on the first insulating layer and at least partially covering the first connection electrode and the second connection electrode, and a third insulating layer disposed on part of the second insulating layer. The second insulating layer comprises an opening overlapping in a plan view a part between the first connection electrode and the second connection electrode spaced apart from each other.

A width of the opening of the second insulating layer may be greater than a distance between the first connection electrode and the second connection electrode, and the opening of the second insulating layer may overlap in a plan view a side of the first connection electrode and a side of the second connection electrode which face each other.

The opening of the second insulating layer may overlap the light emitting elements in a plan view, and the width of the opening of the second insulating layer may be smaller than a length of each of the light emitting elements.

The first connection electrode may electrically contact the first electrode through a first contact part penetrating the first insulating layer, and the second connection electrode may electrically contact the second electrode through a second contact part penetrating the first insulating layer.

A center of the opening of the second insulating layer may be side by side with a center of each of the light emitting elements. The first connection electrode may directly contact end surfaces and part of a side surface of each of the light emitting elements. The second connection electrode may directly contact end surfaces and part of side surface of each of the light emitting elements.

A center of the opening of the second insulating layer may be not side by side with a center of each of the light emitting elements, the first connection electrode may electrically contact an end surface of each of the light emitting elements, and the second connection electrode may directly contact another end surface and part of a side surface of each of the light emitting elements.

The third insulating layer may comprise a first insulating pattern disposed on inner sidewalls of the opening of the second insulating layer.

A side of the first connection electrode which electrically contacts the light emitting elements and a side of the second connection electrode which electrically contacts the light emitting elements may be side by side with sidewalls of the first insulating pattern, respectively.

The display device may further comprise a first bank pattern disposed between the first electrode and the substrate, and a second bank pattern disposed between the second electrode and the substrate. The first connection electrode may overlap the first bank pattern in a plan view, and the second connection electrode may overlap the second bank pattern in a plan view.

The light emitting elements may be disposed between the first bank pattern and the second bank pattern.

The third insulating layer may comprise second insulating patterns which overlap in a plan view sidewalls of the first bank pattern and the second bank pattern, and the second insulating patterns may be disposed on the second insulating layer.

The first electrode and the second electrode may extend in a first direction and be spaced apart from each other in a second direction different from the first direction, the light emitting elements may be arranged in the first direction, and the opening of the second insulating layer may extend in the first direction.

The display device may further comprise a bank layer extending in the first direction and the second direction on the first insulating layer and surrounding a part where the light emitting elements are disposed. Each of the first connection electrode and the second connection electrode may extend in the first direction such that part of the first connection electrode and part of the second connection electrode are disposed on the bank layer.

According to an embodiment of the disclosure, a method of fabricating a display device, the method comprising preparing a first electrode and a second electrode spaced apart from each other on a substrate, a first insulating layer disposed on the first electrode and the second electrode, and light emitting elements disposed on the first insulating layer and on the first electrode and the second electrode, forming a connection electrode layer disposed on the first insulating layer and covering the light emitting elements, forming a second insulating layer disposed on the connection electrode layer and comprising an opening exposing part of the connection electrode layer which covers the light emitting elements, and forming connection electrodes spaced apart from each other by removing the part of the connection electrode layer exposed by the opening.

The forming of the second insulating layer may comprise forming a first insulating material layer disposed on the connection electrode layer, and forming the opening by forming a photoresist which comprises a hole overlapping the light emitting elements in a plan view, on the first insulating material layer and etching the first insulating material layer exposed by the hole.

The forming of the second insulating layer may further comprise forming a spacer disposed on inner sidewalls of the hole of the photoresist, and in the etching of the first insulating material layer, part of the first insulating material layer exposed by the hole and the spacer may be etched.

The method may further comprise, before the forming of the connection electrodes, forming a third insulating layer disposed on the second insulating layer and comprising an insulating pattern disposed on inner sidewalls of the opening. In the forming of the connection electrodes, part of the connection electrode layer exposed by the insulating pattern may be etched.

The forming of the third insulating layer may comprise forming a second insulating material layer disposed on the second insulating layer, and forming the third insulating layer by anisotropic etching the second insulating material layer.

A width of the opening of the second insulating layer may be greater than a distance between the connection electrodes spaced apart from each other.

According to an embodiment of the disclosure, a method of fabricating a display device, the method comprising preparing a first electrode and a second electrode spaced apart from each other on a substrate, a first insulating layer disposed on the first electrode and the second electrode, and a plurality of light emitting elements disposed on the first insulating layer and on the first electrode and the second electrode, forming a connection electrode layer disposed on the first insulating layer and covers the light emitting elements, forming a photoresist comprising a hole overlapping in a plan view the light emitting elements and a spacer disposed on inner sidewalls of the hole on the connection electrode layer, and forming connection electrodes spaced apart from each other by removing part of the connection electrode layer exposed by the hole and the spacer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1:
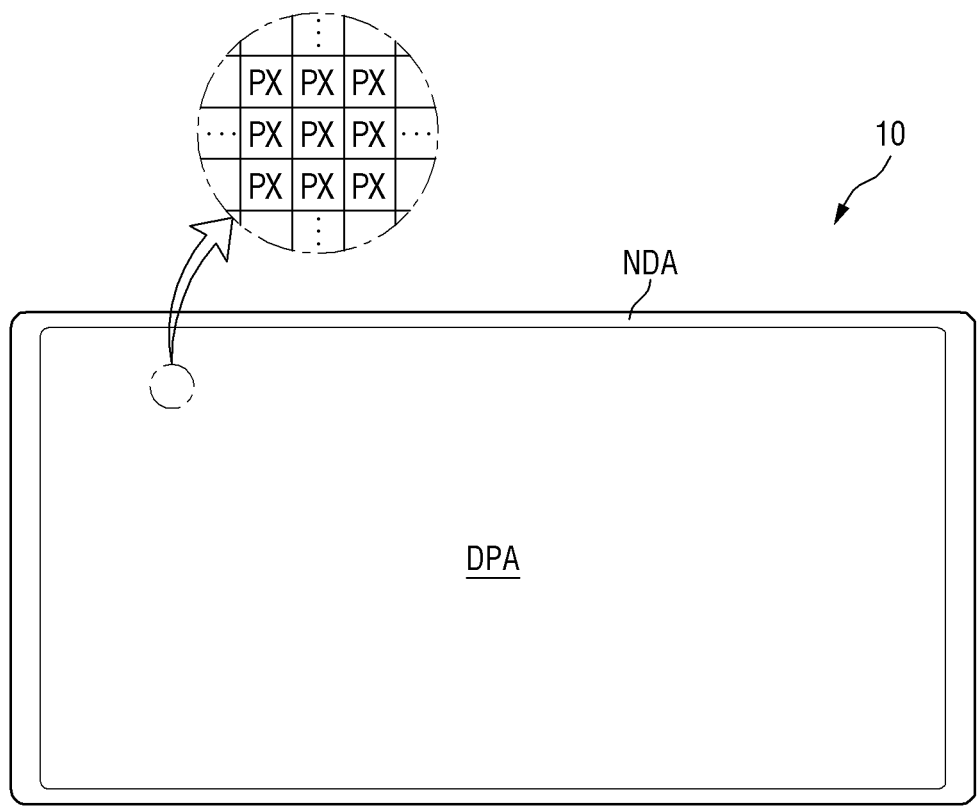
FIG. 1 is a schematic plan view of a display device according to an embodiment.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, laptop computers, monitors, billboards, Internet of things (IoT) devices, mobile phones, smartphones, tablet personal computers (PCs), electronic watches, smartwatches, watchphones, head-mounted displays, mobile communication terminals, electronic notebooks, electronic books, portable multimedia players (PMPs), navigation devices, game machines, digital cameras, and camcorders, which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited thereto, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. FIG. 1 illustrates, as an example, the display device 10 shaped like a rectangle that is long in a second direction DR2.

The display device 10 may include the display area DPA and a non-display area NDA. The display area DPA is an area where an image can be displayed, and the non-display area NDA is an area where no image is displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic shape having each side inclined with respect to a direction. The pixels PX may be arranged in a stripe type or a PenTile® type. In addition, each of the pixels PX may display a specific color by including one or more light emitting elements which emit light of a specific wavelength band.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
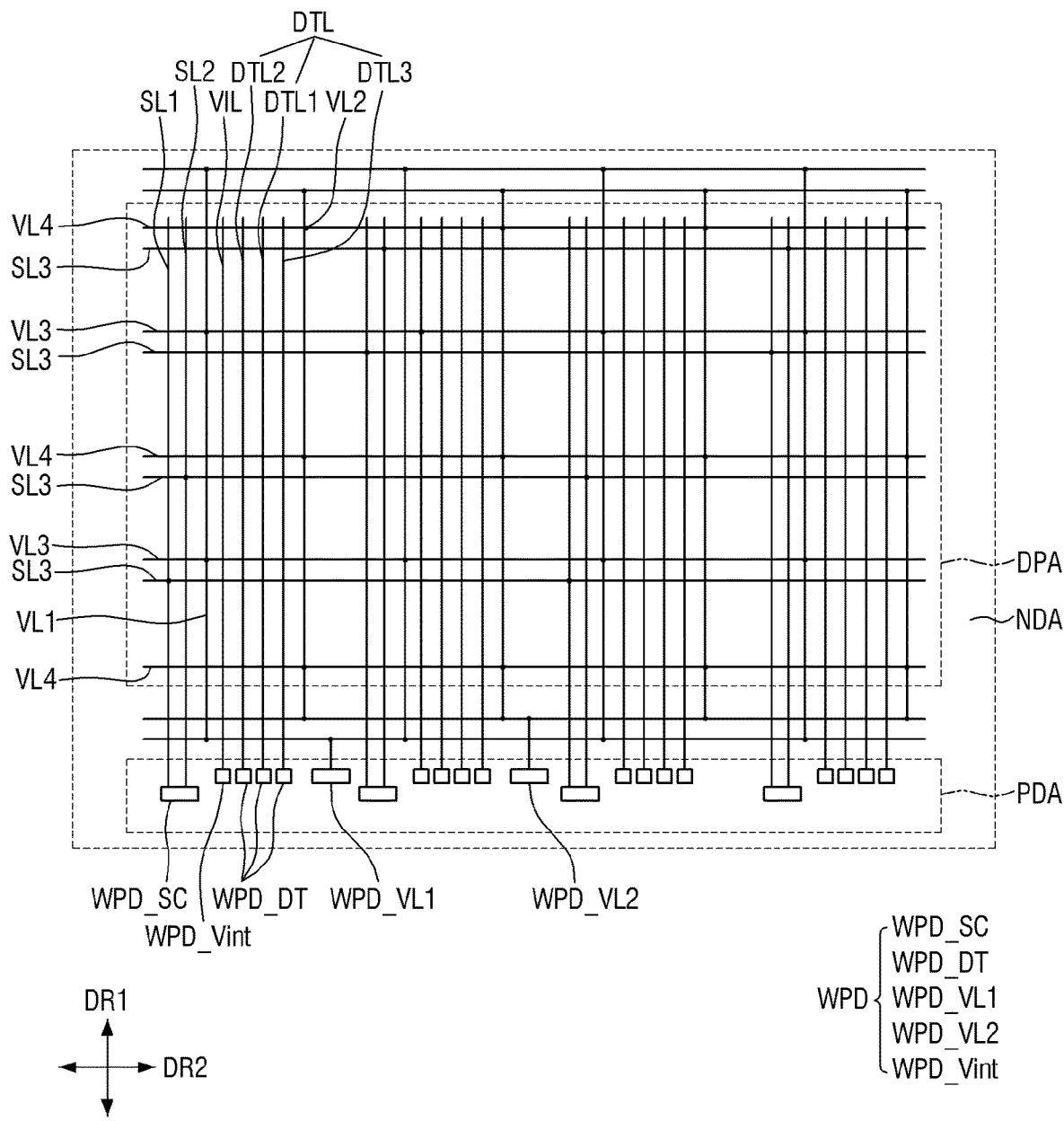
FIG. 2 is a schematic plan view illustrating the arrangement of wirings included in the display device according to an embodiment.

FIG. 2 is a schematic plan view illustrating the arrangement of wirings included in the display device 10 according to an embodiment.

Referring to FIG. 2, the display device 10 may include wirings. The display device 10 may include scan lines SL (SL1 to SL3), data lines DTL (DTL1 to DTL3), initialization voltage lines VIL, and voltage lines VL (VL1 to VL4). Although not illustrated in the drawing, other wirings may be further disposed in the display device 10.

First scan lines SL1 and second scan lines SL2 may extend in a first direction DR1. A first scan line SL1 and a second scan line SL2 in each pair may be disposed adjacent to each other and may be spaced apart from other first scan lines SL1 and other second scan lines SL2 in the second direction DR2. The first scan line SL1 and the second scan line SL2 in each pair may be electrically connected to a scan wiring pad WPD_SC electrically connected to a scan driver (not illustrated). The first scan lines SL1 and the second scan lines SL2 may extend from a pad area PDA disposed in the non-display area NDA to the display area DPA.

Third scan lines SL3 may extend in the second direction DR2, and each of the third scan lines SL3 may be spaced apart from other third scan lines SL3 in the first direction DR1. One third scan line SL3 may be electrically connected to one or more first scan lines SL1 or one or more second scan lines SL2. In an embodiment, the first scan lines SL1 and the second scan lines SL2 may be formed of (or formed as) a conductive layer disposed on a different layer from the third scan lines SL3. The scan lines SL may have a mesh structure in the entire display area DPA, but the disclosure is not limited thereto.

In the specification, the term "connect" may mean that any one member and another member are electrically connected to each other not only through physical contact but also through another member. In addition, it can be understood that any one part and another part are electrically connected to each other as an integrated member. Further, the connection between any one member and another member can be interpreted to include electrical connection through another member in addition to connection through direct contact.

The data lines DTL may extend in the first direction DR1. The data lines DTL include first data lines DTL1, second data lines DTL2, and third data lines DTL3. One each of the first to third data lines DTL1 to DTL3 form a pair and are adjacent to each other. Each of the data lines DTL1 to DTL3 may extend from the pad area PDA disposed in the non-display area NDA to the display area DPA. However, the disclosure is not limited thereto, and the data lines DTL may be disposed at equal intervals between each pair of a first voltage line VL1 and a second voltage line VL2 to be described below.

The initialization voltage lines VIL may extend in the first direction DR1. Each of the initialization voltage lines VIL may be disposed between the data lines DTL and the first and second scan lines SL1 and SL2. The initialization voltage lines VIL may extend from the pad area PDA disposed in the non-display area NDA to the display area DPA.

First voltage lines VL1 and second voltage lines VL2 extend in the first direction DR1, and third voltage lines VL3 and fourth voltage lines VL4 extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may extend in the first direction DR1 to cross the display area DPA. In the third voltage lines VL3 and the fourth voltage lines VL4, some wirings may be disposed in the display area DPA, and other wirings may be disposed in the non-display area NDA located on both sides of the display area DPA in the first direction DR1. The first voltage lines VL1 and the second voltage lines VL2 may be formed of a conductive layer disposed on a different layer from the third voltage lines VL3 and the fourth voltage lines VL4. Each of the first voltage lines VL1 may be electrically connected to at least one third voltage line VL3, and each of the second voltage lines VL2 may be electrically connected to at least one fourth voltage line VL4. The voltage lines VL may have a mesh structure in the entire display area DPA. However, the disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In an embodiment, each wiring pad WPD may be disposed in the pad area PDA located on a lower side of the display area DPA which is a second side in the first direction DR1. Each pair of the first and second scan lines SL1 and SL2 are electrically connected to the scan wiring pad WPD_SC disposed in the pad area PDA, and the data lines DTL are electrically connected to different data wiring pads WPD_DT. Each of the initialization voltage lines VIL is electrically connected to an initialization wiring pad WPD_Vint, the first voltage lines VL1 are electrically connected to a first voltage wiring pad WPD_VL1, and the second voltage lines VL2 are electrically connected to a second voltage wiring pad WPD_VL2. An external device may be mounted on the wiring pads WPD. The external device may be mounted on the wiring pads WPD by an anisotropic conductive film, ultrasonic bonding, or the like. Although FIG. 2 illustrates that each wiring pad WPD is disposed in the pad area PDA located on the lower side of the display area DPA, the disclosure is not limited thereto. Some of the wiring pads WPD may also be disposed in an area located on an upper side or any one of left and right sides of the display area DPA.

Each pixel PX or subpixel SPXn (where n is an integer of 1 to 3) of the display device 10 includes a pixel driving circuit. The above-described wirings may transmit a driving signal to each pixel driving circuit while passing through or around each pixel PX. The pixel driving circuit may include a transistor and a capacitor. The numbers of transistors and capacitors in each pixel driving circuit can be variously changed. According to an embodiment, each subpixel SPXn may have a 3T1C structure in which the pixel driving circuit includes three transistors and a capacitor. Although the pixel driving circuit will be described below using the 3T1C structure as an example, the disclosure is not limited thereto, and other various modified pixel structures such as a 2T1C structure, a 7T1C structure, and a 6T1C structure are also applicable.

Figure 3:
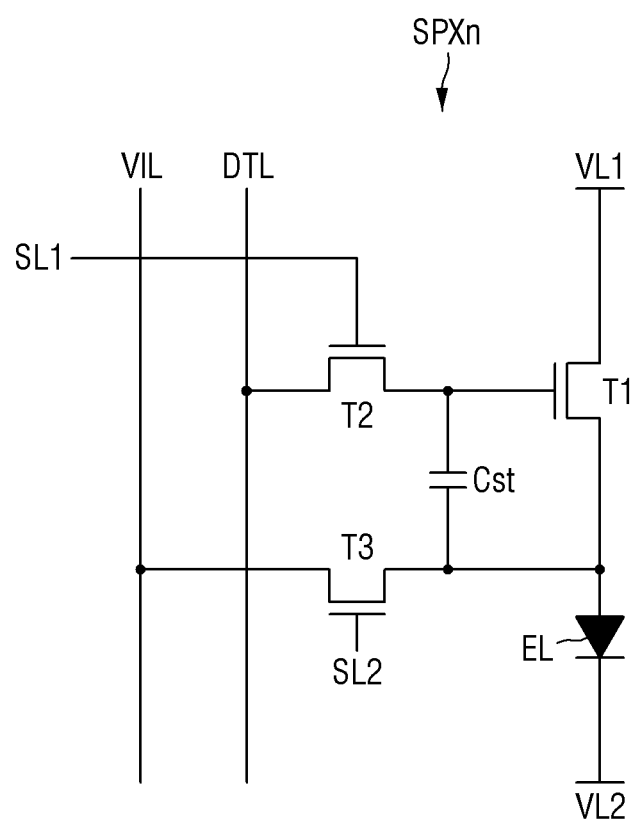
FIG. 3 is a schematic diagram of an equivalent circuit of a subpixel of the display device according to an embodiment.

FIG. 3 is a schematic diagram of an equivalent circuit of a subpixel SPXn of the display device 10 according to an embodiment.

Referring to FIG. 3, each subpixel SPXn of the display device 10 according to the embodiment includes three transistors T1 to T3 and a storage capacitor Cst in addition to a light emitting diode EL.

The light emitting diode EL emits light according to a current supplied through a first transistor T1. The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be electrically connected to a source electrode of the first transistor T1, and a second end of the light emitting diode EL may be electrically connected to a second voltage line VL2 to which a low-potential voltage (hereinafter referred to as a second power supply voltage) lower than a high-potential voltage (hereinafter referred to as a first power supply voltage) of a first voltage line VL1 is supplied.

The first transistor T1 adjusts a current flowing from the first voltage line VL1, to which the first power supply voltage is supplied, to the light emitting diode EL according to a voltage difference between a gate electrode and the source electrode thereof. For example, the first transistor T1 may be a driving transistor for driving the light emitting diode EL. The first transistor T1 may have the gate electrode electrically connected to a source electrode of a second transistor T2, the source electrode electrically connected to the first electrode of the light emitting diode EL, and a drain electrode electrically connected to the first voltage line VL1 to which the first power supply voltage is applied.

The second transistor T2 is turned on by a scan signal of a first scan line SL1 to electrically connect a data line DTL to the gate electrode of the first transistor T1. The second transistor T2 may have a gate electrode electrically connected to the first scan line SL1, the source electrode electrically connected to the gate electrode of the first transistor T1, and a drain electrode electrically connected to the data line DTL.

A third transistor T3 is turned on by a scan signal of a second scan line SL2 to electrically connect an initialization voltage line VIL to the first end of the light emitting diode EL. The third transistor T3 may have a gate electrode electrically connected to the second scan line SL2, a drain electrode electrically connected to the initialization voltage line VIL, and a source electrode electrically connected to the first end of the light emitting diode EL or the source electrode of the first transistor T1.

In an embodiment, the source electrode and the drain electrode of each of the transistors T1 to T3 are not limited to the above description, and the opposite may also be the case. In addition, each of the transistors T1 to T3 may be formed as a thin-film transistor. In addition, although each of the transistors T1 to T3 is mainly described as an N-type metal oxide semiconductor field effect transistor (MOSFET) with reference to FIG. 3, the disclosure is not limited thereto. For example, each of the transistors T1 to T3 may also be formed as a P-type MOSFET, or some of the transistors T1 to T3 may be formed as N-type MOSFETs, and others may be formed as a P-type MOSFET.

The storage capacitor Cst is formed between the gate electrode and the source electrode of the first transistor T1. The storage capacitor Cst stores a voltage corresponding to a difference between a gate voltage and a source voltage of the first transistor T1.

Figure 4:
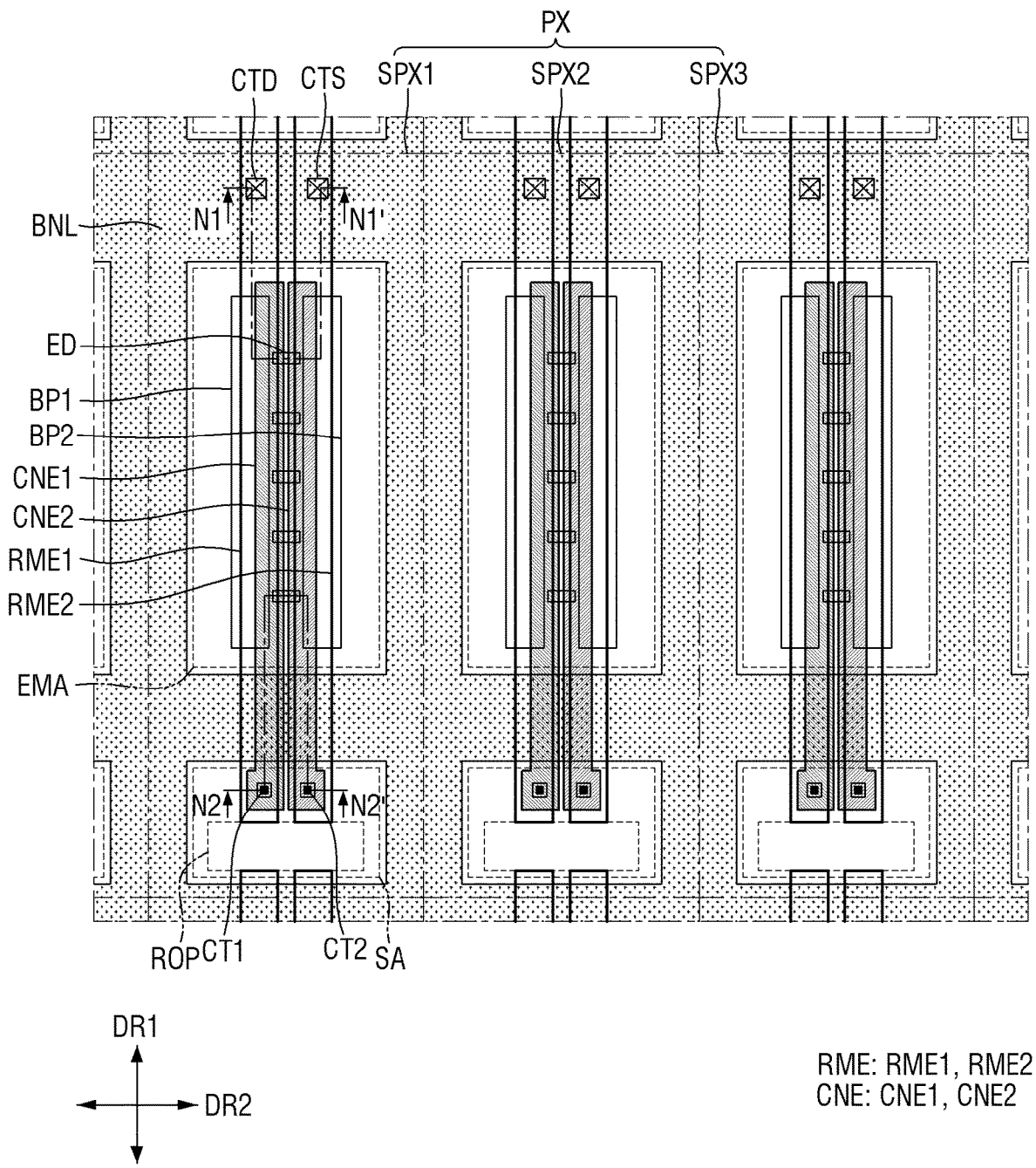
FIG. 4 is a schematic plan view of a pixel of the display device according to an embodiment.

FIG. 4 is a schematic plan view of a pixel PX of the display device 10 according to an embodiment. FIG. 4 illustrates the planar arrangement of electrodes RME (RME1 and RME2), bank patterns BP1 and BP2, a bank layer BNL, light emitting elements ED, and connection electrodes CNE (CNE1 and CNE2) disposed in a pixel PX of the display device 10.

Referring to FIG. 4, each of the pixels PX of the display device 10 may include subpixels SPXn. For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may also emit light of a same color. In an embodiment, the subpixels SPXn may emit blue light. Although FIG. 4 illustrates that a pixel PX includes three subpixels SPXn, the disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. Light emitting elements ED may be disposed in each subpixel SPXn, and an area where the light emitting elements ED are disposed and an area adjacent to this area may form the emission area EMA.

Although FIG. 4 illustrates that the respective emission areas EMA of the subpixels SPXn have substantially a same area, the disclosure is not limited thereto. In some embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of a corresponding subpixel SPXn may be disposed on a lower side of the emission area EMA which is a second side in the first direction DR1. The emission area EMA and the sub-area SA may be alternately arranged in the first direction DR1, and the sub-area SA may be disposed between the emission areas EMA of different subpixels SPXn spaced apart from each other in the first direction DR1. For example, the emission area EMA and the sub-area SA may be alternately arranged in the first direction DR1 and may each be repeatedly arranged in the second direction DR2. However, the disclosure is not limited thereto, and the arrangement of the emission areas EMA and the sub-areas SA in pixels PX may also be different from that in FIG. 4.

Light may not exit from the sub-area SA because the light emitting elements ED are not disposed in the sub-area SA, but parts of the electrodes RME disposed in each subpixel SPXn may be disposed in the sub-area SA. The electrodes RME disposed in different subpixels SPXn may be separated from each other in a separation part ROP of the sub-area SA.

Wirings and circuit elements of a circuit layer may be electrically connected to each of the first to third subpixels SPX1 to SPX3. However, the wirings and the circuit elements are not disposed to correspond to an area occupied by each subpixel SPXn or each emission area EMA but may be disposed regardless of the positions of the emission areas EMA in a pixel PX.

The bank layer BNL may surround the subpixels SPXn, the emission areas EMA, and the sub-areas SA. The bank layer BNL may be disposed at boundaries between the subpixels SPXn adjacent to each other in the first direction DR1 and the second direction DR2 and also may be disposed at boundaries between the emission areas EMA and the sub-areas SA. The subpixels SPXn, the emission areas EMA, and the sub-areas SA of the display device 10 may be areas separated by the arrangement of the bank layer BNL. Distances between the subpixels SPXn, the emission areas EMA, and the sub-areas SA may vary according to a width of the bank layer BNL.

The bank layer BNL may include parts extending in the first direction DR1 and the second direction DR2 in a plan view to form a grid pattern in the entire display area DPA. The bank layer BNL may be disposed at the boundary of each subpixel SPXn to separate adjacent subpixels SPXn from each other. In addition, the bank layer BNL may surround the emission area EMA and the sub-area SA disposed in each subpixel SPXn to separate them from each other. The structure of the display device 10 will now be described in detail with further reference to other drawings.

Figure 5:
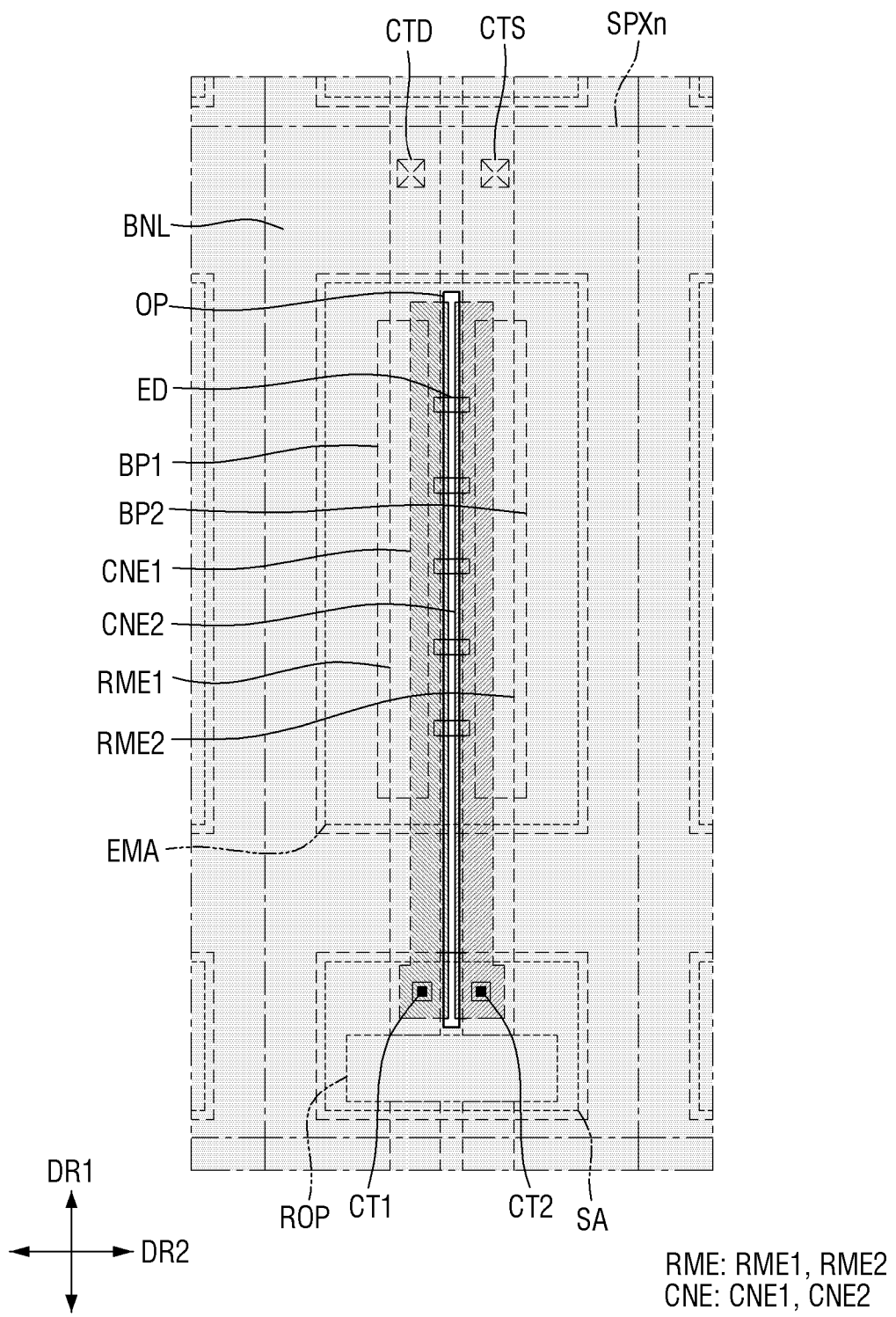
FIG. 5 is a schematic plan view of a second insulating layer disposed in the pixel of FIG. 4.
Figure 6:
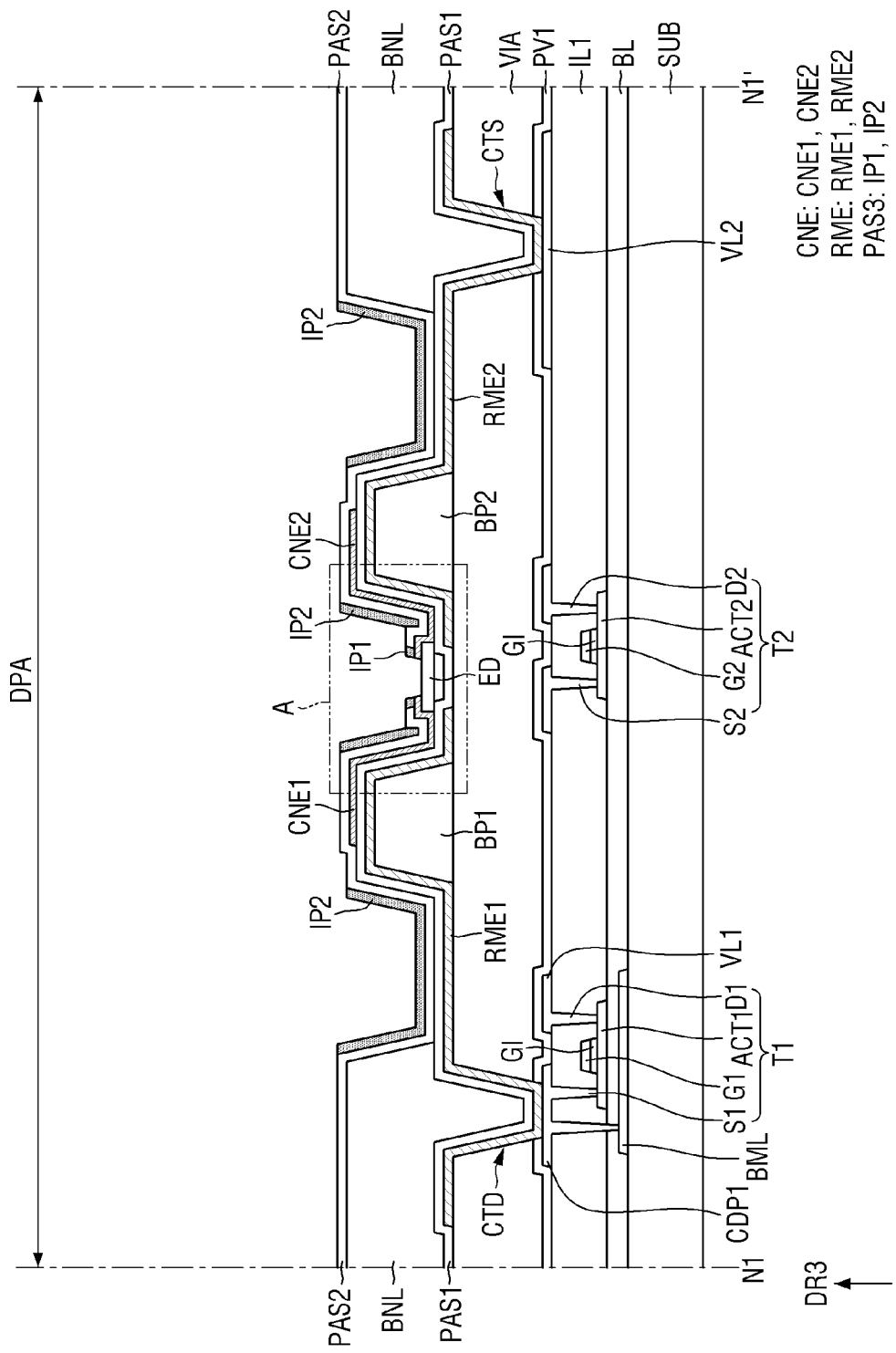
FIG. 6 is a schematic cross-sectional view taken along line N1-N1' of FIG. 4.
Figure 7:
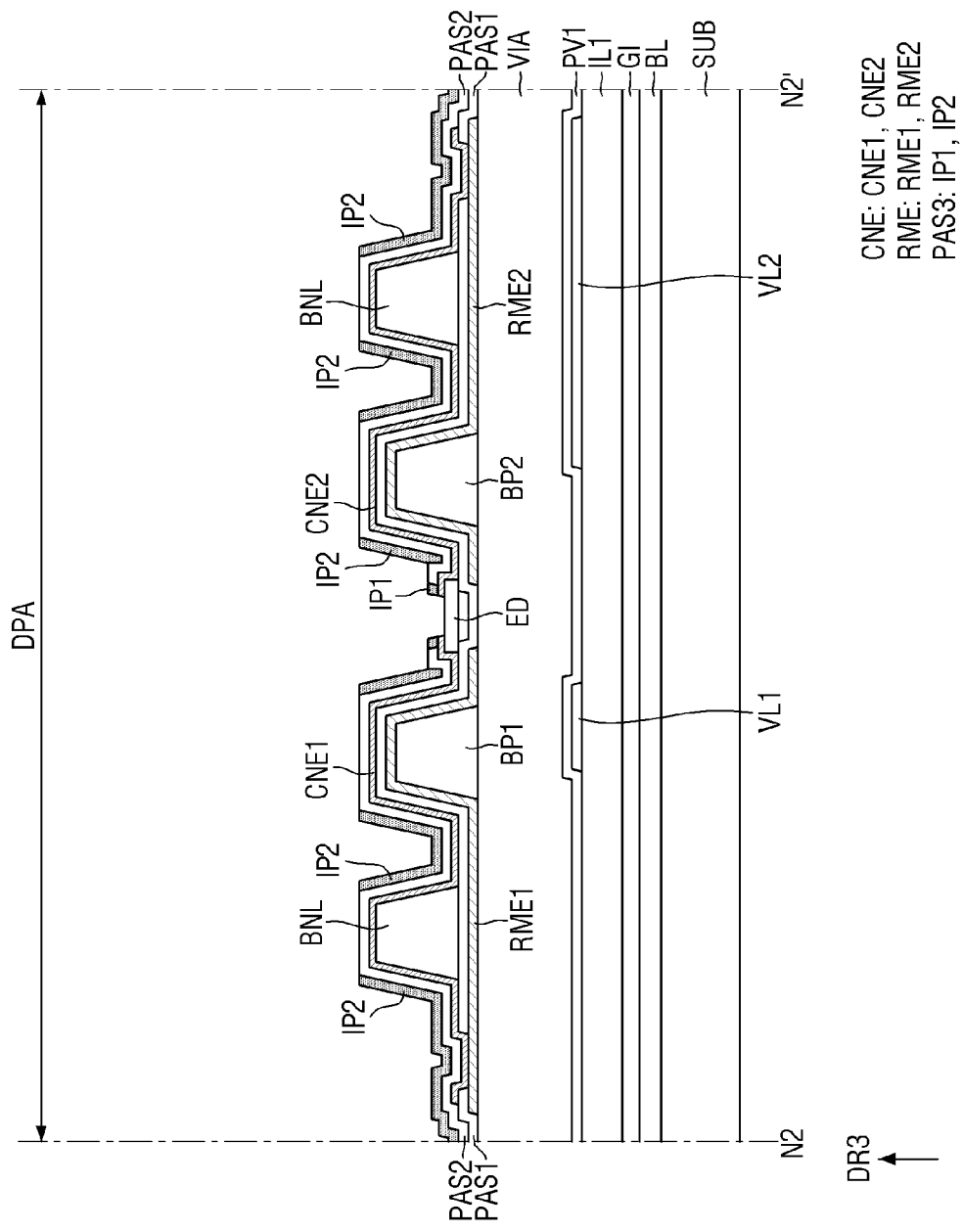
FIG. 7 is a schematic cross-sectional view taken along line N2-N2' of FIG. 4.
Figure 8:
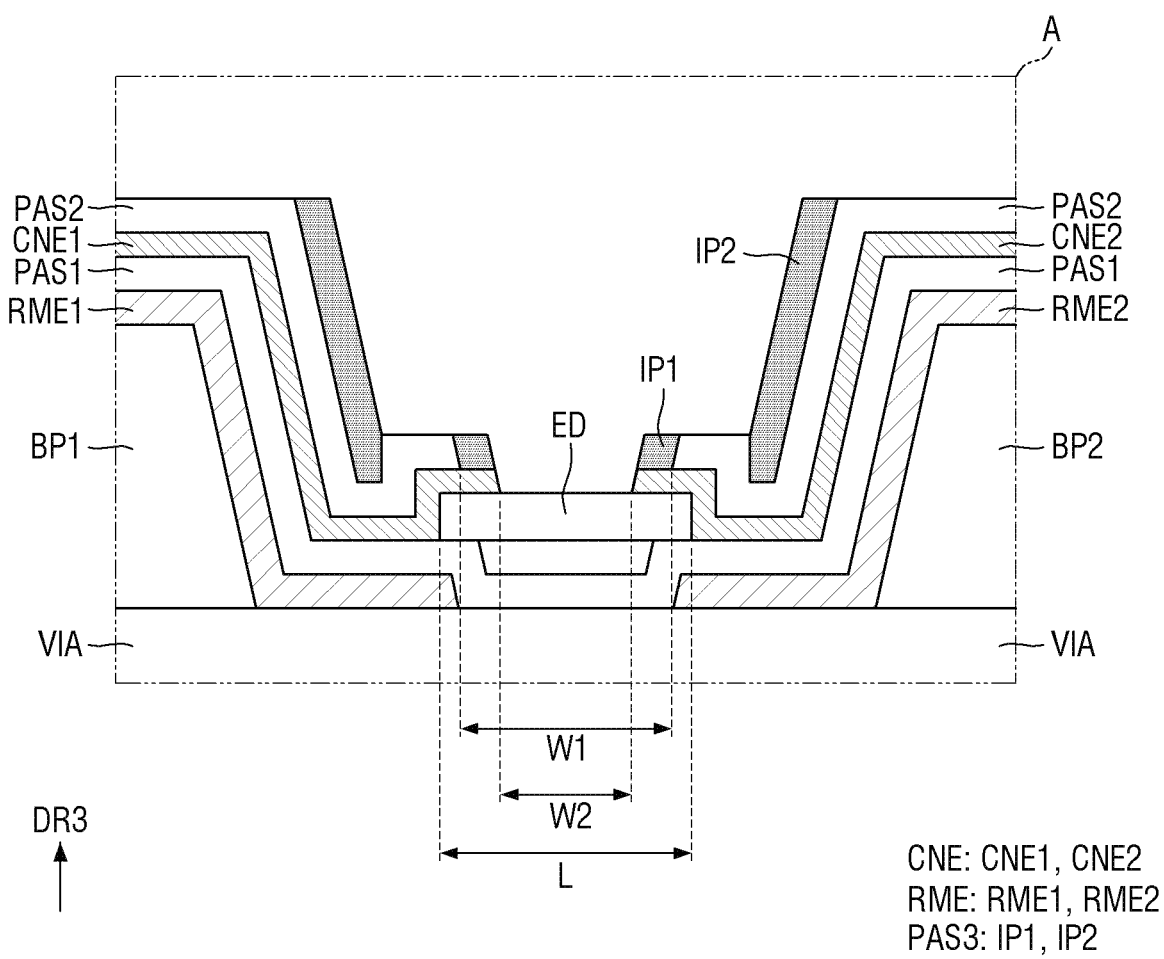
FIG. 8 is a schematic enlarged view of a part A of FIG. 6.

FIG. 5 is a schematic plan view of a second insulating layer PAS2 disposed in the pixel PX of FIG. 4. FIG. 6 is a schematic cross-sectional view taken along line N1-N1' of FIG. 4. FIG. 7 is a schematic cross-sectional view taken along line N2-N2' of FIG. 4. FIG. 8 is a schematic enlarged view of part A of FIG. 6. FIG. 6 illustrates a cross section across both ends of a light emitting element ED and electrode contact holes CTD and CTS disposed in the first subpixel SPX1, and FIG. 7 illustrates a cross section across both ends of a light emitting element ED and contact parts CT1 and CT2 disposed in the first subpixel SPX1. FIG. 8 is a schematic enlarged view of a part where light emitting elements ED and connection electrodes CNE are disposed in FIG. 6.

Referring to FIGS. 4 and 5 to 8, the display device 10 may include a first substrate SUB and a semiconductor layer, conductive layers, and insulating layers disposed on the first substrate SUB. The semiconductor layer, the conductive layers, and the insulating layers may form (or constitute) a circuit layer and a display element layer of the display device 10.

The first substrate SUB may be an insulating substrate. The first substrate SUB may be made of an insulating material such as glass, quartz, or polymer resin. In addition, the first substrate SUB may be a rigid substrate, but may also be a flexible substrate that can be bent, folded, rolled, etc. The first substrate SUB may include the display area DPA and the non-display area NDA surrounding the display area DPA, and the display area DPA may include the emission area EMA and the sub-area SA which is a part of the non-emission area.

A first conductive layer may be disposed on the first substrate SUB. The first conductive layer includes a bottom metal layer BML, and the bottom metal layer BML overlaps (e.g., in a plan view) an active layer ACT1 of a first transistor T1. The bottom metal layer BML may include a light blocking material to prevent light from entering the active layer ACT1 of the first transistor T1. However, the bottom metal layer BML may also be omitted.

A buffer layer BL may be disposed on the bottom metal layer BML and the first substrate SUB. The buffer layer BL may be formed on the first substrate SUB to protect transistors of the pixels PX from moisture introduced through the first substrate SUB which is vulnerable to moisture penetration and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may respectively be at least partially overlapped by (or at least partially overlap) a first gate electrode G1 and a second gate electrode G2 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 and one second transistor T2 are disposed in each subpixel SPXn of the display device 10 in the drawings, the disclosure is not limited thereto, and the display device 10 may include a greater number of transistors.

A first gate insulating layer GI is disposed on the semiconductor layer and the buffer layer BL. The first gate insulating layer GI may serve as a gate insulating film of each of the transistors T1 and T2.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3, which is a thickness direction, and the second gate electrode G2 may overlap (e.g., in a plan view) a channel region of the second active layer ACT2 in the third direction DR3, which is the thickness direction. Although not illustrated in the drawings, the second conductive layer may further include an electrode of a storage capacitor.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage line VL1 and a second voltage line VL2 disposed in the display area DPA, a first conductive pattern CDP1, and a source electrode S1 and a drain electrode D1 of the first transistor T1, and a source electrode S2 and a drain electrode D2 of the second transistor T2. Although not illustrated in the drawings, the third conductive layer may further include the other electrode of the storage capacitor.

A high-potential voltage (or a first power supply voltage) supplied to a first electrode RME1 may be applied to the first voltage line VL1, and a low-potential voltage (or a second power supply voltage) supplied to a second electrode RME2 may be applied to the second voltage line VL2. A part of the first voltage line VL1 may contact the first active layer ACT1 of the first transistor T1 through a contact hole penetrating the first interlayer insulating layer IL1. The first voltage line VL1 may serve as a first drain electrode D1 of the first transistor T1. The second voltage line VL2 may be directly electrically connected to the second electrode RME2 to be described below.

The first conductive pattern CDP1 may contact the first active layer ACT1 of the first transistor T1 through a contact hole penetrating the first interlayer insulating layer IL1. The first conductive pattern CDP1 may contact the bottom metal layer BML, through another contact hole. The first conductive pattern CDP1 may serve as a first source electrode S1 of the first transistor T1. In addition, the first conductive pattern CDP1 may be electrically connected to the first electrode RME1 or a first connection electrode CNE1 to be described below. The first transistor T1 may transmit the first power supply voltage received from the first voltage line VL1 to the first electrode RME1 or the first connection electrode CNE1.

Each of a second source electrode S2 and a second drain electrode D2 may contact the second active layer ACT2 of the second transistor T2 through a contact hole penetrating the first interlayer insulating layer IL1.

A first passivation layer PV1 is disposed on the third conductive layer. The first passivation layer PV1 may function as an insulating film between the third conductive layer and other layers and may protect the third conductive layer.

Each of the buffer layer BL, the first gate insulating layer GI, the first interlayer insulating layer ILL and the first passivation layer PV1 described above may be composed of (or include) inorganic layers stacked alternately. For example, each of the buffer layer BL, the first gate insulating layer GI, the first interlayer insulating layer ILL and the first passivation layer PV1 may be a double layer in which inorganic layers including at least one of silicon oxide ($SiO_x$), silicon nitride ($SiN_x$), and silicon oxynitride ($SiO_xN_y$) are stacked or may be a multilayer in which these double layers are alternately stacked. However, the disclosure is not limited thereto, and each of the buffer layer BL, the first gate insulating layer GI, the first interlayer insulating layer ILL and the first passivation layer PV1 may also be composed of one inorganic layer including any one of the above insulating materials. In some embodiments, the first interlayer insulating layer IL1 may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A via layer VIA is disposed on the third conductive layer in the display area DPA. The via layer VIA may include an organic insulating material such as polyimide (PI) to compensate for a step difference (or height or thickness differences) due to the conductive layers thereunder, having a flat upper surface. However, in some embodiments, the via layer VIA may be omitted.

Bank patterns BP1 and BP2, electrodes RME (RME1 and RME2), the bank layer BNL, light emitting elements ED, and connection electrodes CNE (CNE1 and CNE2) are disposed on the via layer VIA. In addition, insulating layers PAS1 to PAS3 may be disposed on the via layer VIA.

The bank patterns BP1 and BP2 may be disposed in the emission area EMA of each subpixel SPXn. Each of the bank patterns BP1 and BP2 may have a width in the second direction DR2 and may extend in the first direction DR1.

For example, the bank patterns BP1 and BP2 may include a first bank pattern BP1 and a second bank pattern BP2 spaced apart from each other in the second direction DR2 in the emission area EMA of each subpixel SPXn. The first bank pattern BP1 may be disposed on a left side of the center of the emission area EMA, which is a first side in the second direction DR2, and the second bank pattern BP2 may be spaced apart from the first bank pattern BP1 and disposed on a right side of the center of the emission area EMA, which is a second side in the second direction DR2. The first bank pattern BP1 and the second bank pattern BP2 may be alternately disposed in the second direction DR2 and may be disposed in an island-shaped pattern in the display area DPA. The light emitting elements ED may be disposed between the first bank pattern BP1 and the second bank pattern BP2.

Lengths of the first bank pattern BP1 and the second bank pattern BP2 in the first direction DR1 may be the same but may be smaller than a length, in the first direction DR1, of the emission area EMA surrounded by the bank layer BNL. The first bank pattern BP1 and the second bank pattern BP2 may be spaced apart from parts of the bank layer BNL which extend in the second direction DR2. However, the disclosure is not limited thereto, and the bank patterns BP1 and BP2 may also be integrated with the bank layer BNL or may at least partially overlap the parts of the bank layer BNL which extend in the second direction DR2. In this case, the length of each of the bank patterns BP1 and BP2 in the first direction DR1 may be equal to or greater than the length, in the first direction DR1, of the emission area EMA surrounded by the bank layer BNL.

The first bank pattern BP1 and the second bank pattern BP2 may have a same width in the second direction DR2. However, the disclosure is not limited thereto, and the first bank pattern BP1 and the second bank pattern BP2 may also have different widths. For example, a bank pattern may have a greater width than the other bank pattern, and the bank pattern having a greater width may be disposed over the emission areas EMA of different subpixels SPXn adjacent to each other in the second direction DR2. In this case, the bank pattern disposed over emission areas EMA may overlap a part of the bank layer BNL which extends in the first direction DR1, in the thickness direction. For example, a part of the bank layer BNL which extends in the first direction DR1 may overlap the second bank pattern BP2 in the thickness direction. Although FIG. 4 illustrates that two bank patterns BP1 and BP2 having a same width are disposed in each subpixel SPXn, the disclosure is not limited thereto. The number and shape of the bank patterns BP1 and BP2 may vary according to the number or arrangement structure of the electrodes RME.

The bank patterns BP1 and BP2 may be disposed on the via layer VIA. For example, the bank patterns BP1 and BP2 may be directly disposed on the via layer VIA, and at least a part of each of the bank patterns BP1 and BP2 may protrude from the upper surface of the via layer VIA. The protruding part of each of the bank patterns BP1 and BP2 may have inclined or curved side surfaces, and light emitted from the light emitting elements ED may be reflected upward above the via layer VIA by the electrodes RATE disposed on the bank patterns BP1 and BP2. Unlike in the drawings, each of the bank patterns BP1 and BP2 may also have a semicircular or semielliptical shape having a curved outer surface in a cross section. The bank patterns BP1 and BP2 may include, but are not limited to, an organic insulating material such as polyimide (PI).

The electrodes RME (RME1 and RME2) extend in a direction and are disposed in each subpixel SPXn. The electrodes RME1 and RME2 may extend in the first direction DR1, may be disposed in the emission area EMA and the sub-area SA of each subpixel SPXn, and may be spaced apart from each other in the second direction DR2. The electrodes RME may be electrically connected to the light emitting elements ED to be described below, but the disclosure is not limited thereto. The electrodes RME may also not be electrically connected to the light emitting elements ED.

The display device 10 may include the first electrode RME1 and the second electrode RME2 disposed in each subpixel SPXn. The first electrode RME1 is disposed on the left side of the center of the emission area EMA, and the second electrode RME2 is spaced apart from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to partially lie in a corresponding subpixel SPXn and the sub-area. The first electrodes RME1 and the second electrodes RME2 of different subpixels SPXn may be spaced apart from each other by the separation part ROP located in the sub-area SA of a subpixel SPXn.

Although two electrodes RME extend in the first direction DR1 in each subpixel SPXn in the drawings, the disclosure is not limited thereto. For example, in the display device 10, a greater number of electrodes RME may be disposed in a subpixel SPXn, or the electrodes RME may be partially bent and may have a different width according to position.

The first electrode RME1 and the second electrode RME2 may be disposed on at least the inclined side surfaces of the bank patterns BP1 and BP2. In an embodiment, a width of each of the electrodes RME measured in the second direction DR2 may be smaller than the width of each of the bank patterns BP1 and BP2 measured in the second direction DR2. A distance between the first electrode RME1 and the second electrode RME2 in the second direction DR2 may be smaller than a distance between the bank patterns BP1 and BP2. At least a part of each of the first electrode RME1 and the second electrode RME2 may be directly disposed on the via layer VIA so that they lie in a same plane.

The light emitting elements ED disposed between the bank patterns BP1 and BP2 may emit light toward both ends thereof, and the emitted light may travel toward the electrodes RME disposed on the bank patterns BP1 and BP2. Each electrode RME may have a structure in which a part thereof disposed on a bank pattern BP1 or BP2 can reflect light emitted from the light emitting elements ED. Each of the first electrode RME1 and the second electrode RME2 may cover at least one side surface of a bank pattern BP1 or BP2 to reflect light emitted from the light emitting elements ED.

Each of the electrodes RME may directly contact the third conductive layer through an electrode contact hole CTD or CTS in a part of the electrode RME overlapping the bank layer BNL between the emission area EMA and the sub-area SA. A first electrode contact hole CTD may be formed in an area in which the bank layer BNL and the first electrode RME1 overlap each other, and a second electrode contact hole CTS may be formed in an area in which the bank layer BNL and the second electrode RME2 overlap each other. The first electrode RME1 may contact the first conductive pattern CDP1 through the first electrode contact hole CTD penetrating the via layer VIA and the first passivation layer PV1. The second electrode RME2 may contact the second voltage line VL2 through the second electrode contact hole CTS penetrating the via layer VIA and the first passivation layer PV1. The first electrode RME1 may be electrically connected to the first transistor T1 by the first conductive pattern CDP1 to receive the first power supply voltage, and the second electrode RME2 may be electrically connected to the second voltage line VL2 to receive the second power supply voltage. However, the disclosure is not limited thereto. In an embodiment, the electrodes RME1 and RME2 may not be electrically connected to the voltage lines VL1 and VL2 of the third conductive layer, and the connection electrodes CNE to be described below may be directly electrically connected to the third conductive layer.

The electrodes RME may include a conductive material having high reflectivity. For example, each of the electrodes RME may include a metal such as silver (Ag), copper (Cu), or aluminum (Al), may be an alloy including aluminum (Al), nickel (Ni), or lanthanum (La), or may have a structure in which a metal layer such as titanium (Ti), molybdenum (Mo), or niobium (Nb) and the above alloy are stacked. In some embodiments, each of the electrodes RME may be a double layer or a multilayer in which an alloy including aluminum (Al) and at least one metal layer made of titanium (Ti), molybdenum (Mo), or niobium (Nb) are stacked.

However, the disclosure is not limited thereto, and each electrode RME may further include a transparent conductive material. For example, each electrode RME may include a material such as ITO, IZO, or ITZO. In some embodiments, each electrode RME may have a structure in which at least one transparent conductive material and at least one metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the first substrate SUB.

A first insulating layer PAS1 may be disposed in the entire display area DPA and may be disposed on the via layer VIA and the electrodes RME. The first insulating layer PAS1 may protect the electrodes RME while insulating them from each other. In particular, since the first insulating layer PAS1 covers the electrodes RME before the bank layer BNL is formed, it can prevent the electrodes RME from being damaged in the process of forming the bank layer BNL. In addition, the first insulating layer PAS1 may prevent the light emitting elements ED disposed thereon from directly contacting other members and thus being damaged.

In an embodiment, the first insulating layer PAS1 may be stepped such that a part of an upper surface of the first insulating layer PAS1 is depressed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1.

According to an embodiment, the first insulating layer PAS1 may include openings and contact parts CT1 and CT2. The first insulating layer PAS1 may include the openings formed to correspond to the separation part ROP of the sub-area SA and may include the contact parts CT1 and CT2 formed in a part where the connection electrodes CNE to be described below are electrically connected to the electrodes RME. The first insulating layer PAS1 may be entirely disposed on the via layer VIA but may partially expose the layers thereunder in a part where the openings or the contact parts CT1 and CT2 are formed.

In the openings formed to correspond to the separation part ROP of the sub-area SA as openings formed in the first insulating layer PAS1, a process of separating the electrodes RME disposed under the openings may be performed. The electrodes RME may extend in the first direction DR1 but may be separated into electrodes RME by etching parts exposed by the openings formed to correspond to the separation part ROP among the openings of the first insulating layer PAS1.

The contact parts CT1 and CT2 formed in the first insulating layer PAS1 may overlap different electrodes RME. For example, the contact parts CT1 and CT2 may be disposed in the sub-area SA and may include a first contact part CT1 overlapping the first electrode RME1 and a second contact part CT2 overlapping the second electrode RME2. Each of the first contact parts CT1 and the second contact parts CT2 may penetrate the first insulating layer PAS1 to at least partially expose an upper surface of the first electrode RME1 or the second electrode RME2 thereunder. Each of the first contact part CT1 and the second contact part CT2 may further penetrate some of the other insulating layers disposed on the first insulating layer PAS1. An electrode RME exposed by each of the contact parts CT1 and CT2 may contact a connection electrode CNE.

The bank layer BNL may be disposed on the first insulating layer PAS1. The bank layer BNL may include parts extending in the first direction DR1 and the second direction DR2 and may surround each subpixel SPXn. The bank layer BNL may surround the emission area EMA and the sub-area SA of each subpixel SPXn to separate them and may surround the outermost periphery of the display area DPA to separate the display area DPA and the non-display area NDA. The bank layer BNL may be entirely disposed in the display area DPA to form a grid pattern, and areas exposed by the bank layer BNL in the display area DPA may be the emission area EMA and the sub-area SA.

Similar to the bank patterns BP1 and BP2, the bank layer BNL may have a height. In some embodiments, an upper surface of the bank layer BNL may be at a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a fabrication process for the display device 10. Similar to the bank patterns BP1 and BP2, the bank layer BNL may include an organic insulating material such as polyimide.

The light emitting elements ED may be disposed in the emission area EMA. The light emitting elements ED may be disposed between the bank patterns BP1 and BP2 and may be spaced apart from each other in the first direction DR1. In an embodiment, the light emitting elements ED may extend in a direction, and both ends thereof may be disposed on different electrodes RME. A length of each light emitting element ED may be greater than a distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The light emitting elements ED may be disposed on the first insulating layer PAS1. The light emitting elements ED may extend in a direction, and the direction in which the light emitting elements ED extend may be parallel to an upper surface of the first substrate SUB. As will be described below, each light emitting element ED may include semiconductor layers disposed in the extending direction, and the semiconductor layers may be sequentially disposed in a direction parallel to the upper surface of the first substrate SUB. However, the disclosure is not limited thereto. In case that the light emitting elements ED have a different structure, the semiconductor layers may be disposed in a direction perpendicular to the first substrate SUB.

The light emitting elements ED disposed in each subpixel SPXn may emit light of different wavelength bands depending on the materials that form the semiconductor layers described above. However, the disclosure is not limited thereto, and the light emitting elements ED disposed in each subpixel SPXn may also emit light of a same color by including the semiconductor layers made of a same material. The light emitting elements ED may be electrically connected to the electrodes RME and the conductive layers under the via layer VIA by contacting the connection electrodes CNE (CNE1 and CNE2) and may emit light of a specific wavelength band in response to an electrical signal.

The connection electrodes CNE (CNE1 and CNE2) may be disposed on the electrodes RME and the bank patterns BP1 and BP2. The connection electrodes CNE may extend in a direction and may be spaced apart from each other. Each of the connection electrodes CNE may contact the light emitting elements ED and may be electrically connected to the third conductive layer.

The connection electrodes CNE may include a first connection electrode CNE1 and a second connection electrode CNE2 disposed in each subpixel SPXn. The first connection electrode CNE1 and the second connection electrode CNE2 may extend in the first direction DR1 and may be spaced apart from each other in the second direction DR2. The first connection electrode CNE1 may be disposed on the first electrode RME1 or the first bank pattern BP1. The second connection electrode CNE2 may be disposed on the second electrode RME2 or the second bank pattern BP2.

Each of the connection electrodes CNE may contact the light emitting elements ED. For example, the first connection electrode CNE1 may partially overlap the first electrode RME1 and may contact first ends of the light emitting elements ED. The second connection electrode CNE2 may partially overlap the second electrode RME2 and may contact second ends of the light emitting elements ED. In an embodiment, the connection electrodes CNE may contact at least both end surfaces of the light emitting elements ED, respectively, and a part of each of the connection electrodes CNE may contact side surfaces of the light emitting elements ED. The first connection electrode CNE1 and the second connection electrode CNE2 may be spaced apart from each other in the second direction DR2 on the light emitting elements ED and may directly contact the side surfaces of the light emitting elements ED. As illustrated in the drawings, the connection electrodes CNE may be spaced apart from the center of the light emitting elements ED by a distance (e.g., a predetermined or selected distance). Although a case where the first connection electrode CNE1 and the second connection electrode CNE2 are spaced apart from each other in the second direction DR2 on the light emitting elements ED and directly contact both end surfaces and side surfaces of the light emitting elements ED is described as an example, the disclosure is not limited thereto. In some embodiments, the connection electrodes CNE may be spaced apart from the center of the light emitting elements ED by different distances, and a connection electrode CNE may not directly contact the side surfaces of the light emitting elements ED.

The first connection electrode CNE1 and the second connection electrode CNE2 may have parts disposed directly on the side surfaces or both end surfaces of the light emitting elements ED and other parts disposed directly on the first insulating layer PAS1. For example, the first connection electrode CNE1 and the second connection electrode CNE2 may be disposed on a same layer. As will be described below, the first connection electrode CNE1 and the second connection electrode CNE2 may be formed of a same layer and disposed on the first insulating layer PAS1 to cover (or overlap in a plan view) the light emitting elements ED and may be separated so that they are spaced apart from each other. This will be described in detail below with reference to other drawings.

Each of the first connection electrode CNE1 and the second connection electrode CNE2 may extend from the emission area EMA to the sub-area SA beyond the bank layer BNL. The first connection electrode CNE1 and the second connection electrode CNE2 may be electrically connected to the electrodes RME or a conductive layer thereunder. For example, the first connection electrode CNE1 may contact the first electrode RME1 through the first contact part CT1 penetrating the first insulating layer PAS1 in the sub-area SA. The second connection electrode CNE2 may contact the second electrode RME2 through the second contact part CT2 penetrating the first insulating layer PAS1 in the sub-area SA. The first connection electrode CNE1 may be electrically connected to the first transistor T1 to receive the first power supply voltage, and the second connection electrode CNE2 may be electrically connected to the second voltage line VL2 to receive the second power supply voltage.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

The second insulating layer PAS2 may be disposed on the light emitting elements ED, the connection electrodes CNE, the first insulating layer PAS1, and the bank layer BNL. The second insulating layer PAS2 may be entirely disposed on the first insulating layer PAS1 and the bank layer BNL and may only partially cover the connection electrodes CNE and the light emitting elements ED. In addition, a part of the second insulating layer PAS2 may be disposed in the sub-areas SA.

According to an embodiment, the second insulating layer PAS2 may include openings OP, each being disposed between the bank patterns BP1 and BP2 to extend in the first direction DR1. An opening OP of the second insulating layer PAS2 may be disposed in the emission area EMA of each subpixel SPXn and may partially overlap the connection electrodes CNE and the light emitting elements ED. The opening OP of the second insulating layer PAS2 may be disposed between the connection electrodes CNE and may overlap the light emitting elements ED to partially expose them.

The opening OP of the second insulating layer PAS2 may be disposed to correspond to a space between different connection electrodes CNE spaced apart from each other. In the fabrication process of the display device 10, the second insulating layer PAS2 may be disposed to cover the connection electrodes CNE and the first insulating layer PAS1 and may be partially patterned to form the opening OP. The connection electrodes CNE may be formed as a pattern and may be separated from each other after the opening OP of the second insulating layer PAS2 is formed.

The opening OP of the second insulating layer PAS2 is a part where an etching process for forming the connection electrodes CNE separated from each other is performed, and the planar arrangement of the opening OP may correspond to the arrangement of different connection electrodes CNE. For example, in an embodiment in which different connection electrodes CNE extend in the first direction DR1 and are spaced apart from each other in the second direction DR2, the opening OP of the second insulating layer PAS2 may be disposed to correspond to a gap between the connection electrodes CNE and may be spaced apart from other openings OP in the first direction DR1. Since the connection electrodes CNE are disposed over the emission area EMA and the sub-area SA, the opening OP of the second insulating layer PAS2 may also extend in the first direction DR1 across the emission area EMA and the sub-area SA. The opening OP of the second insulating layer PAS2 may be disposed between the bank patterns BP1 and BP2 to overlap the light emitting elements ED in the emission area EMA and may be disposed between the contact parts CT1 and CT2 in the sub-area SA. The connection electrodes CNE partially exposed by the opening OP may contact both ends of the light emitting elements ED in the emission area EMA and may contact different electrodes RME through different contact parts CT1 and CT2 in the sub-area SA.

According to an embodiment, a width W1 of the opening OP of the second insulating layer PAS2 may be greater than a distance W2 between the connection electrodes CNE but may be smaller than the distance between the electrodes RME and a length L of each light emitting element ED. The second insulating layer PAS2 may cover most of the connection electrodes CNE, but the opening OP may expose a side of each of the connection electrodes CNE. For example, the opening OP may expose a side of the first connection electrode CNE1 which faces the second connection electrode CNE2 and a side of the second connection electrode CNE2 which faces the first connection electrode CNE1. Since the width W1 of the opening OP is greater than the distance W2 between the connection electrodes CNE, a side of each of the connection electrodes CNE may overlap the opening OP in the thickness direction. In an embodiment in which different connection electrodes CNE are spaced apart from each other on the light emitting elements ED and contact both ends of the light emitting elements ED, the opening OP of the second insulating layer PAS2 may at least partially expose the side surfaces of the light emitting elements ED. According to an embodiment, the width W1 of the opening OP of the second insulating layer PAS2 may be smaller than the length L of each light emitting element ED and the distance between the electrodes RME, and the opening OP of the second insulating layer PAS2 may at least partially expose the side surfaces of the light emitting elements ED. The second insulating layer PAS2 may cover both ends of each light emitting element ED.

In some embodiments, the width W1 of the opening OP of the second insulating layer PAS2 may be smaller than the distance between the electrodes RME. Accordingly, the opening OP of the second insulating layer PAS2 may not overlap the electrodes RME in the thickness direction. As illustrated in the drawings, in an embodiment in which the center of the opening OP is side by side with the center of a space between the electrodes RME, the opening OP may not overlap the electrodes RME. However, the disclosure is not limited thereto. The opening OP of the second insulating layer PAS2 may also not be side by side with the center of the space between the electrodes RME. In this case, the width W1 of the opening OP of the second insulating layer PAS2 may be smaller than the distance between the electrodes RME, but the opening OP may partially overlap any of the electrodes RME, and the second insulating layer PAS2 may cover only one end of each light emitting element ED. This will be described with reference to another embodiment.

A third insulating layer PAS3 is disposed on the second insulating layer PAS2. The third insulating layer PAS3 may generally be entirely disposed on the second insulating layer PAS2 but may not be disposed on a part of the second insulating layer PAS2 having a highest height due to a step difference thereunder. For example, the third insulating layer PAS3 may not be disposed on a part of the second insulating layer PAS2 which is disposed on the upper surfaces of the bank patterns BP1 and BP2 and the bank layer BNL, and may be disposed on a part of the second insulating layer PAS2 which is disposed on the side surfaces of the bank patterns BP1 and BP2 and the bank layer BNL. In addition, a part of the third insulating layer PAS3 may be disposed on inner sidewalls of the opening OP of the second insulating layer PAS2.

According to an embodiment, the third insulating layer PAS3 may include a first insulating pattern IP1 disposed on the inner sidewalls of the opening OP of the second insulating layer PAS2 and a second insulating pattern IP2 disposed on a part of the second insulating layer PAS2 which is disposed on the side surfaces of the bank patterns BP1 and BP2 and the bank layer BNL.

The first insulating pattern IP1 may be disposed along the inner sidewalls of the opening OP of the second insulating layer PAS2. Although not illustrated in the drawings, the first insulating pattern IP1 may surround a part exposed by the opening OP along the inside of the opening OP. The first insulating pattern IP1 may include parts extending in the first direction DR1 and parts extending in the second direction DR2 and may be disposed in the opening OP over the emission area EMA and the sub-area SA. The first insulating pattern IP1 may partially surround a part exposed by the opening OP to form an opening area.

According to an embodiment, parts of the first insulating pattern IP1 which extend in the first direction DR1 may be directly disposed on the connection electrodes CNE, respectively. Among the parts of the first insulating pattern IP1 which extend in the first direction DR1, a part disposed on the first side in the second direction DR2 may be disposed on the first connection electrode CNE1, and a part disposed on the second side in the second direction DR2 may be disposed on the second connection electrode CNE2. A width of the opening area surrounded by the first insulating pattern IP1 may be the same as a distance between the first connection electrode CNE1 and the second connection electrode CNE2, and sidewalls of the parts of the first insulating pattern IP1 which extend in the first direction DR1 may be parallel to sides of different connection electrodes CNE, respectively.

The second insulating pattern IP2 may be disposed on and around a part of the second insulating layer PAS2 which is disposed on the bank patterns BP1 and BP2 and the bank layer BNL. The second insulating pattern IP2 may be disposed not only on the side surfaces of the bank patterns BP1 and BP2 and the bank layer BNL but also on the second insulating layer PAS2 between the bank patterns BP1 and BP2 and the light emitting elements ED and between the bank patterns BP1 and BP2 and the bank layer BNL. However, the second insulating pattern IP2 may not be disposed on the upper surfaces of the bank patterns BP1 and BP2 and the bank layer BNL and may expose a part of the second insulating layer PAS2 which is disposed on the upper surfaces of the bank patterns BP1 and BP2 and the bank layer BNL.

During the fabrication process of the display device 10, the third insulating layer PAS3 may be entirely disposed on the second insulating layer PAS2 and may be partially removed. In this process, parts of the third insulating layer PAS3 which are disposed at a high position due to a step difference thereunder and a part of the second insulating layer PAS2 which is disposed in the opening OP may be removed. Accordingly, the third insulating layer PAS3 may be divided into the first insulating pattern IP1 and the second insulating pattern IP2. However, the disclosure is not limited thereto. The third insulating layer PAS3 may also be disposed only on the inner sidewalls of the opening OP of the second insulating layer PAS2 and may not be disposed on other parts.

As described above, in the display device 10, connection electrodes CNE may be formed as a pattern, and the pattern may be separated into different connection electrodes CNE after the opening OP of the second insulating layer PAS2 is formed. A connection electrode CNE formed as a pattern may be separated in a part where the first insulating pattern IP1 of the third insulating layer PAS3 is not disposed in the opening OP of the second insulating layer PAS2. For example, the opening OP of the second insulating layer PAS2 and the first insulating pattern IP1 of the third insulating layer PAS3 may be utilized as a mask for separating the connection electrode CNE formed as a pattern. The distance between the connection electrodes CNE may be smaller than a minimum distance between parts of a photoresist for forming the opening OP of the second insulating layer PAS2.

The display device 10 according to the embodiment may be fabricated by a process of separating the connection electrodes CNE by using layers, and the connection electrodes CNE may be spaced apart from each other by a small distance beyond the process resolution of a patterning process performed using a mask. This will be described in detail below with reference to other drawings.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked. In an embodiment, each of the first insulating layer PAS1, the second insulating layer PAS2, and the third insulating layer PAS3 may be (or include) at least one of silicon oxide (SiOx), silicon nitride (SiNx), and silicon oxynitride (SiOxNy). The first insulating layer PAS1, the second insulating layer PAS2, and the third insulating layer PAS3 may be made of (or include) a same material, some thereof may be made of a same material while others thereof are made of different materials, or may be made of different materials.

Figure 9:
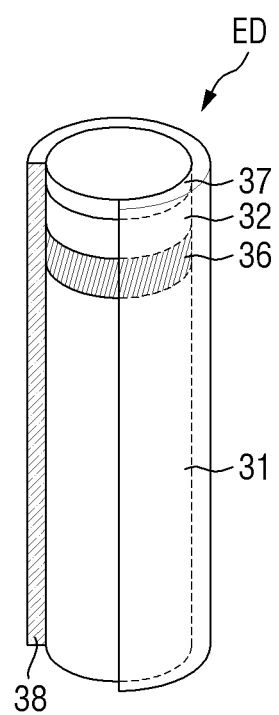
FIG. 9 is a schematic view of a light emitting element according to an embodiment.

FIG. 9 is a schematic view of a light emitting element ED according to an embodiment.

Referring to FIG. 9, the light emitting element ED may be a light emitting diode. The light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes in which polarities are formed.

The light emitting element ED according to the embodiment may extend in a direction. The light emitting element ED may have a shape of a cylinder, a rod, a wire, a tube, or the like. However, the shape of the light emitting element ED is not limited thereto, and the light emitting element ED may also have various shapes including polygonal prisms, such as a cube, a rectangular parallelepiped, and a hexagonal prism, and a shape extending in a direction and having a partially inclined outer surface.

The light emitting element ED may include a semiconductor layer doped with impurities of any conductivity type (e.g., a p type or an n type). The semiconductor layer may receive an electrical signal from an external power source and emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be (or include) at least one of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be at least one of AlGaInN, GaN, AlGaN, GaN, AlN, and InN doped with a p-type dopant. The p-type dopant used to dope the second semiconductor layer 32 may be Mg, Zn, Ca, Se, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN or AlGaInN. In particular; in case that the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different group III to V semiconductor materials depending on the wavelength band of emitted light. Light emitted from the light emitting layer 36 is not limited to light in a blue wavelength band. In some embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode, the electrode layer 37 may reduce the resistance between the light emitting element ED and the electrode or the connection electrode. The electrode layer 37 may include a conductive metal. For example, the electrode layer 37 may include at least one of aluminum (Al), titanium (Ti), indium (in), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround at least an outer surface of the light emitting layer 36 but may expose both ends of the light emitting element ED in a longitudinal direction. In addition, an upper surface of the insulating film 38 may also be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In some embodiments, the insulating film 38 may be formed in a multilayer structure in which layers are stacked.

The insulating film 38 may protect the semiconductor layers and the electrode layer of the light emitting element ED. The insulating film 38 may prevent an electrical short circuit that may occur in the light emitting layer 36 in case that the light emitting layer 36 directly contacts an electrode through which an electrical signal is transmitted to the light emitting element ED. In addition, the insulating film 38 may prevent a reduction in luminous efficiency of the light emitting element ED.

In addition, an outer surface of the insulating film 38 may be treated. The light emitting element ED may be sprayed onto electrodes in a state where it is dispersed in an ink and then may be aligned. The surface of the insulating film 38 may be hydrophobically or hydrophilically treated so that the light emitting element ED remains separate from other adjacent light emitting elements ED in the ink without agglomerating with them.

FIGS. 10 to 16 are schematic cross-sectional views sequentially illustrating a process of fabricating a display device according to an embodiment. FIGS. 10 to 16 are respectively schematic cross-sectional views illustrating structures according to the formation order of each layer in a subpixel SPXn of a display device 10. The structures of FIGS. 10 to 16 may correspond to the structure illustrated in FIG. 8. A process of forming each layer may be performed by a general patterning process. A formation method in each process will be briefly described, and a formation order will be mainly described below.

Figure 10:
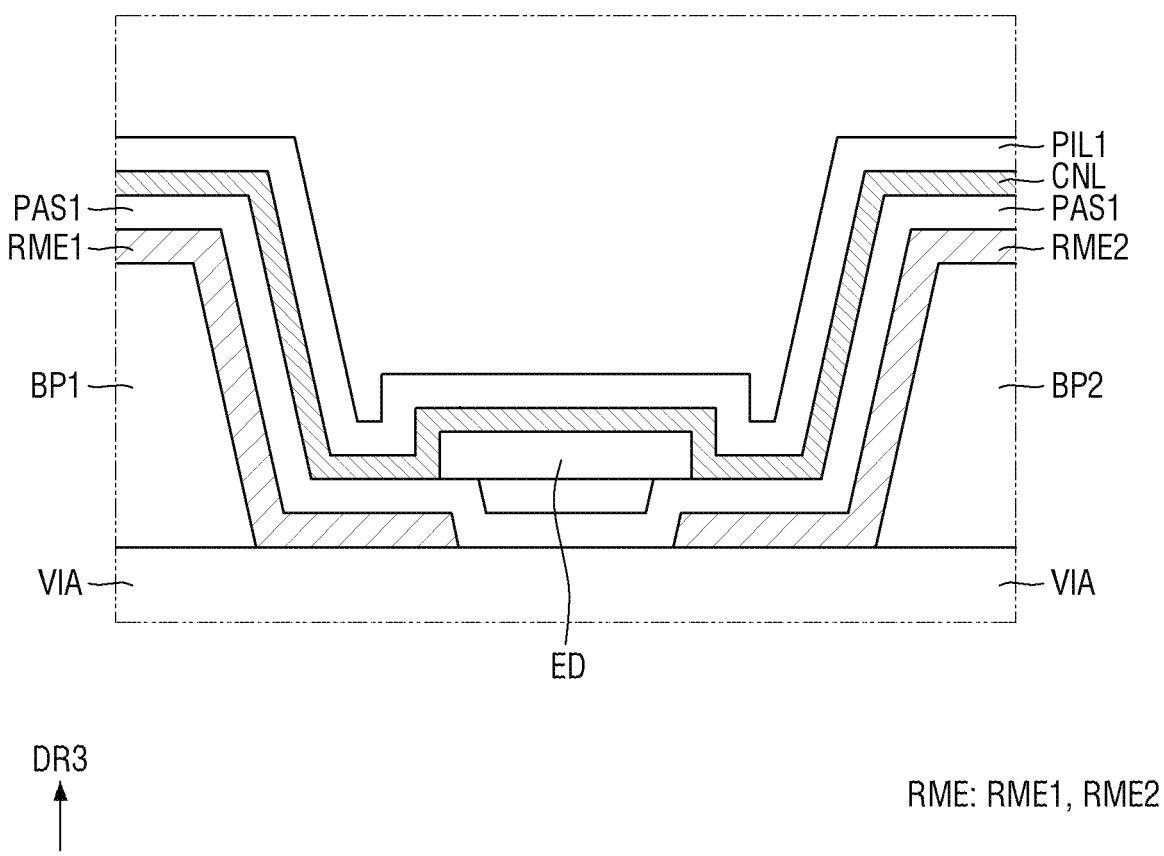
FIGS. 10 through 16 are schematic cross-sectional views sequentially illustrating a process of fabricating a display device according to an embodiment.

First, referring to FIG. 10, a first substrate SUB is prepared, and first to third conductive layers, a buffer layer BL, a first gate insulating layer GI, a first interlayer insulating layer IL1, a via layer VIA, bank patterns BP1 and BP2, electrodes RME, a first insulating layer PAS1, a bank layer BNL, and light emitting elements ED are placed on the first substrate SUB. A connection electrode layer CNL covering the light emitting elements ED and a first insulating layer (or first insulating material layer) PIL1 disposed on the connection electrode layer CNL are formed.

Each of the first to third conductive layers and the electrodes RME disposed on the first substrate SUB may be formed by depositing a material that forms the layer, for example, a metal material and patterning the material by using a mask. In addition, each of the buffer layer BL, the first gate insulating layer GI, the first interlayer insulating layer IL1, the via layer VIA, the bank patterns BP1 and BP2, the first insulating layer PAS1, and the bank layer BNL disposed on the first substrate SUB may be formed by coating a material that forms the layer, for example, an insulating material or by performing a patterning process using a mask if desired. The structure of the layers disposed on the first substrate SUB is the same as that described above.

In an embodiment, light emitting elements ED may be placed on the electrodes RME by an inkjet printing process. In case that an electrical signal is transmitted to the electrodes RME after ink in which the light emitting elements ED are dispersed is sprayed into an area surrounded by the bank layer BNL, the light emitting elements ED may be mounted on the electrodes RME as the position and orientation direction of the light emitting elements ED in the ink change.

The connection electrode layer CNL may be disposed directly on the first insulating layer PAS1 and may be disposed to cover the light emitting elements ED. The connection electrode layer CNL may be disposed to partially overlap the electrodes RME and the bank patterns BP1 and BP2. The connection electrode layer CNL may be disposed to cover sides of the electrodes RME and the bank patterns BP1 and BP2 which face each other. Although not illustrated in the drawing, the connection electrode layer CNL may be disposed over an emission area EMA and a sub-area SA, and a part of the connection electrode layer CNL may be disposed on the bank layer BNL. The connection electrode layer CNL may be separated into different connection electrodes CNE by removing a part of the connection electrode layer CNL in a process to be described below.

The first insulating layer PIL1 may be entirely disposed on the first insulating layer PAS1 and may be disposed to cover the connection electrode layer CNL and the bank layer BNL. The first insulating layer PIL1 may be disposed to cover the light emitting elements ED in addition to the bank patterns BP1 and BP2 and the electrodes RME. A part of the first insulating layer PIL1 may be patterned in a process to be described below to form an opening OP partially exposing the light emitting elements ED and the connection electrode layer CNL.

Figure 11:
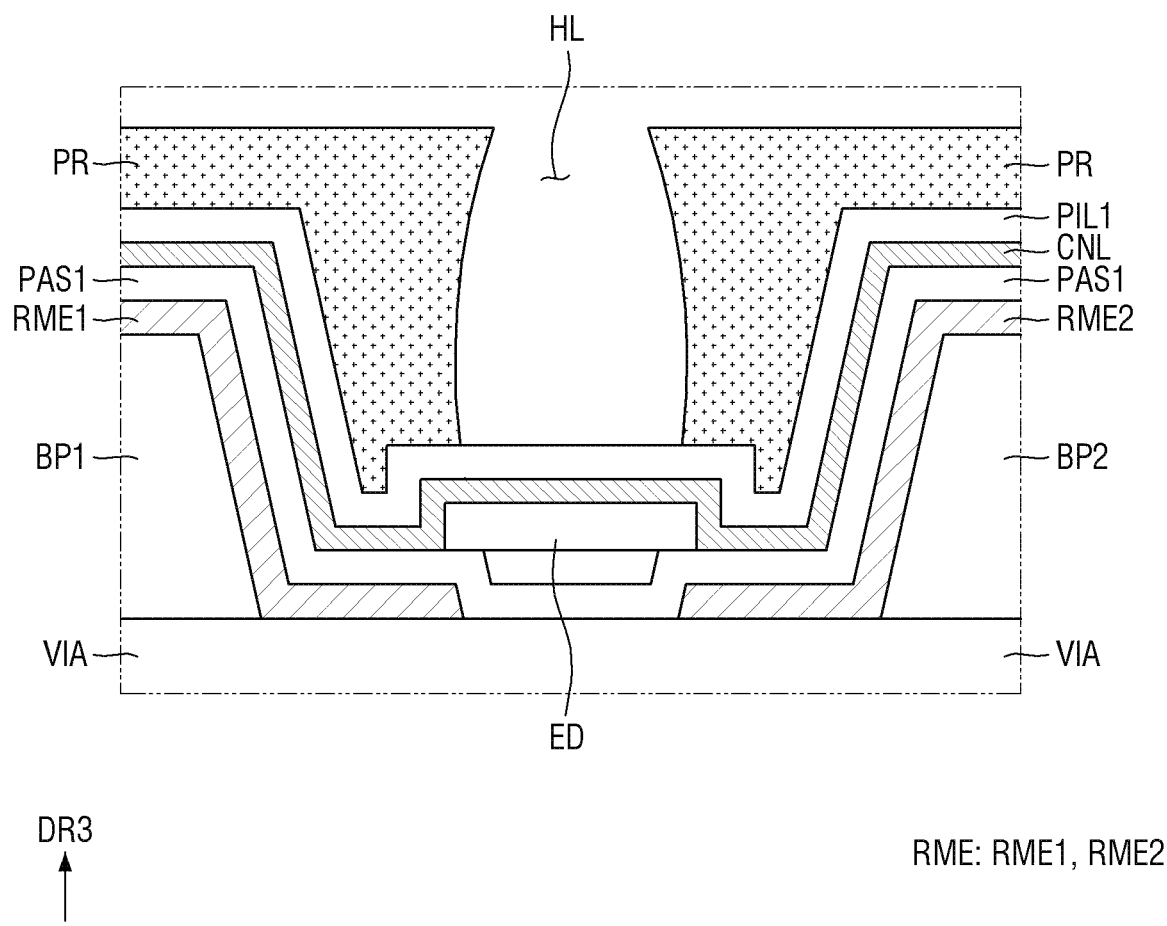
Figure 12:
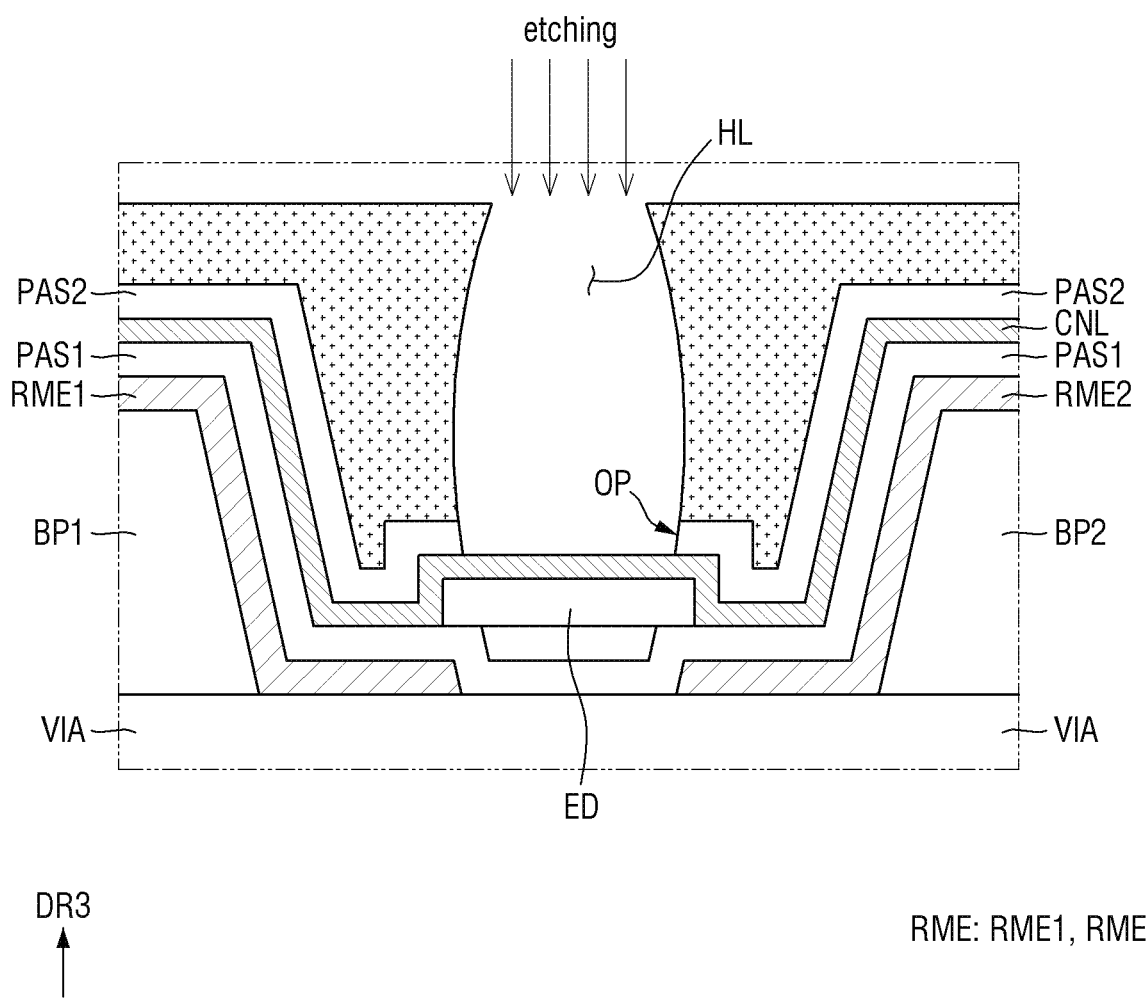
Figure 13:
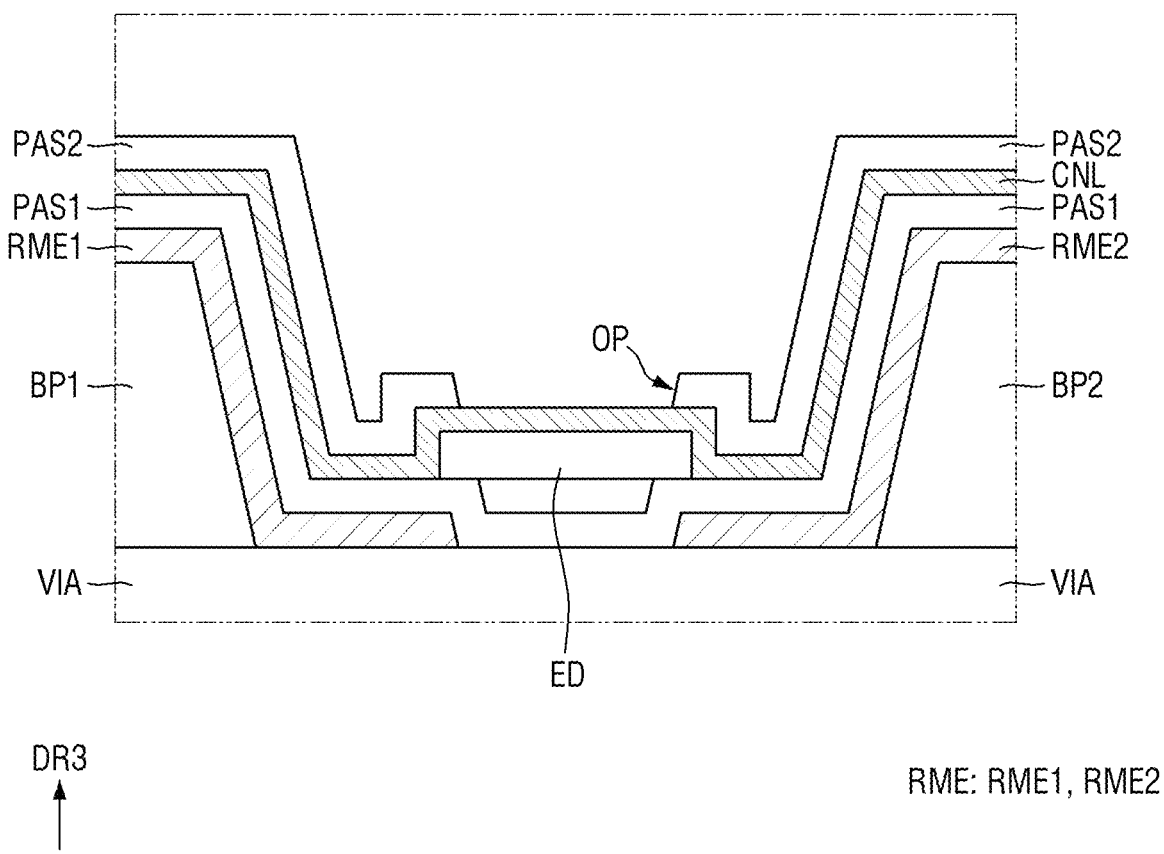

Referring to FIGS. 11 to 13, a photoresist PR having parts spaced apart from each other is formed on the first insulating layer PIL1, and a part of the first insulating layer PIL1 is patterned to form a second insulating layer PAS2 including the opening OP. The photoresist PR may be entirely disposed on the first insulating layer PIL1 but may be disposed to expose a part of the first insulating layer PIL1 which is disposed between the bank patterns BP1 and BP2. The photoresist PR may include a hole HL partially exposing a space between the bank patterns BP1 and BP2 extending in the first direction DR1, which is a part where the light emitting elements ED are disposed, and may be disposed on the first insulating layer PIL1. The photoresist PR may be utilized as a mask for forming the opening OP of the second insulating layer PAS2 by removing a part of the first insulating layer PIL1. Parts of the photoresist PR may be spaced apart from each other by the space between the bank patterns BP1 and BP2.

In case that the photoresist PR is formed, a part of the first insulating layer PIL1 is patterned using the photoresist PR as a mask. As illustrated in FIGS. 11 and 12, the first insulating layer PIL1 exposed through the hole HL of the photoresist PR may be partially removed by an etching process to form the second insulating layer PAS2. A part of the first insulating layer PIL1 may be etched along the photoresist PR to form the opening OP exposing the connection electrode layer CNL thereunder. The first insulating layer PIL1 may form the second insulating layer PAS2 including the opening OP exposing a part of the connection electrode layer CNL. In case that the first insulating layer PIL1 is partially etched to form the second insulating layer PAS2, the photoresist PR disposed on the second insulating layer PAS2 may be removed.

Parts of the photoresist PR may be spaced apart from each other by exposure and development processes performed using a mask. A width of the hole HL of the photoresist PR may vary according to the resolution of a mask used in an exposure process, which may affect a width of the opening OP of the second insulating layer PAS2. As the limit resolution of a mask process increases, the opening OP of the second insulating layer PAS2 may have a narrower width. In case that the opening OP of the second insulating layer PAS2 has a width sufficiently smaller than a length of each light emitting element ED because of high limit resolution of the mask process, there may be no problem in forming the connection electrodes CNE spaced apart from each other by using only the second insulating layer PAS2, even allowing for an alignment margin of the mask process. As illustrated in the drawings, in case that the opening OP of the second insulating layer PAS2 can be formed not to overlap both ends of the light emitting elements ED, the connection electrodes CNE respectively contacting both ends of the light emitting elements ED may be smoothly formed by patterning the connection electrode layer CNL by using the second insulating layer PAS2 as a mask.

However, in case that the limit resolution of the mask process is not sufficiently high, the opening OP may not be formed at a designed position in a patterning process for forming the opening OP of the second insulating layer PAS2. As a result, the opening OP of the second insulating layer PAS2 may overlap one end (or first end) of each light emitting element ED. In this case, the opening OP of the second insulating layer PAS2 may expose a part of the connection electrode layer CNL which is disposed on the first end of each light emitting element ED. If the connection electrode layer CNL is patterned using the second insulating layer PAS2 as a mask, there may be light emitting elements ED that do not contact the connection electrodes CNE. In the display device 10 according to the embodiment, a mask process is performed using a layer other than the second insulating layer PAS2 or a layer other than the photoresist PR in consideration of an alignment margin of the mask process. Therefore, it is possible to form the connection electrodes CNE spaced apart from each other by a distance smaller than the limit resolution of the mask process.

Figure 14:
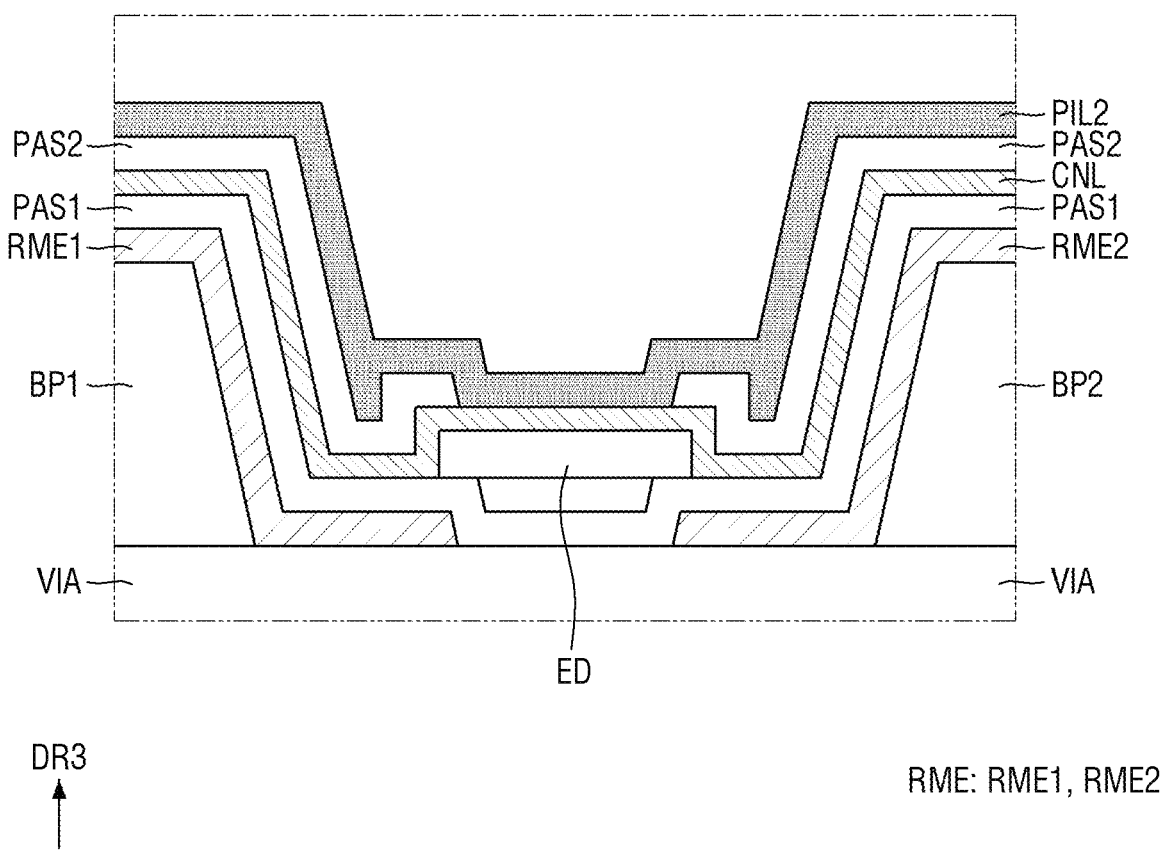
Figure 15:
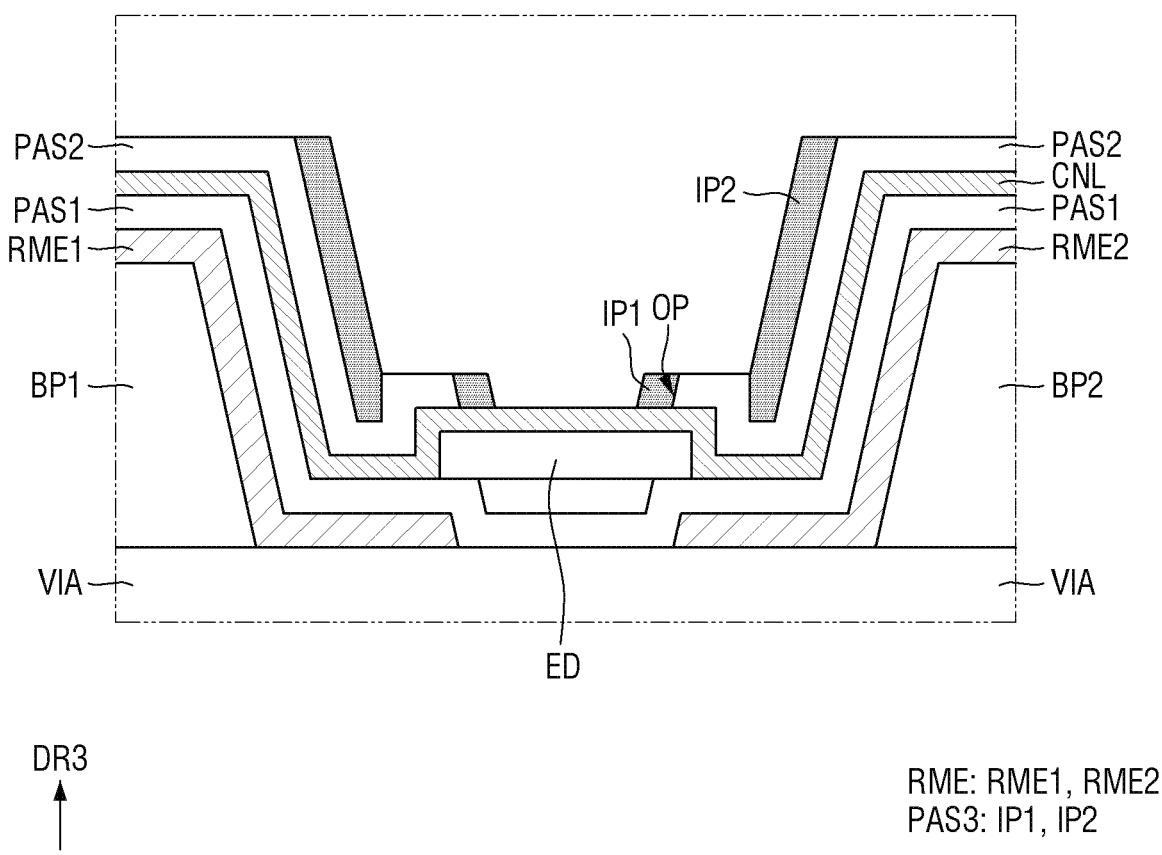

Referring to FIGS. 14 and 15, a second insulating layer (or second insulating material layer) PIL2 is formed on the second insulating layer PAS2 and partially etched to form a third insulating layer PAS3. The second insulating layer PIL2 may be disposed to cover (or overlap in a plan view) the second insulating layer PAS2 and the opening OP, and a part of the second insulating layer PIL2 may be disposed directly on the connection electrode layer CNL exposed by the opening OP. In an embodiment, the second insulating layer PIL2 may be made of a different material from the first insulating layer PIL1 or the second insulating layer PAS2. The second insulating layer PIL2 may be partially patterned by an anisotropic etching process while the second insulating layer PAS2 remains unetched. In the anisotropic etching process of the second insulating layer PIL2, the second insulating layer PIL2 may be removed to expose a part of the second insulating layer PAS2 which is disposed on upper surfaces of the bank patterns BP1 and BP2 and the bank layer BNL and to expose the connection electrode layer CNL overlapping the opening OP. The second insulating layer PIL2 may be partially removed to form the third insulating layer PAS3 including a first insulating pattern IP1 disposed on inner sidewalls of the opening OP of the second insulating layer PAS2 and a second insulating pattern IP2 disposed on side surfaces of the bank patterns BP1 and BP2 and the bank layer BNL.

Figure 16:
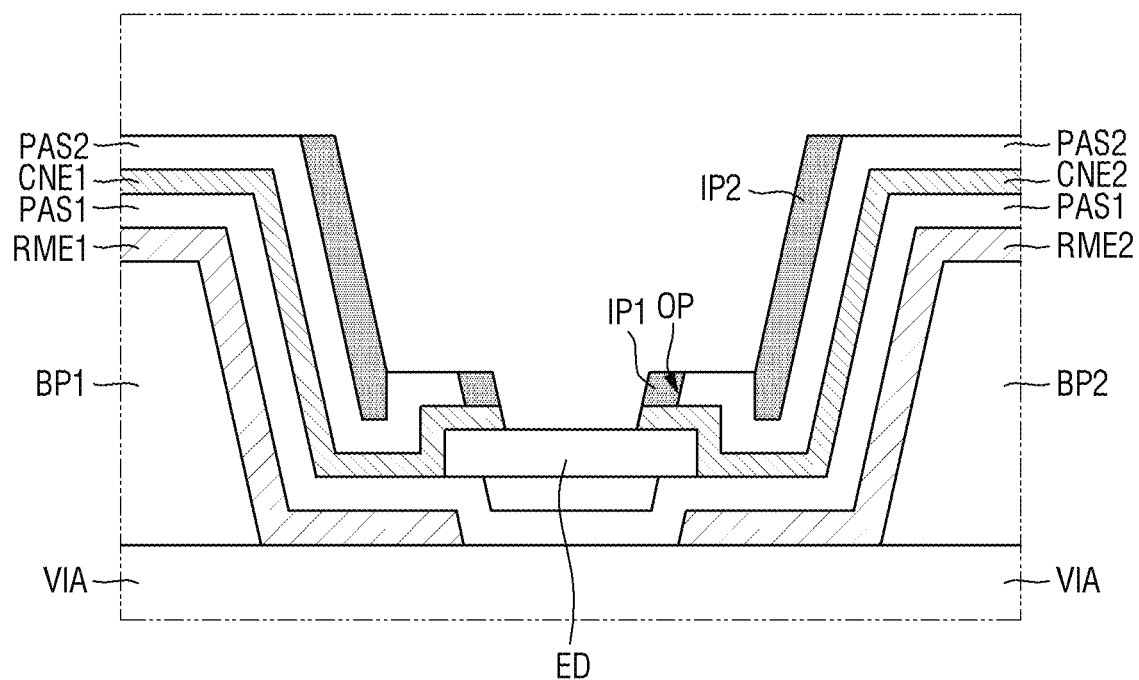

Referring to FIG. 16 together with FIG. 15, a part of the connection electrode layer CNL exposed by the opening OP and the first insulating pattern IP1 is removed to form the connection electrodes CNE spaced apart from each other.

In a method of fabricating the display device 10 according to the embodiment, the process of forming the second insulating layer PAS2 and the third insulating layer PAS3 may be performed before the process of forming the connection electrodes CNE. In the process of forming the second insulating layer PAS2 and the third insulating layer PAS3, an opening area exposing a part of the connection electrode layer CNL may be formed to partially etch the connection electrode layer CNL disposed under the second insulating layer PAS2 and the third insulating layer PAS3. The connection electrode layer CNL partially patterned along the opening area may form the connection electrodes CNE spaced apart from each other.

For example, the opening OP of the second insulating layer PAS2 and the first insulating pattern PI of the third insulating layer PAS3 may expose a part of the connection electrode layer CNL which is disposed on the light emitting elements ED. A part of the connection electrode layer CNL which corresponds to the opening area surrounded by the first insulating pattern IP1 may be exposed, and the exposed part may be removed in the current process. The process of forming the opening OP of the second insulating layer PAS2 may be performed by a patterning process using the photoresist PR, and the process of forming the first insulating pattern IP1 of the third insulating layer PAS3 may be performed by an anisotropic etching process. In the display device 10, the opening area narrower than the limit resolution of a patterning process for forming the photoresist PR may be formed by an anisotropic etching process performed in the process of forming the third insulating layer PAS3.

Accordingly, the connection electrodes CNE formed by the partial removal of the connection electrode layer CNL may be spaced apart from each other by a distance smaller than the limit resolution of the patterning process for forming the photoresist PR. In the display device 10 according to the embodiment, since the distance between the connection electrodes CNE is smaller than the length of each light emitting element ED, it is possible to prevent a light emission failure that occurs in a corresponding subpixel SPXn in case that the connection electrodes CNE and the light emitting elements ED are not electrically connected to each other.

Figure 17:
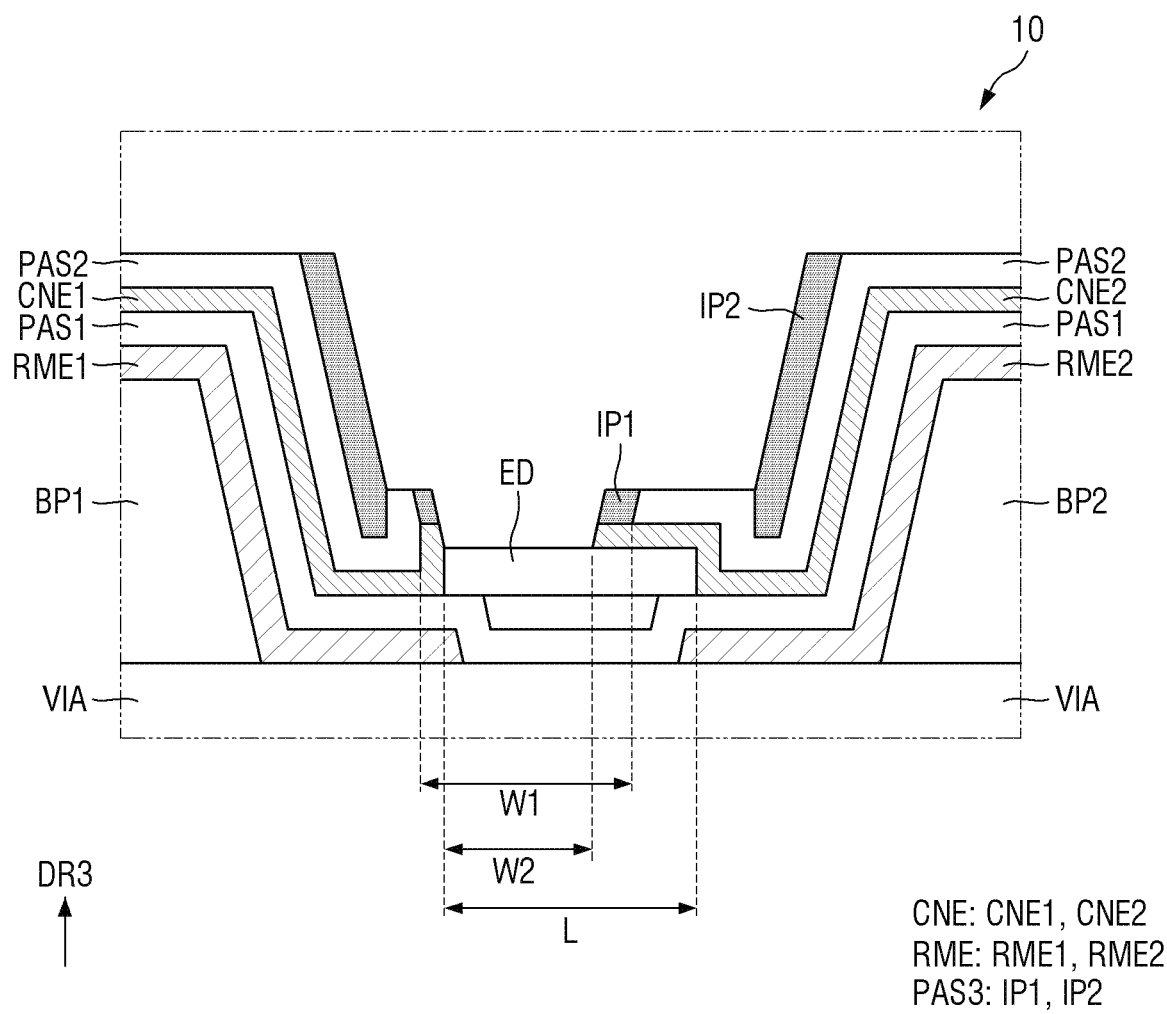
FIG. 17 is a schematic cross-sectional view of a part of a display device according to an embodiment.

FIG. 17 is a schematic cross-sectional view of a part of a display device 10 according to an embodiment.

Referring to FIG. 17, in the display device 10 according to the embodiment, the center of a part between connection electrodes CNE spaced apart from each other and the center of an opening OP of a second insulating layer PAS2 may not be side by side with the center of a light emitting element ED. Unlike in the embodiment of FIG. 8, a first connection electrode CNE1 and a second connection electrode CNE2 may be spaced apart from the center of the light emitting element ED by different distances. Accordingly, the first connection electrode CNE1 may contact an end surface of the light emitting element ED, and the second connection electrode CNE2 may contact an end surface and a side surface of the light emitting element ED. A length L of the light emitting element ED, a distance W2 between the first connection electrode CNE1 and the second connection electrode CNE2, and a width W1 of the opening OP of the second insulating layer PAS2 are the same as those of the embodiment of FIG. 8, respectively. The current embodiment is different from the embodiment of FIG. 8 in that the part between the connection electrodes CNE and the opening OP are shifted to the first side in the second direction DR2.

In a patterning process for forming the opening OP of the second insulating layer PAS2 during a fabrication process of the display device 10, parts of a photoresist PR may be spaced apart from each other between bank patterns BP1 and BP2. In case that a hole HL of the photoresist PR deviates from a designed position in an area between the bank patterns BP1 and BP2, the opening OP of the second insulating layer PAS2 may be shifted to one side of the light emitting element ED. However, as described above, since the display device 10 includes a process of forming a third insulating layer PAS3 by anisotropic etching, even if the photoresist PR deviates from a desired position, different connection electrodes CNE may be formed to contact both ends of the light emitting element ED, respectively.

FIGS. 18 to 22 are schematic cross-sectional views sequentially illustrating a process of fabricating the display device 10 of FIG. 17. FIGS. 18 to 22 may correspond to the operations of FIGS. 11 and 13 to 16, respectively.

Figure 18:
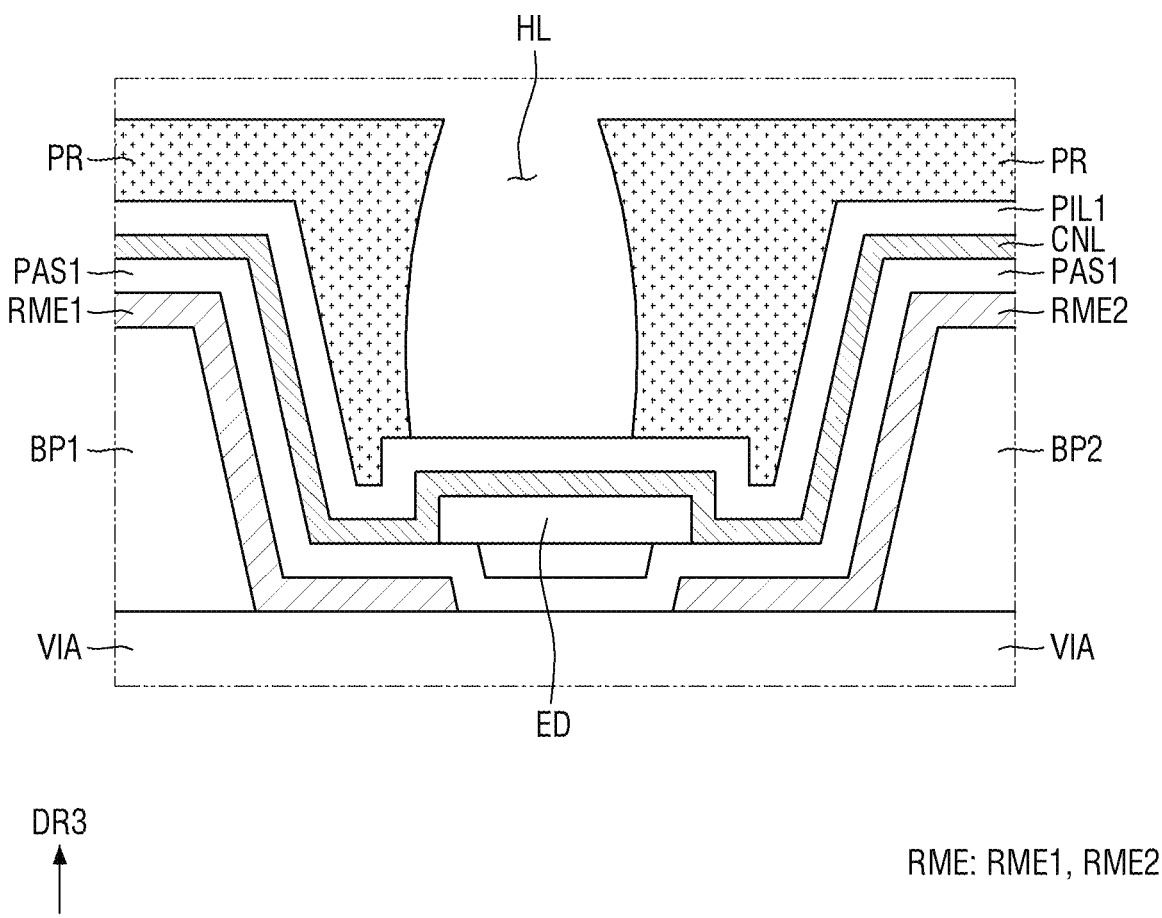
FIGS. 18 through 22 are schematic cross-sectional views sequentially illustrating a process of fabricating the display device of FIG. 17.
Figure 19:
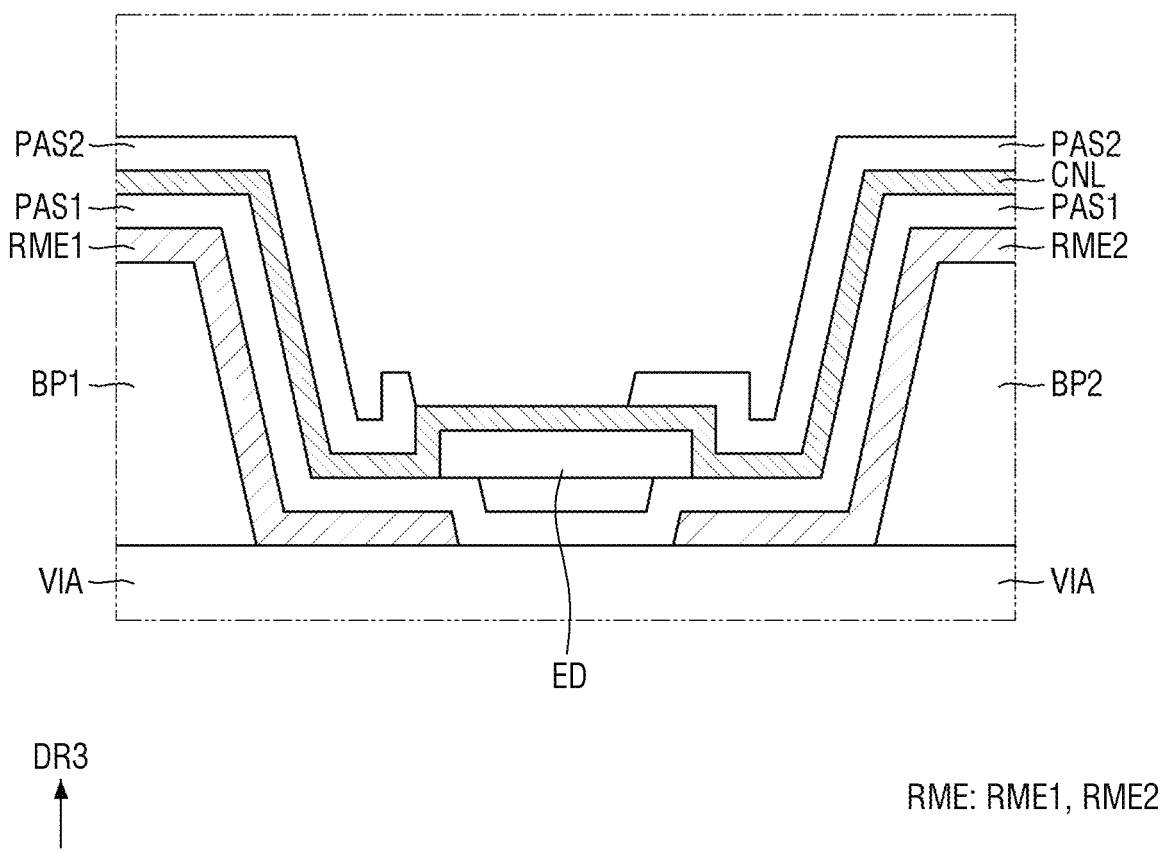

First, referring to FIGS. 18 and 19, a process of forming a second insulating layer PAS2 in the fabrication process of the display device 10 may be achieved by a patterning process using a photoresist PR as a mask. Unlike in the embodiment of FIGS. 11 to 13, in case that the photoresist PR is formed at a position different from a designed position in the embodiment, an opening OP of the second insulating layer PAS2 may be shifted to one side of a light emitting element ED. Accordingly, the opening OP of the second insulating layer PAS2 may overlap an end of the light emitting element ED, for example, an end disposed on a first electrode RME1, and the second insulating layer PAS2 may be disposed to cover the other end (or another end) of the light emitting element ED which is disposed on a second electrode RME2.

If a part of a connection electrode layer CNL which is exposed by the opening OP of the second insulating layer PAS2 is removed, any of connection electrodes CNE separated from each other may not contact an end surface of the light emitting element ED, and a light emission failure may occur in a corresponding subpixel SPXn. To prevent this, a third insulating layer PAS3 utilized as a mask for patterning the connection electrode layer CNL may be further formed in the display device 10. Therefore, even if the position of the photoresist PR is changed, a width of a part in which the connection electrode layer CNL is etched can be reduced.

Figure 20:
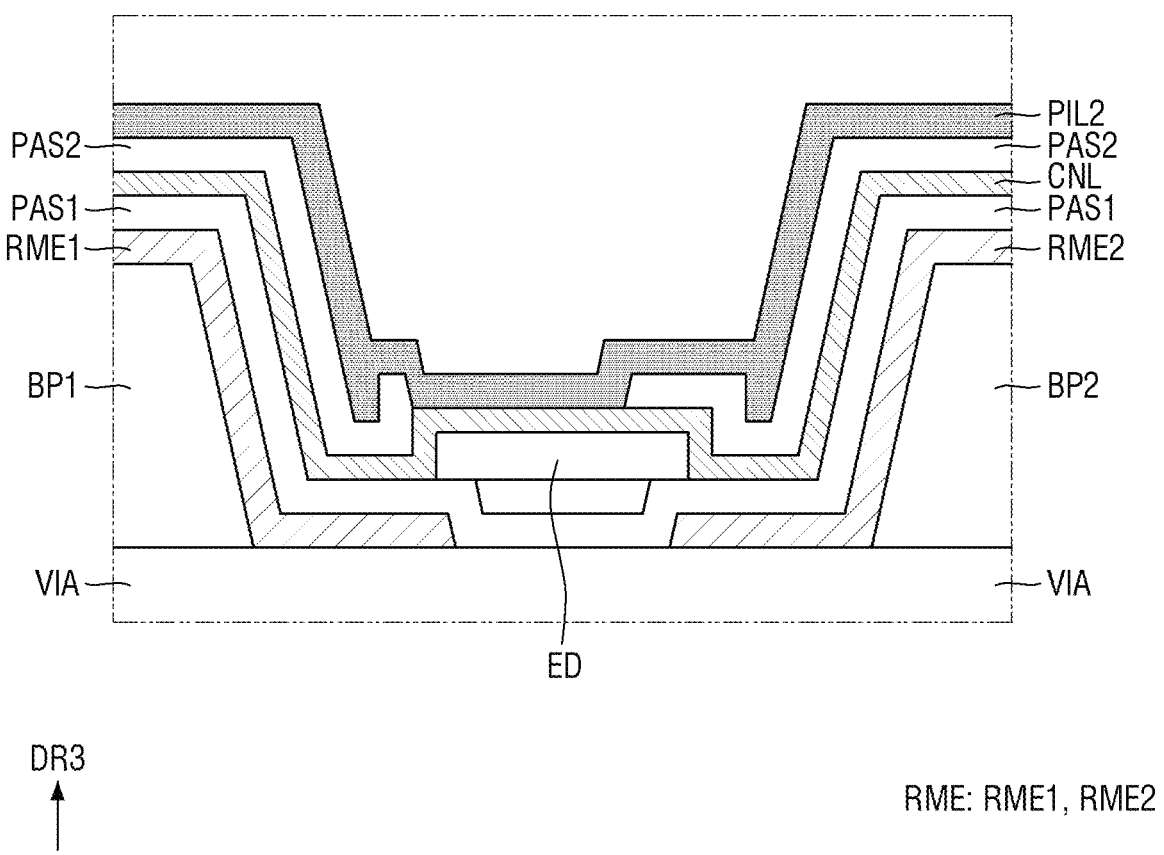
Figure 21:
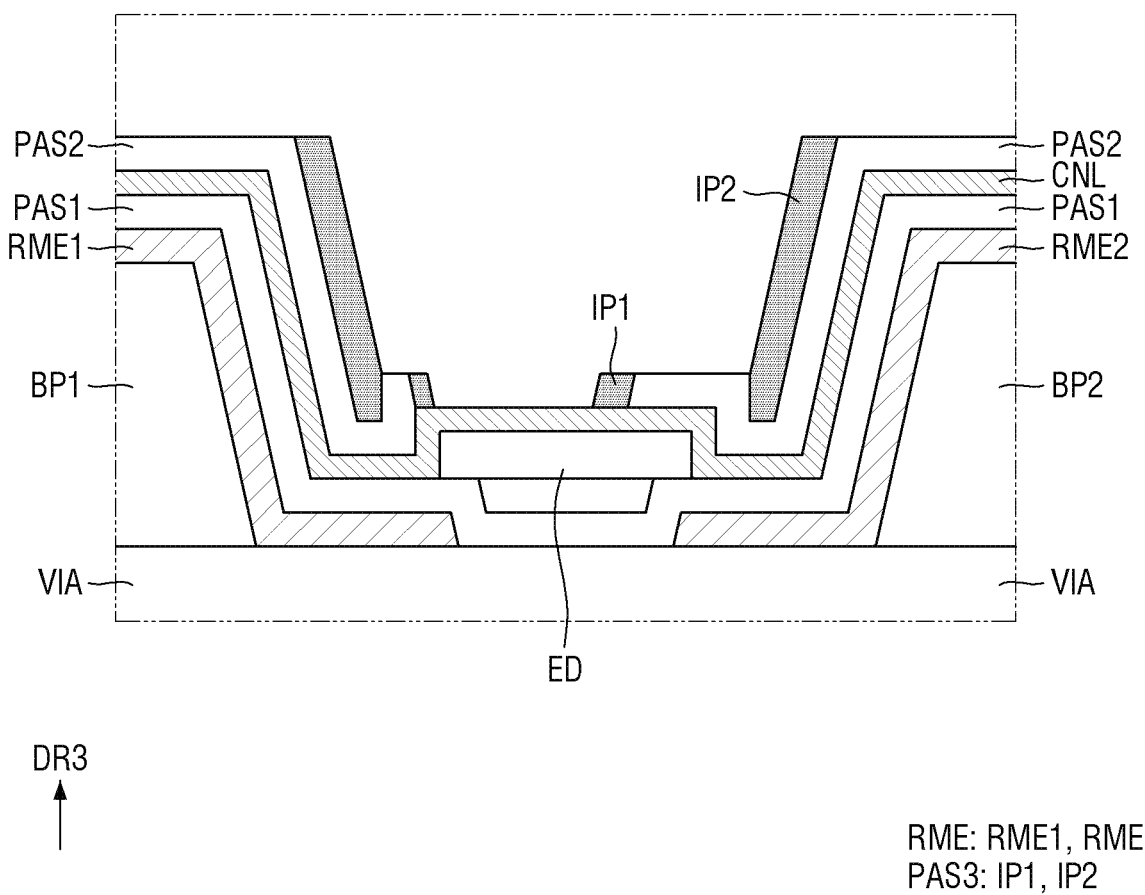

Referring to FIGS. 20 and 21, as described above with reference to FIGS. 14 and 15, a second insulating layer PIL2 may be formed on the second insulating layer PAS2 and may be anisotropically etched to form the third insulating layer PAS3. The third insulating layer PAS3 may include a first insulating pattern IP1 disposed on inner sidewalls of the opening OP of the second insulating layer PAS2, and the width of the part in which the connection electrode layer CNL is removed may be further reduced. The first insulating pattern IP1 of the third insulating layer PAS3 may cover one end (or first end) of the light emitting element ED not covered by the second insulating layer PAS2. After the connection electrode layer CNL is partially removed, a connection electrode CNE contacting the one end of the light emitting element ED may remain under the first insulating pattern IP1.

Figure 22:
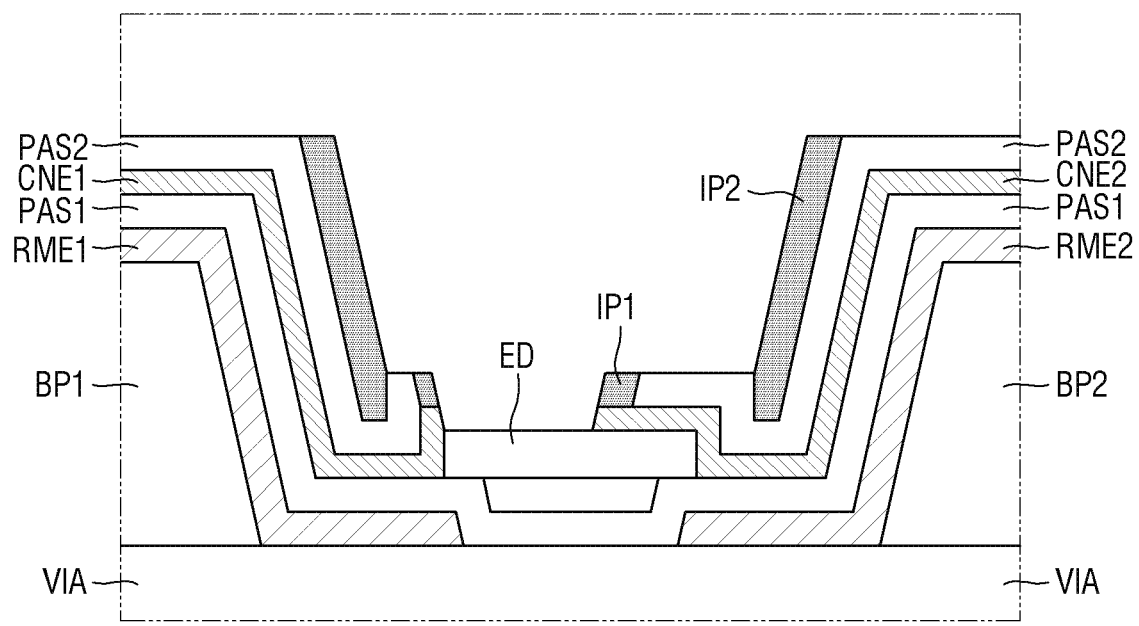

Referring to FIG. 22, in case that the connection electrode layer CNL is partially removed along an opening area surrounded by the first insulating pattern IP1, connection electrodes CNE1 and CNE2 spaced apart from each other may be formed. A first connection electrode CNE1 may contact only an end surface of an end (or first end) of the light emitting element ED which is disposed on the first electrode RME1, and a second connection electrode CNE2 may contact an end surface and a side surface of the other end (or second end) of the light emitting element ED which is disposed on the second electrode RME2. Since the display device 10 further includes the third insulating layer PAS3, the connection electrodes CNE may be spaced apart from each other by a distance smaller than the opening OP of the second insulating layer PAS2. In addition, even if the opening OP is not formed as designed, a connection failure between the light emitting element ED and the connection electrodes CNE can be prevented.

However, if the opening OP of the second insulating layer PAS2 can be formed to have a width sufficiently smaller than a length L of the light emitting element ED because of high limit resolution of the photoresist PR, the third insulating layer PAS3 may be omitted.

Figure 23:
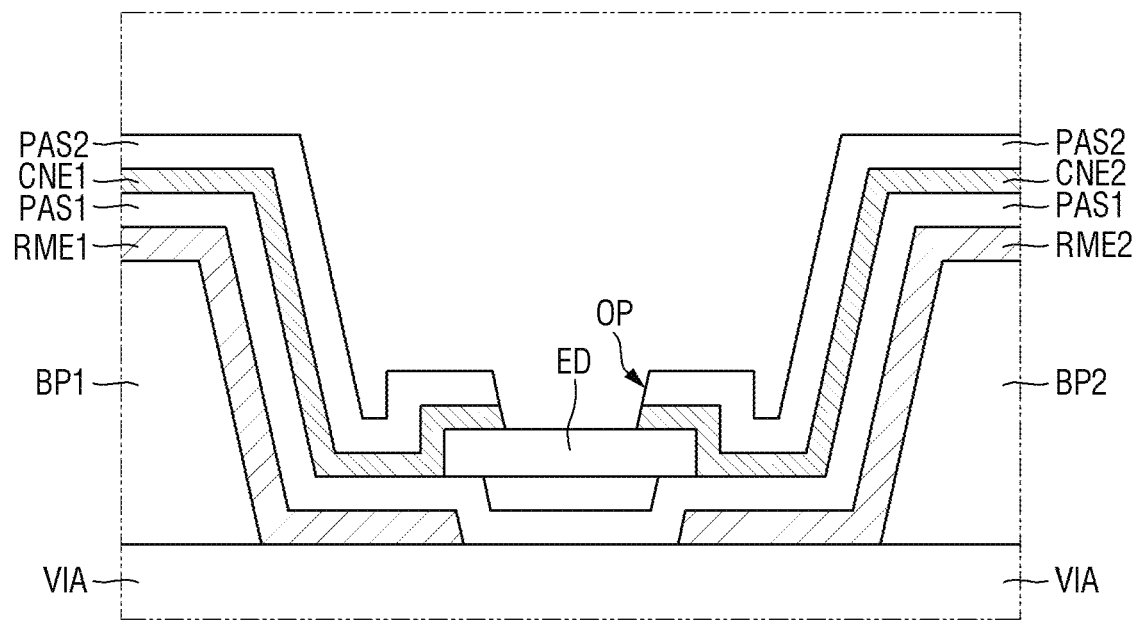
FIG. 23 is a schematic cross-sectional view of a part of a display device according to an embodiment.

FIG. 23 is a schematic cross-sectional view of a part of a display device 10 according to an embodiment.

Referring to FIG. 23, in the display device 10 according to the embodiment, a third insulating layer PAS3 may be omitted. In a process of forming a second insulating layer PAS2 by using a photoresist PR as a mask, if the photoresist PR is formed as designed, and an opening OP of the second insulating layer PAS2 is smoothly formed to have a width W1 smaller than a length L of a light emitting element ED, the third insulating layer PAS3 may be omitted. In a process of forming connection electrodes CNE, a connection electrode layer CNL may be partially removed by an etching process performed using the second insulating layer PAS2 as a mask. Accordingly, sidewalls on respective sides of the connection electrodes CNE which are spaced apart from each other may be formed to be side by side with sidewalls of the opening OP of the second insulating layer PAS2. If misalignment of a mask is prevented during a process of fabricating the display device 10, the connection electrodes CNE can be formed to respectively contact both ends of the light emitting elements ED even if the third insulating layer PAS3 is omitted.

Other embodiments of the display device 10 will now be described with reference to other drawings.

Figure 24:
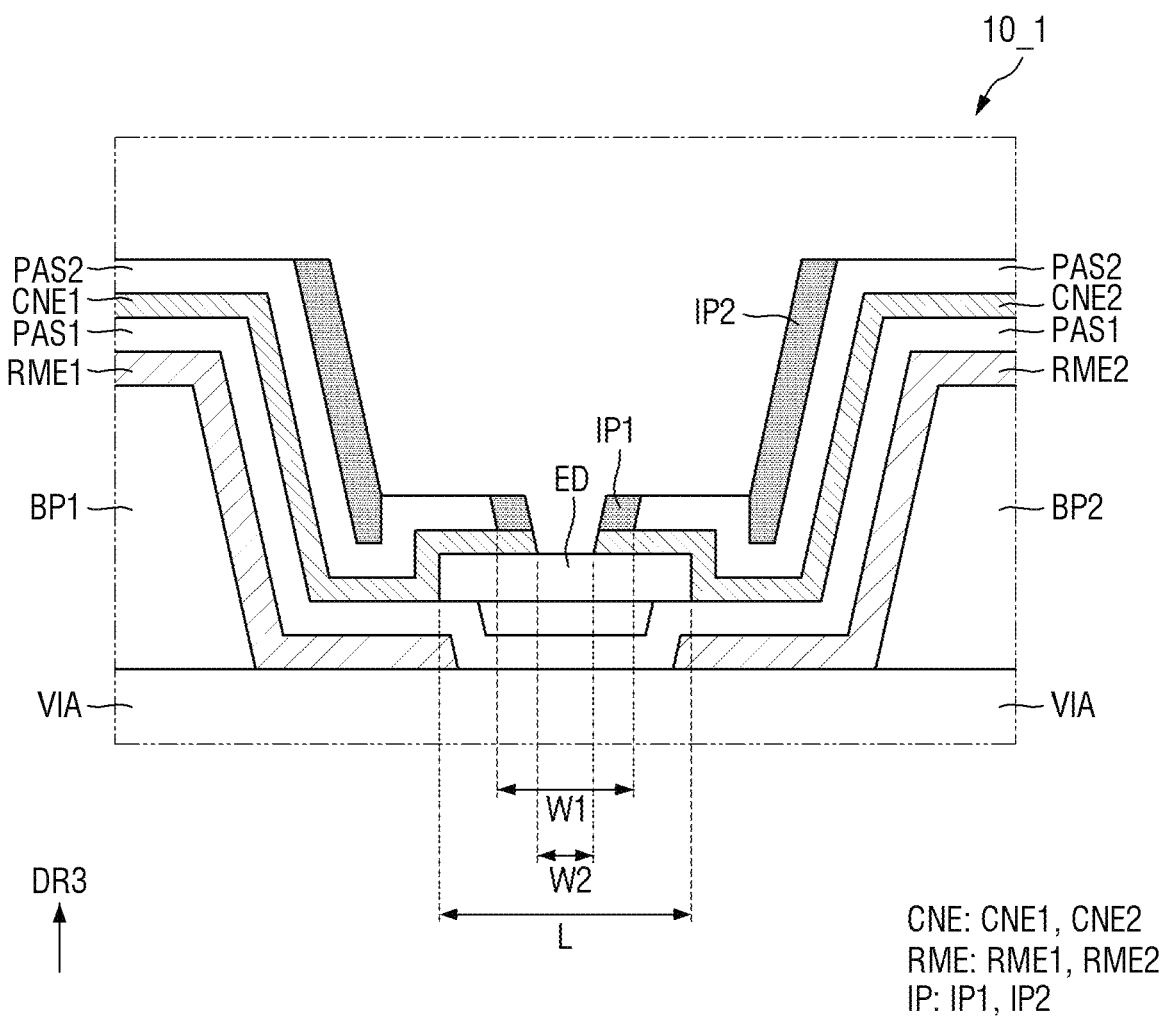
FIG. 24 is a schematic cross-sectional view of a part of a display device according to an embodiment.

FIG. 24 is a schematic cross-sectional view of a part of a display device 101 according to an embodiment.

Referring to FIG. 24, in the display device 10_1 according to the embodiment, a distance between different connection electrodes CNE may be further reduced. In the display device 10_1, a width W1 of an opening OP of a second insulating layer PAS2 and a distance W2 between the connection electrodes CNE relative to a length L of a light emitting element ED may be further reduced as compared with the embodiment of FIG. 8. The embodiment is different from the embodiment of FIG. 8 in that the width W1 of the opening OP is different from the distance W2 between the connection electrodes CNE.

In a process of fabricating the display device 10_1, a third insulating layer PAS3 may be formed by an anisotropic etching process. Therefore, a connection electrode layer CNL may be partially etched through an opening area narrower than the opening OP.

Further, in a process of forming the opening OP of the second insulating layer PAS2, if the opening OP can be formed to have a width smaller than limit resolution of a mask for forming a photoresist PR, the distance W2 between the connection electrodes CNE may be further reduced. In some embodiments, the width W1 of the opening OP of the second insulating layer PAS2 may be half or less the length L of the light emitting element ED.

In the display device 10_1 according to the embodiment, a process of depositing a spacer SP (see FIG. 25) in a hole HL of the photoresist PR and etching a first insulating layer PIL1 may be performed in a process of forming the second insulating layer PAS2. The opening OP of the second insulating layer PAS2 may have the width W1 smaller than a width of the hole HL of the photoresist PR by a thickness of the spacer SP.

Figure 25:
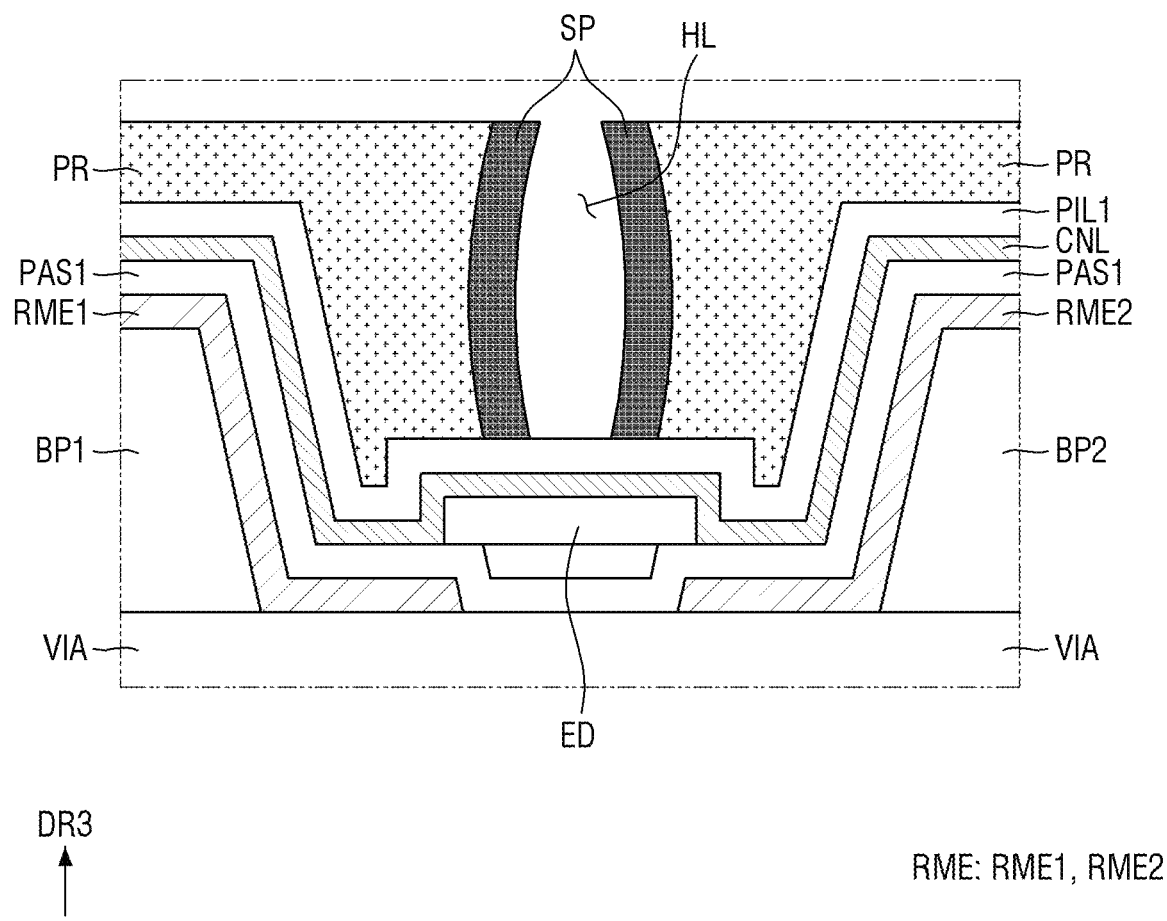
FIGS. 25 and 26 are schematic cross-sectional views illustrating an operation in a process of fabricating the display device of FIG. 24.
Figure 26:
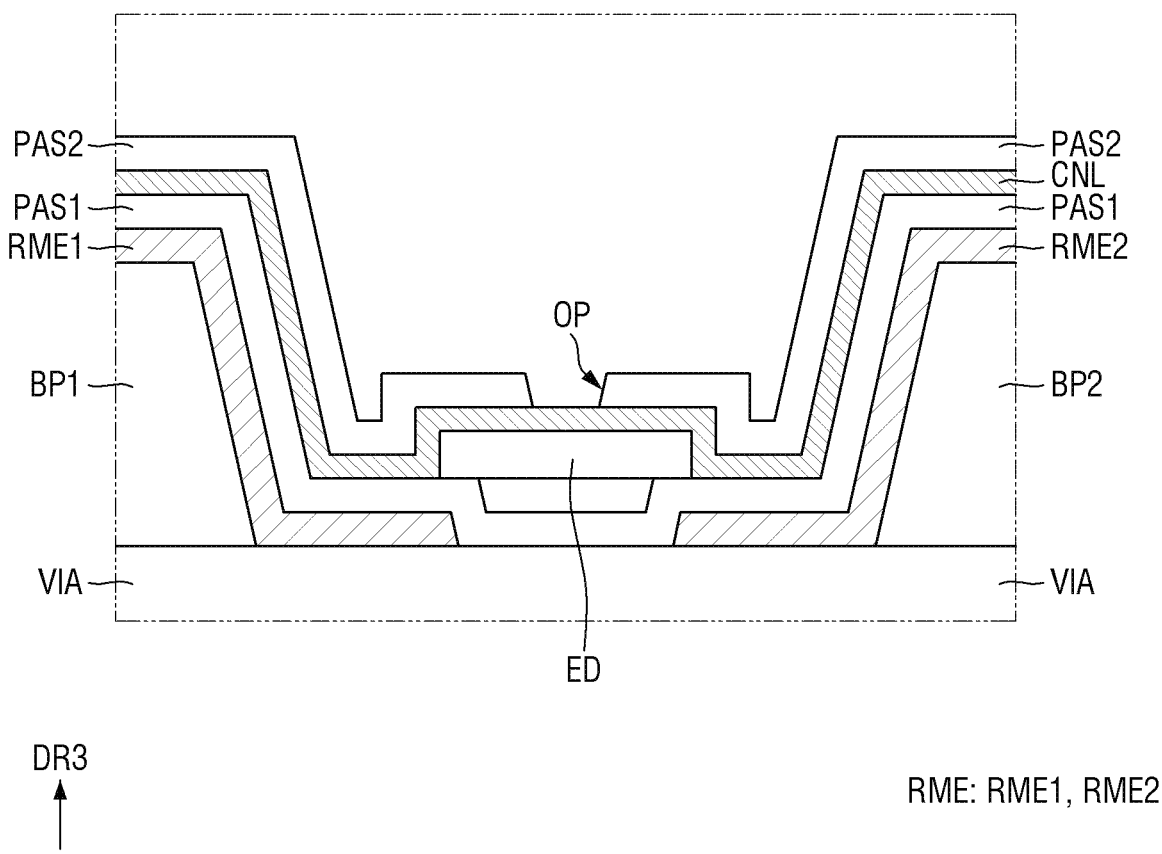

FIGS. 25 and 26 are schematic cross-sectional views illustrating an operation in a process of fabricating the display device 10_1 of FIG. 24.

Referring to FIGS. 25 and 26, in a method of fabricating the display device 10_1 according to the embodiment, a process of forming a spacer SP on inner sidewalls of a part in which parts of a photoresist PR are spaced apart from each other, may be performed in a process of forming a second insulating layer PAS2 by patterning a first insulating layer PIL1. The photoresist PR may be entirely disposed on the first insulating layer PIL1 but may include a hole HL formed in a part overlapping an area between bank patterns BP1 and BP2. After the photoresist PR is formed, the spacer SP is formed on inner sidewalls of the hole HL of the photoresist PR.

The spacer SP may have a thickness (e.g., a predetermined or selected thickness) and may be disposed on the inner sidewalls of the hole HL of the photoresist PR. The spacer SP may include an organic insulating material and may be formed by a deposition process. For example, the spacer SP having a uniform thickness may be formed on the inner sidewall of the hole HL of the photoresist PR and may surround an opening area in the hole HL of the photoresist PR. A part of the first insulating layer PIL1 which is exposed by the hole HL may be narrower than the hole HL by the thickness of the spacer SP.

The second insulating layer PAS2 is formed by etching a part of the first insulating layer PIL1 which is exposed in the opening area surrounded by the spacer SP. The second insulating layer PAS2 may include an opening OP having the same width as the opening area surrounded by the spacer SP. In the embodiment, the opening OP of the second insulating layer PAS2 may have a smaller width than that in an embodiment in which the first insulating layer PIL1 is etched along the photoresist PR having the hole HL. In the display device 10_1, the second insulating layer PAS2 having the opening OP narrower than limit resolution of a mask process for forming the photoresist PR may be formed, and connection electrodes CNE may be spaced apart from each other by a relatively smaller distance W2. The display device 10_1 can secure a margin for alignment of the photoresist PR and prevent a connection failure between the connection electrodes CNE and a light emitting element ED.

Although not illustrated in the drawings, a third insulating layer PAS3 may be formed in a subsequent process, and a connection electrode layer CNL may be etched to form the connection electrodes CNE spaced apart from each other.

As described above with reference to FIG. 23, the second insulating layer PAS2 may also be omitted if the opening area surrounded by the spacer SP formed in the hole HL of the photoresist PR can be formed to have a width sufficiently smaller than a length L of the light emitting element ED.

Figure 27:
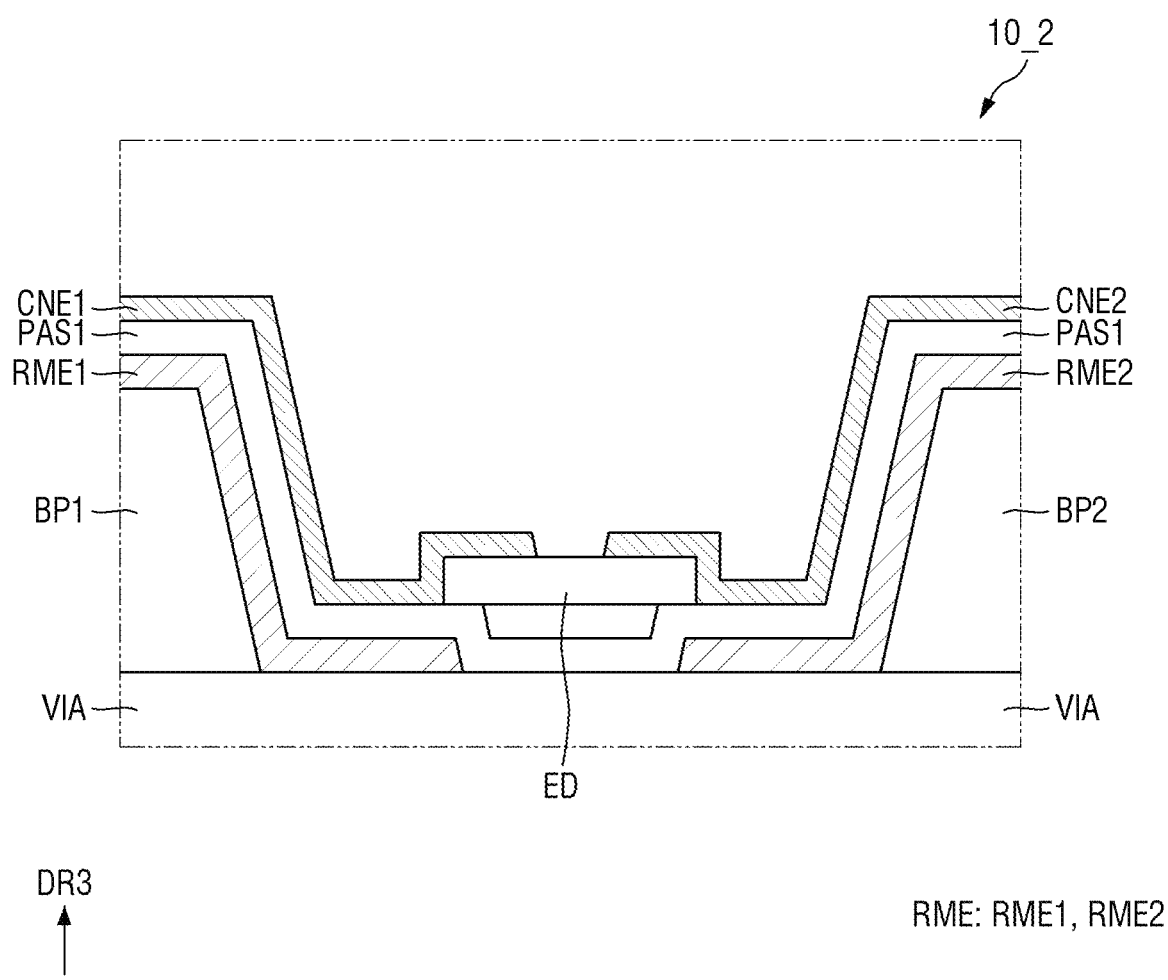
FIG. 27 is a schematic cross-sectional view of a part of a display device according to an embodiment.
Figure 28:
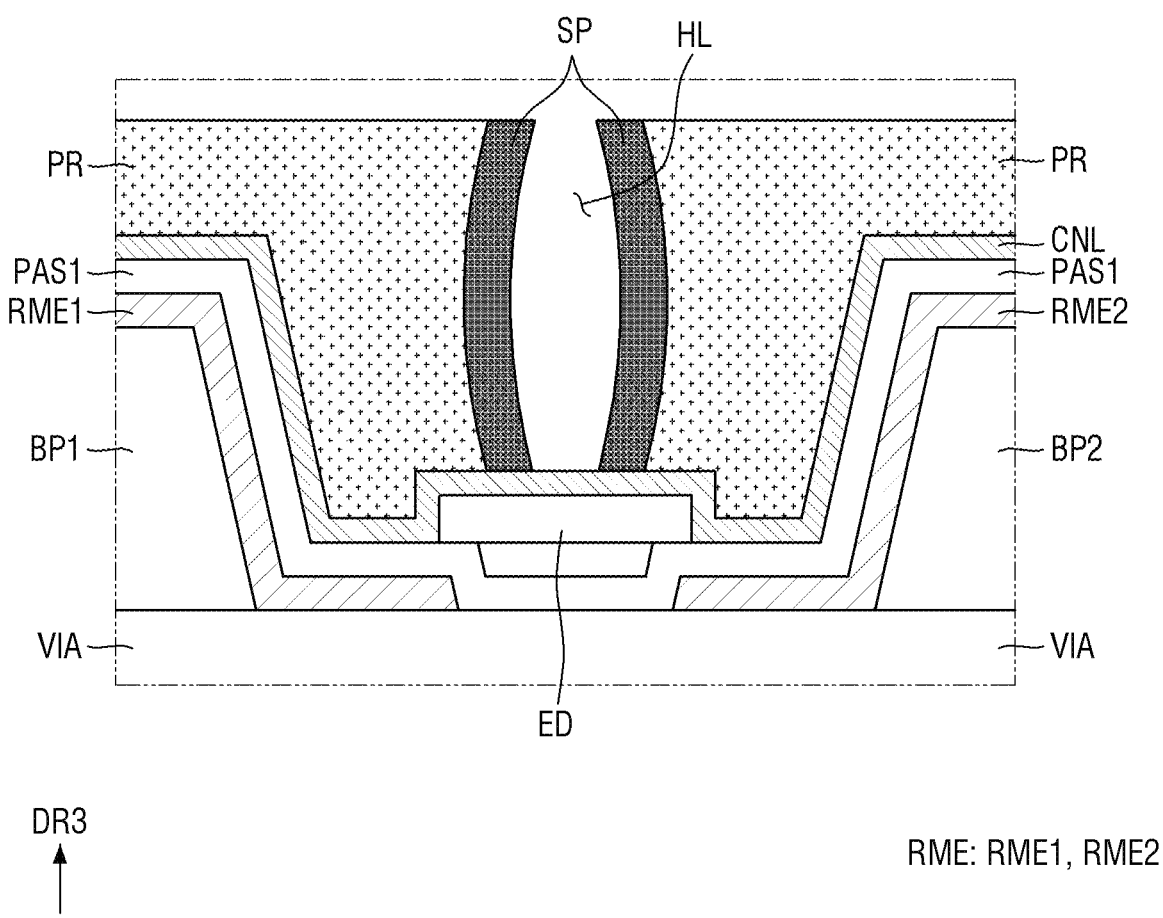
FIG. 28 is a schematic cross-sectional view illustrating an operation in a process of fabricating the display device according to another embodiment.

FIG. 27 is a schematic cross-sectional view of a part of a display device 10_2 according to an embodiment. FIG. 28 is a schematic cross-sectional view illustrating an operation in a process of fabricating the display device 10_2 according to another embodiment.

Referring to FIGS. 27 and 28, the display device 10_2 according to the embodiment may be fabricated in a fabrication process using a spacer SP, and a second insulating layer PAS2 and a third insulating layer PAS3 may be omitted.

In case that a photoresist PR is formed and the spacer SP is formed on inner sidewalls of a hole HL, even if the photoresist PR is formed at a position different from a designed position, an area exposed by the spacer SP may overlap a light emitting element ED. If the area exposed by the spacer SP can overlap the light emitting element ED even allowing for an alignment margin of a mask process for forming the photoresist PR, a connection electrode layer CNL can be patterned using the spacer SP and the photoresist PR as a mask. As illustrated in the drawings, after the connection electrode layer CNL is formed, the photoresist PR is directly formed on the connection electrode layer CNL without formation of a first insulating layer PIL1, and the spacer SP is formed in the hole HL of the photoresist PR. The opening area surrounded by the spacer SP may be positioned to overlap the light emitting element ED, and the connection electrode layer CNL may be etched along the opening area surrounded by the spacer SP to form connection electrodes CNE spaced apart from each other.

Figure 29:
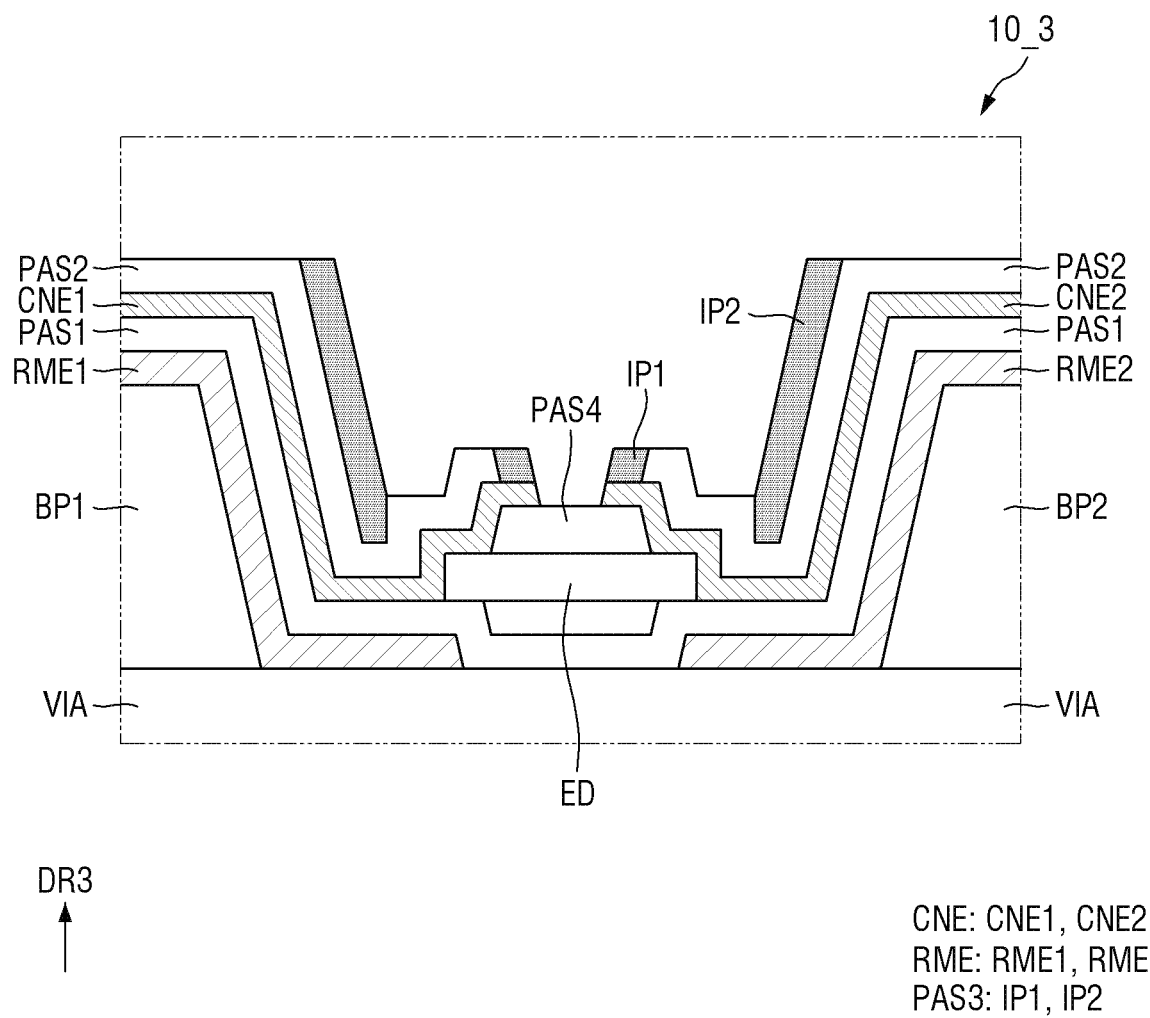
FIG. 29 is a schematic cross-sectional view of a part of a display device according to an embodiment.

FIG. 29 is a schematic cross-sectional view of a part of a display device 103 according to an embodiment.

Referring to FIG. 29, the display device 10_3 according to the embodiment may further include a fourth insulating layer PAS4 disposed between connection electrodes CNE1 and CNE2 and a light emitting element ED. The embodiment is different from the embodiment of FIG. 8 at least in that the display device 10_3 further includes the fourth insulating layer PAS4.

The fourth insulating layer PAS4 may be disposed on light emitting elements ED. The fourth insulating layer PAS4 may extend in the first direction DR1 between bank patterns BP1 and BP2 to partially cover outer surfaces of the light emitting elements ED and may not cover both sides or both ends of each light emitting element ED. The fourth insulating layer PAS4 may form a linear or island-shaped pattern in each subpixel SPXn in a plan view. The fourth insulating layer PAS4 may protect the light emitting elements ED while fixing the light emitting elements ED during a process of fabricating the display device 10_3. In addition, the fourth insulating layer PAS4 may fill a space between each of the light emitting elements ED and a first insulating layer PAS1 under the light emitting element ED. The display device 10_3 further including the fourth insulating layer PAS4 can prevent the light emitting elements ED from moving out of position during the fabrication process.

Figure 30:
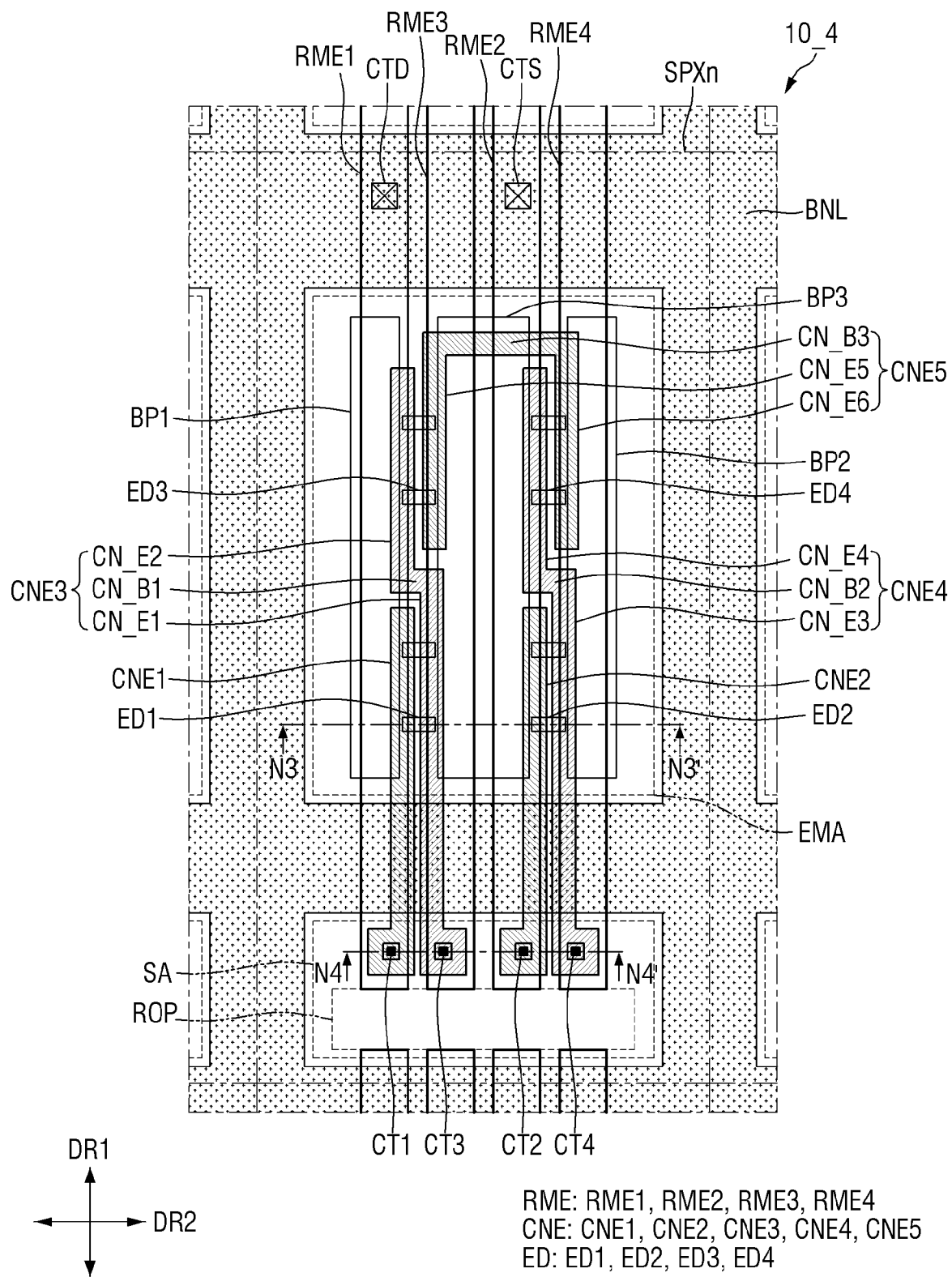
FIG. 30 is a schematic plan view of a subpixel of a display device according to an embodiment.
Figure 31:
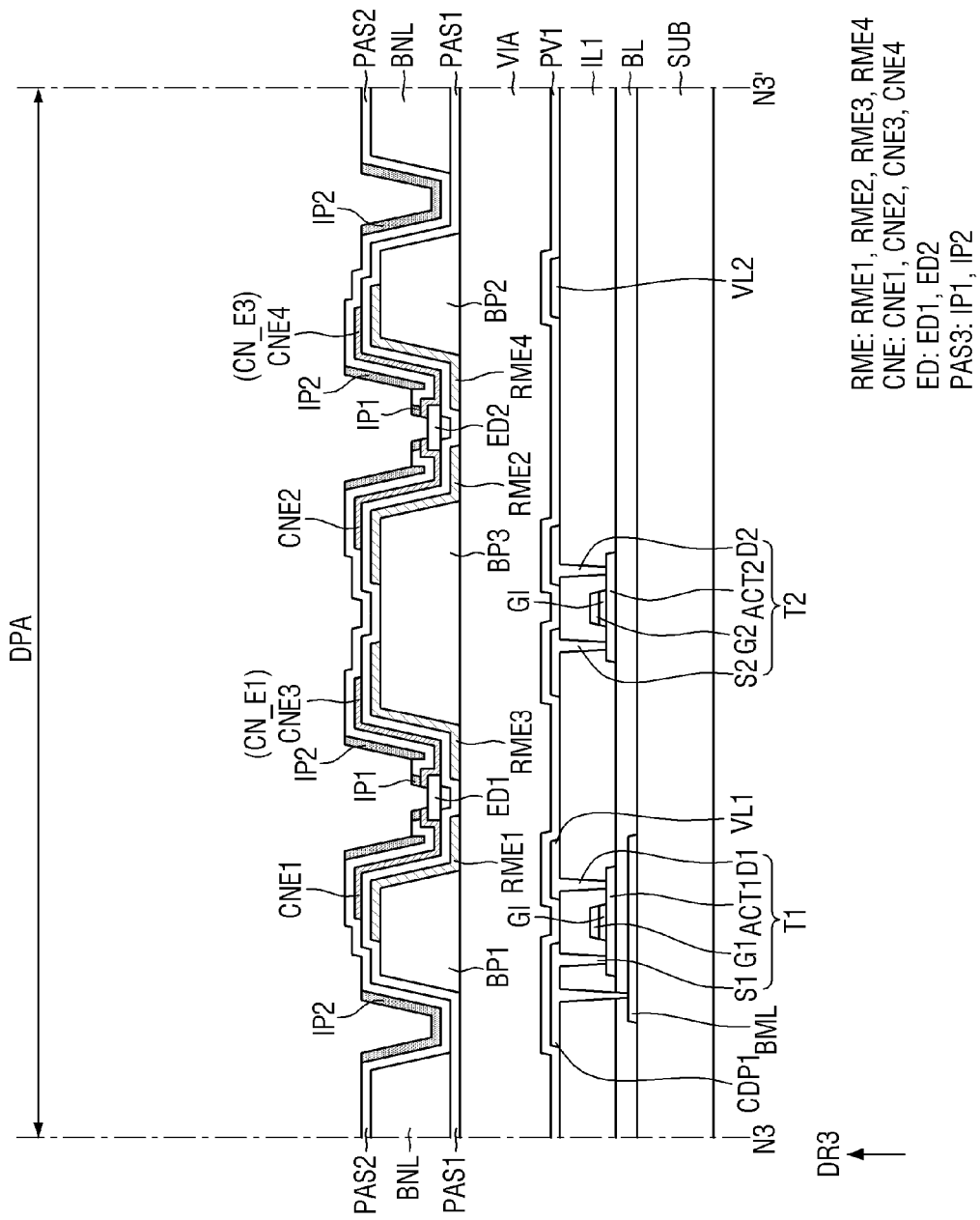
FIG. 31 is a schematic cross-sectional view taken along line N3-N3' of FIG. 30.
Figure 32:
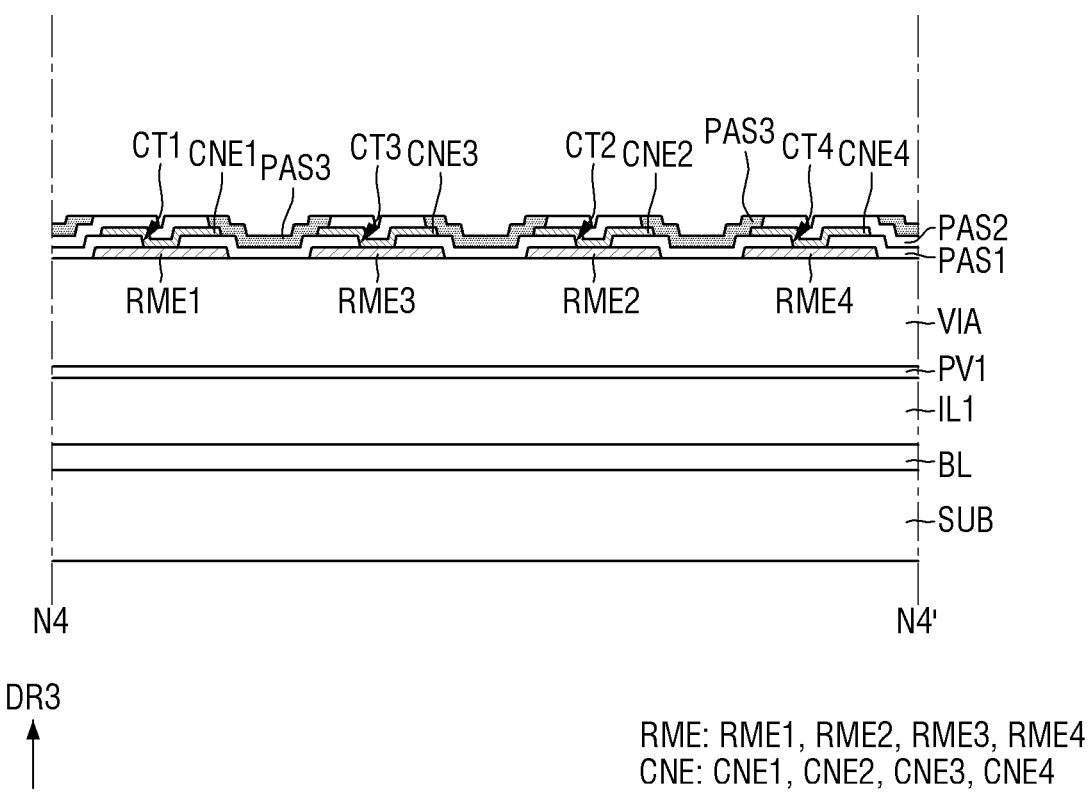
FIG. 32 is a schematic cross-sectional view taken along line N4-N4' of FIG. 30.

FIG. 30 is a schematic plan view of a subpixel SPXn of a display device 104 according to an embodiment. FIG. 31 is a schematic cross-sectional view taken along line N3-N3' of FIG. 30. FIG. 32 is a schematic cross-sectional view taken along line N4-N4' of FIG. 30.

FIG. 30 illustrates the planar arrangement of electrodes RME (RME1 to RME4), bank patterns BP1 to BP3, a bank layer BNL, light emitting elements ED, and connection electrodes CNE (CNE1 to CNE5) disposed in a pixel PX of the display device 10_4. FIG. 31 illustrates a cross section across both ends of the light emitting elements ED (ED1 to ED4) disposed on different electrodes RME, and FIG. 32 illustrates a cross section across contact parts CT1 to CT4.

Referring to FIGS. 30 to 32, the display device 10_4 according to the embodiment may include greater numbers of electrodes RME (RME1 to RME4), bank patterns BP1 to BP3, light emitting elements ED (ED1 to ED4), and connection electrodes CNE (CNE1 to CNE5). The display device 10_4 according to the embodiment is different from that of the embodiment of FIG. 4 at least in that it includes greater numbers of electrodes RME, light emitting elements ED, and connection electrodes CNE in each subpixel SPXn. Therefore, repetitive descriptions will be omitted, and differences will be mainly described below.

The bank patterns BP1 to BP3 may further include a third bank pattern BP3 disposed between a first bank pattern BP1 and a second bank pattern BP2. The first bank pattern BP1 may be disposed on a left side of the center of an emission area EMA, the second bank pattern BP2 may be disposed on a right side of the center of the emission area EMA, and the third bank pattern BP3 may be disposed in the center of the emission area EMA. A width of the third bank pattern BP3 measured in the second direction DR2 may be greater than those of the first bank pattern BP1 and the second bank pattern BP2. A distance between the bank patterns BP1 to BP3 in the second direction DR2 may be greater than a distance between the electrodes RME. The first bank pattern BP1 may partially overlap a first electrode RME1, and the second bank pattern BP2 may partially overlap a fourth electrode RME4. The third bank pattern BP3 may partially overlap a second electrode RME2 and a third electrode RME3. At least a part of each electrode RME may not overlap the bank patterns BP1 to BP3.

Electrodes RME disposed in each subpixel SPXn may include the third electrode RME3 and the fourth electrode RME4 in addition to the first electrode RME1 and the second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed between them. The electrodes RME may be sequentially disposed in the order of the first electrode RME1, the third electrode RME3, the second electrode RME2, and the fourth electrode RME4 from the left to the right of each subpixel SPXn. The electrodes RME may be spaced apart to face each other in the second direction DR2. The electrodes RME may be spaced apart from the electrodes RME of another adjacent subpixel SPXn in the first direction DR1 in a separation part ROP of a sub-area SA.

The first electrode RME1 and the second electrode RME2 among the electrodes RME may respectively contact a first conductive pattern CDP1 and a second voltage line VL2 thereunder through electrode contact holes CTD and CTS disposed under the bank layer BNL, but the third electrode RME3 and the fourth electrode RME4 may not contact them.

A first insulating layer PAS1 may be disposed in a structure similar to those of the above-described embodiments. The first insulating layer PAS1 may be entirely disposed in a display area DPA and may cover (or overlap in a plan view) the electrodes RME and the bank patterns BP1 to BP3.

Light emitting elements ED may be disposed between the bank patterns BP1 to BP3 or on different electrodes RME. Some of the light emitting elements ED may be disposed between the first bank pattern BP1 and the third bank pattern BP3, and the others may be disposed between the third bank pattern BP3 and the second bank pattern BP2. According to an embodiment, the light emitting elements ED may include first light emitting elements ED1 and third light emitting elements ED3 disposed between the first bank pattern BP1 and the third bank pattern BP3 and second light emitting elements ED2 and fourth light emitting elements ED4 disposed between the third bank pattern BP3 and the second bank pattern BP2. Each of the first light emitting elements ED1 and the third light emitting elements ED3 may be disposed on the first electrode RME1 and the third electrode RME3, and each of the second light emitting elements ED2 and the fourth light emitting elements ED4 may be disposed on the second electrode RME2 and the fourth electrode RME4. The first light emitting elements ED1 and the second light emitting elements ED2 may be disposed adjacent to a lower side or the sub-area SA in the emission area EMA of a corresponding subpixel SPXn, and the third light emitting elements ED3 and the fourth light emitting elements ED4 may be disposed adjacent to an upper side in the emission area EMA of the corresponding subpixel SPXn.

However, the light emitting elements ED are not classified according to their positions in the emission area EMA but may be classified according to their connection relationship with the connection electrodes CNE which will be described below. Both ends of each light emitting element ED may contact different connection electrodes CNE according to the arrangement structure of the connection electrodes CNE, and the light emitting elements ED may be classified into different light emitting elements ED according to types of the connection electrodes CNE that they contact.

Connection electrodes CNE may include a third connection electrode CNE3, a fourth connection electrode CNE4, and a fifth connection electrode CNE5 disposed across electrodes RME in addition to a first connection electrode CNE1 disposed on the first electrode RME1 and a second connection electrode CNE2 disposed on the second electrode RME2.

Unlike in the embodiment of FIGS. 4 to 8, each of the first connection electrode CNE1 and the second connection electrode CNE2 may have a relatively short length in the first direction DR1. The first connection electrode CNE1 and the second connection electrode CNE2 may be disposed below the center of the emission area EMA. The first connection electrode CNE1 and the second connection electrode CNE2 may be disposed over the emission area EMA and the sub-area SA of a corresponding subpixel SPXn and may directly contact the electrodes RME through the contact parts CT1 and CT2 formed in the sub-area SA, respectively. The first connection electrode CNE1 may directly contact the first electrode RME1 through a first contact part CT1 penetrating the first insulating layer PAS1 in the sub-area SA, and the second connection electrode CNE2 may contact the second electrode RME2 through a second contact part CT2 penetrating the first insulating layer PAS1 in the sub-area SA.

The third connection electrode CNE3 may include a first extension part CN_E1 disposed on the third electrode RME3, a second extension part CN_E2 disposed on the first electrode RME1, and a first connection part CN_B1 connecting the first extension part CN_E1 to the second extension part CN_E2. The first extension part CN_E1 may be spaced apart from the first connection electrode CNE1 in the second direction DR2 to face the first connection electrode CNE1, and the second extension part CN_E2 may be spaced apart from the first connection electrode CNE1 in the first direction DR1. The first extension part CN_E1 may be disposed on the lower side of the emission area EMA of a corresponding subpixel SPXn, and the second extension part CN_E2 may be disposed on the upper side of the emission area EMA. The first extension part CN_E1 and the second extension part CN_E2 may be disposed in the emission area EMA. The first connection part CN_B1 may be disposed across the first electrode RME1 and the third electrode RME3 in the center of the emission area EMA. The third connection electrode CNE3 may generally extend in the first direction DR1 but may be bent in the second direction DR2 and may extend again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 connecting the third extension part CN_E3 to the fourth extension part CN_E4. The third extension part CN_E3 may be spaced apart from the second connection electrode CNE2 in the second direction DR2 to face the second connection electrode CNE2, and the fourth extension part CN_E4 may be spaced apart from the second connection electrode CNE2 in the first direction DR1. The third extension part CN_E3 may be disposed on the lower side of the emission area EMA of a corresponding subpixel SPXn, and the fourth extension part CN_E4 may be disposed on the upper side of the emission area EMA. The third extension part CN_E3 and the fourth extension part CN_E4 may be disposed in the emission area EMA. The second connection part CN_B2 may be disposed across the second electrode RME2 and the fourth electrode RME4 in an area adjacent to the center of the emission area EMA. The fourth connection electrode CNE4 may generally extend in the first direction DR1 but may be bent in the second direction DR2 and may extend again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 connecting the fifth extension part CN_E5 to the sixth extension part CN_E6. The fifth extension part CN_E5 may be spaced apart from the second extension part CN_E2 of the third connection electrode CNE3 in the second direction DR2 to face the second extension part CN_E2, and the sixth extension part CN_E6 may be spaced apart from the fourth extension part CN_E4 of the fourth connection electrode CNE4 in the second direction DR2 to face the fourth extension part CN_E4. Each of the fifth extension part CN_E5 and the sixth extension part CN_E6 may be disposed on the upper side of the emission area EMA, and the third connection part CN_B3 may be disposed across the third electrode RME3, the second electrode RME2 and the fourth electrode RME4. The fifth connection electrode CNE5 may surround the fourth extension part CN_E4 of the fourth connection electrode CNE4 in a plan view.

The third connection electrode CNE3 may directly contact the third electrode RME3 through a third contact part CT3 penetrating the first insulating layer PAS1 in the sub-area SA, and the fourth connection electrode CNE4 may contact the fourth electrode RME4 through a fourth contact part CT4 penetrating the first insulating layer PAS1 in the sub-area SA.

However, the disclosure is not limited thereto. In some embodiments, in the display device 10_4, some of the connection electrodes CNE may be directly electrically connected to a third conductive layer. For example, each of the first connection electrode CNE1 and the second connection electrode CNE2 which are first type connection electrodes may be directly electrically connected to the third conductive layer and may not be electrically connected to the electrodes RME. A second type connection electrode and a third type connection electrode may also not be electrically connected to the electrodes RME and may be electrically connected only to the light emitting elements ED.

The first connection electrode CNE1 and the second connection electrode CNE2 may be first type connection electrodes electrically connected to the electrodes RME1 and RME2 directly electrically connected to the third conductive layer, respectively, the third connection electrode CNE3 and the fourth connection electrode CNE4 may be second type connection electrodes electrically connected to the electrodes RME3 and RME4 not electrically connected to the third conductive layer, and the fifth connection electrode CNE5 may be a third type connection electrode not electrically connected to the electrodes RME. The fifth connection electrode CNE5 may not be electrically connected to the electrodes RME but may contact the light emitting elements ED and may form an electrical connection circuit of the light emitting elements ED together with other connection electrodes CNE.

The third connection electrode CNE3 and the fourth connection electrode CNE4 which are second type connection electrodes may be connection electrodes in which electrode extension parts extending in the first direction DR1 are not side by side with each other in the second direction DR2, and the fifth connection electrode CNE5 which is a third type connection electrode may be a connection electrode in which electrode extension parts extending in the first direction DR1 are side by side with each other in the second direction DR2. The third connection electrode CNE3 and the fourth connection electrode CNE4 may extend in the first direction DR1 but may be bent, and the fifth connection electrode CNE5 may surround a part of another connection electrode.

The light emitting elements ED may be classified into different light emitting elements ED according to the connection electrodes CNE that both ends thereof contact in the above arrangement structure of the connection electrodes CNE. The first light emitting elements ED1 and the second light emitting elements ED2 may have a first end contacting a first type connection electrode and a second end contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. The third light emitting elements ED3 and the fourth light emitting elements ED4 may have a first end contacting a second type connection electrode and a second end contacting a third type connection electrode. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be electrically connected to each other in series through the connection electrodes CNE. Since the display device 10_4 according to the embodiment includes a greater number of light emitting elements ED in each subpixel SPXn and forms a series connection of the light emitting elements ED, the amount of light emitted per unit area can be further increased.

Figure 33:
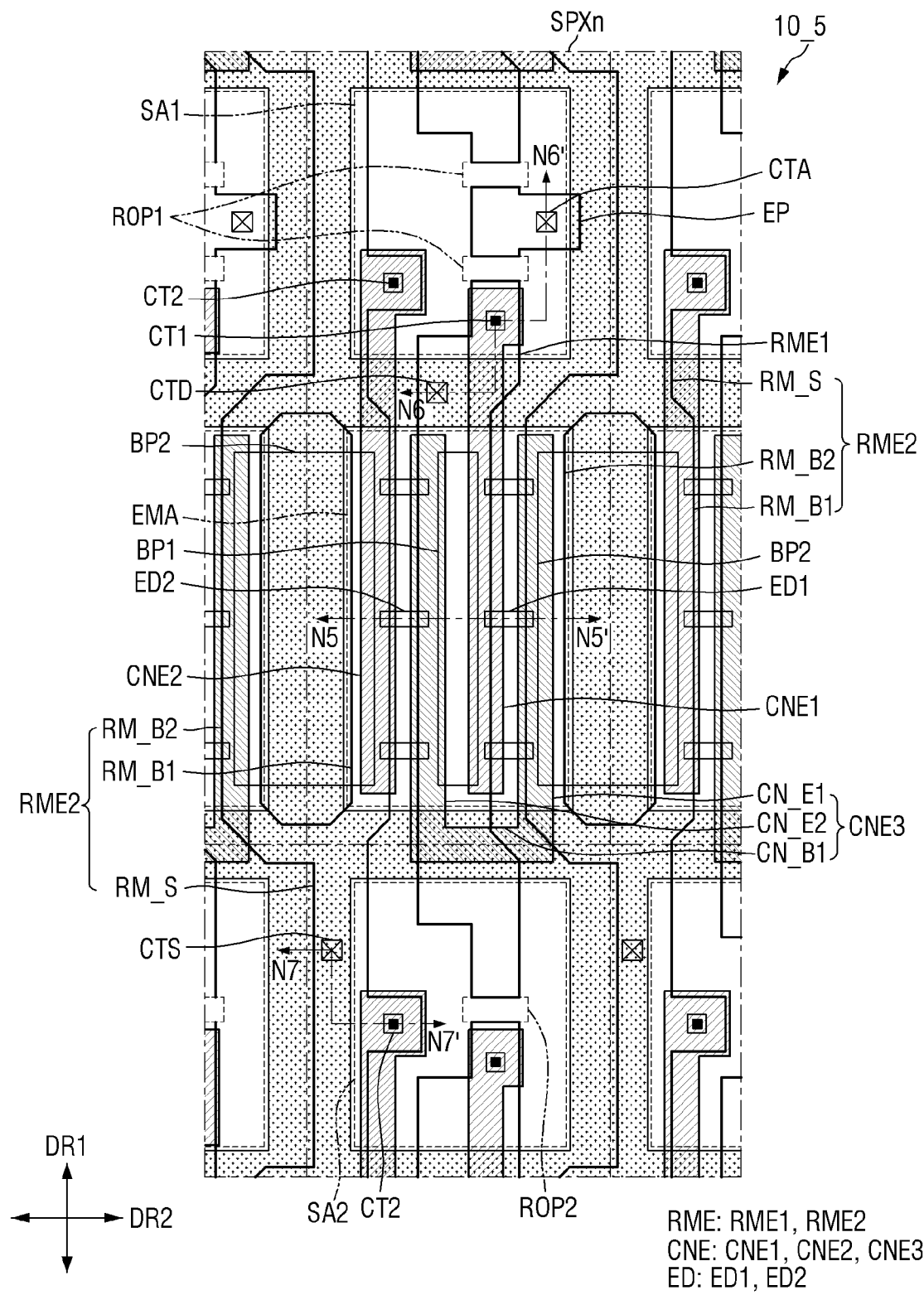
FIG. 33 is a schematic plan view of a subpixel of a display device according to an embodiment.
Figure 34:
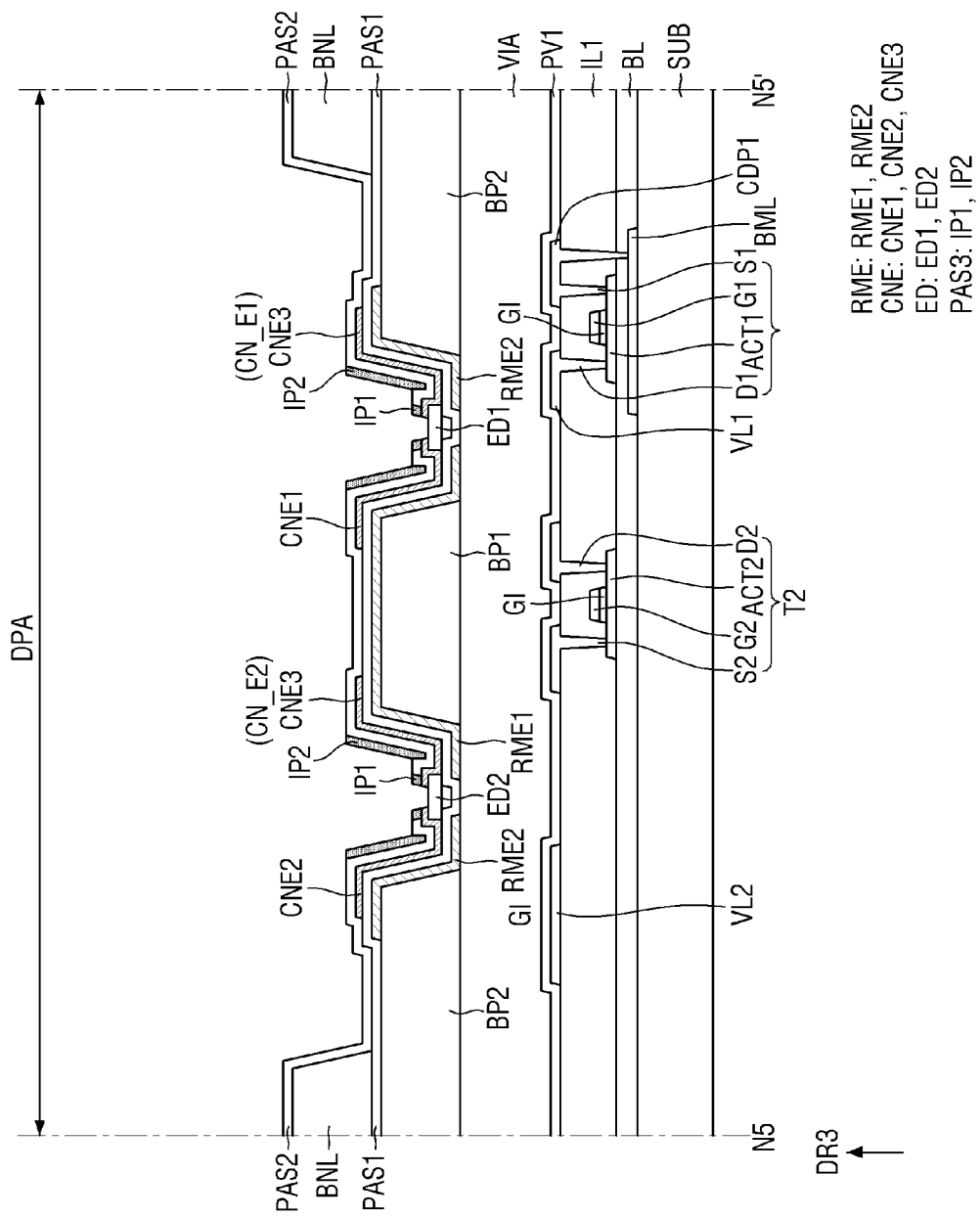
FIG. 34 is a schematic cross-sectional view taken along line N5-N5' of FIG. 33.
Figure 35:
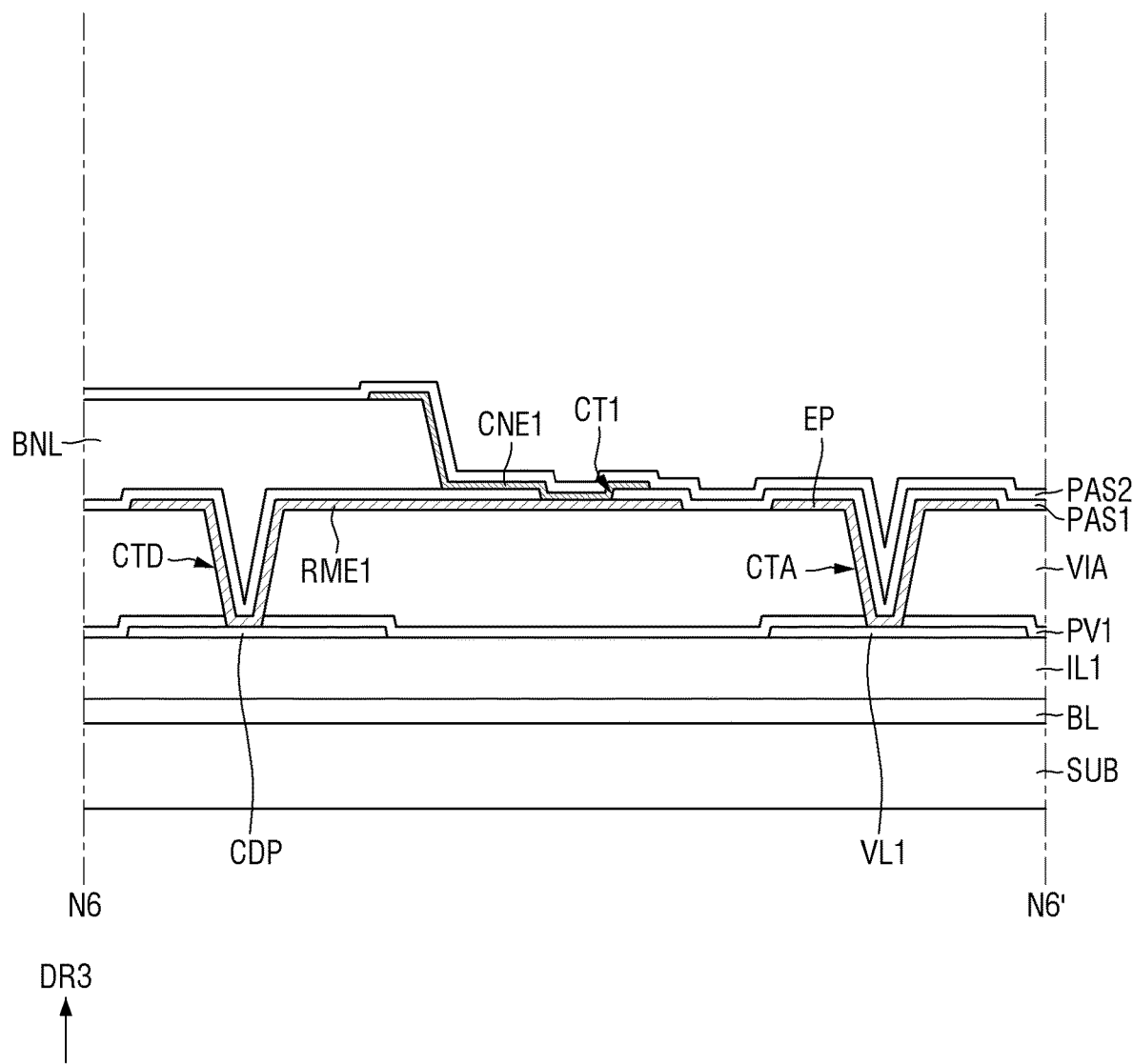
FIG. 35 is a schematic cross-sectional view taken along line N6-N6' of FIG. 33.
Figure 36:
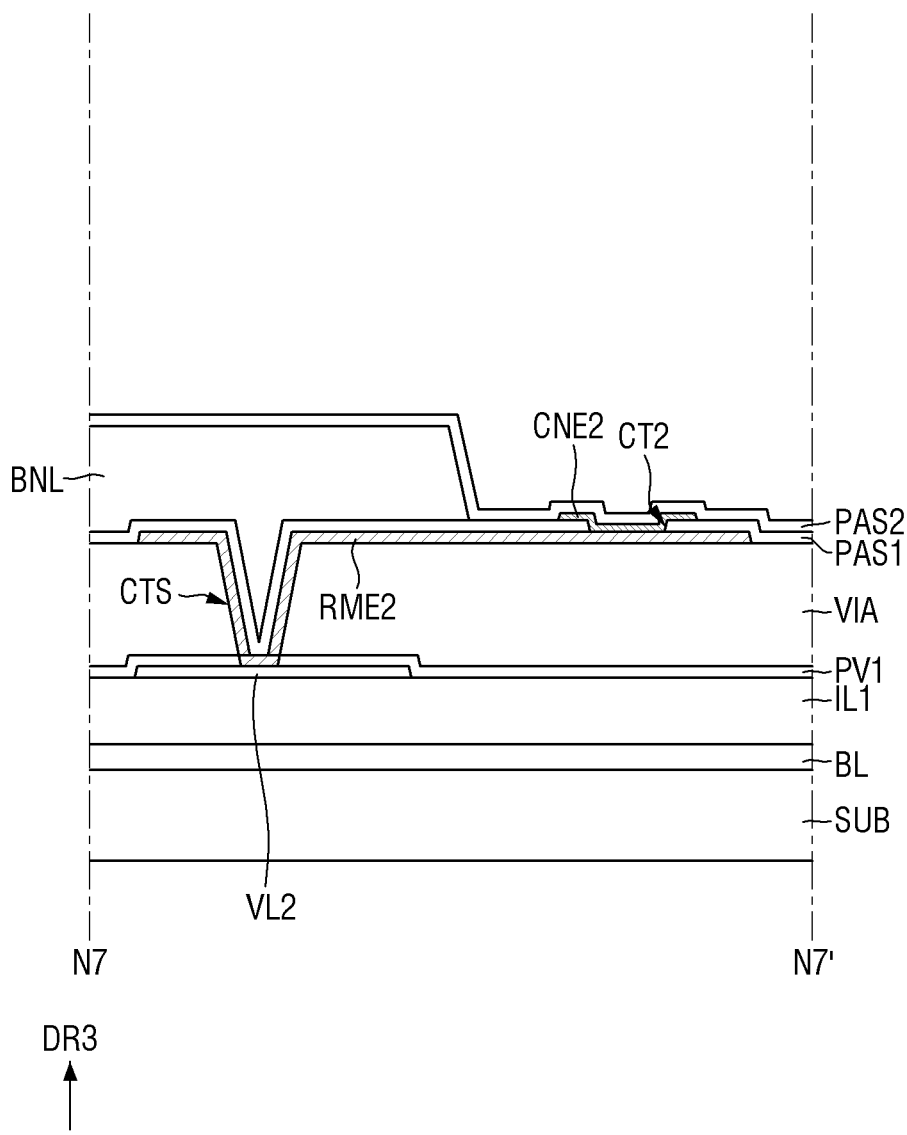
FIG. 36 is a schematic cross-sectional view taken along line N7-N7' of FIG. 33.

FIG. 33 is a schematic plan view of a subpixel SPXn of a display device 105 according to an embodiment. FIG. 34 is a schematic cross-sectional view taken along line N5-N5' of FIG. 33. FIG. 35 is a schematic cross-sectional view taken along line N6-N6' of FIG. 33. FIG. 36 is a schematic cross-sectional view taken along line N7-N7' of FIG. 33.

FIG. 33 illustrates the planar arrangement of electrodes RME (RME1 and RME2), bank patterns BP1 and BP2, a bank layer BNL, light emitting elements ED, and connection electrodes CNE (CNE1 to CNE3) disposed in a pixel PX of the display device 10_5. FIG. 34 illustrates a cross section across both ends of the light emitting elements ED (ED1 and ED2) disposed on different electrodes RME, and FIGS. 35 and 36 illustrate cross sections across electrode contact holes CTD, CTS, and CTA and contact parts CT1 and CT2.

Referring to FIGS. 33 to 36, the display device 10_5 according to the embodiment may be different from those of the above-described embodiments in the structure of the electrodes RME, the connection electrodes CNE, and the bank patterns BP1 and BP2. Therefore, repetitive descriptions already provided in the above embodiments will be omitted, and differences will be mainly described below.

Bank patterns BP1 and BP2 may extend in the first direction DR1 but may have different widths measured in the second direction DR2. One of the bank patterns BP1 and BP2 may be disposed over subpixels SPXn adjacent to each other in the second direction DR2. For example, the bank patterns BP1 and BP2 may include a first bank pattern BP1 disposed in an emission area EMA of each subpixel SPXn and a second bank pattern BP2 disposed over the emission areas EMA of different subpixels SPXn.

The first bank pattern BP1 is disposed in the center of the emission area EMA, and the second bank patterns BP2 are spaced apart from each other with the first bank pattern BP1 interposed between them. The first bank pattern BP1 and the second bank pattern BP2 may be alternately disposed in the second direction DR2. The light emitting elements ED may be disposed between the first bank pattern BP1 and the second bank pattern BP2 spaced apart from each other.

The first bank pattern BP1 and the second bank pattern BP2 may have a same length in the first direction DR1 but may have different widths measured in the second direction DR2. A part of the bank layer BNL which extends in the first direction DR1 may overlap the second bank pattern BP2 in the thickness direction. The first bank pattern BP1 may overlap a first electrode RME1, and the second bank pattern BP2 may overlap electrode branch parts RM_B1 and RM_B2 of a second electrode RME2 and the bank layer BNL.

The first bank pattern BP1 and the second bank pattern BP2 may have a same length in the first direction DR1 but may have different widths measured in the second direction DR2. A part of the bank layer BNL which extends in the first direction DR1 may overlap the second bank pattern BP2 in the thickness direction. The bank patterns BP1 and BP2 may be disposed in an island-shaped pattern in the entire display area DPA.

Electrodes RME include the first electrode RME1 disposed in the center of each subpixel SPXn and the second electrode RME2 disposed over different subpixels SPXn. The first electrode RME1 and the second electrode RME2 may generally extend in the first direction DR1, but parts of the first electrode RME1 and the second electrode RME2 which are disposed in the emission area EMA may have different shapes.

The first electrode RME1 may be disposed in the center of each subpixel SPXn, and a part thereof disposed in the emission area EMA may be disposed on the first bank pattern BP1. The first electrode RME1 may extend from a sub-area SA to the sub-area SA of another sub-pixel SPXn in the first direction DR1. The width of the first electrode RME1 measured in the second direction DR2 may vary according to positions, and at least a part thereof overlapping the first bank pattern BP1 in the emission area EMA may have a greater width than the first bank pattern BP1.

The second electrode RME2 may include a part extending in the first direction DR1 and parts branching in the vicinity of the emission area EMA. In an embodiment, the second electrode RME2 may include an electrode stem part RM_S extending in the first direction DR1 and electrode branch parts RM_B1 and RM_B2 branching from the electrode stem part RM_S, bent in the second direction DR2, and extending again in the first direction DR1. The electrode stem part RM_S may overlap a part of the bank layer BNL which extends in the first direction DR1, and may be disposed on a side of the sub-area SA in the second direction DR2. The electrode branch parts RM_B1 and RM_B2 may branch from the electrode stem part RM_S disposed in a part of the bank layer BNL which extends in the first direction DR1 and a part of the bank layer BNL which extends in the second direction DR2, and may be bent to both sides in the second direction DR2. The electrode branch parts RM_B1 and RM_B2 may extend across the emission area EMA in the first direction DR1 and may be bent again to be integrally electrically connected to the electrode stem part RM_S. For example, the electrode branch parts RM_B1 and RM_B2 of the second electrode RME2 may branch on an upper side of the emission area EMA of a subpixel SPXn and may be electrically connected to each other again on a lower side of the emission area EMA.

The second electrode RME2 may include a first electrode branch part RM_B1 disposed on a left side of the first electrode RME1 and a second electrode branch part RM_B2 disposed on a right side of the first electrode RME1. The electrode branch parts RM_B1 and RM_B2 included in a second electrode RME2 may be respectively disposed in the emission areas EMA of subpixels SPXn adjacent to each other in the second direction DR2, and the electrode branch parts RM_B1 and RM_B2 of different second electrodes RME2 may be disposed in a subpixel SPXn. The first electrode branch part RM_B1 of the second electrode RME2 may be disposed on the left side of the first electrode RME1, and the second electrode branch part RM_B2 of another second electrode RME2 may be disposed on the right side of the first electrode RME1.

Each of the electrode branch parts RM_B1 and RM_B2 of the second electrode RME2 may overlap a side of the second bank pattern BP2. The first electrode branch part RM_B1 may partially overlap the second bank pattern BP2 disposed on a left side of the first bank pattern BP1, and the second electrode branch part RM_B2 may partially overlap the second bank pattern BP2 disposed on a right side of the first bank pattern BP1. Both sides of the first electrode RME1 may be spaced apart from different electrode branch parts RM_B1 and RM_B2 of different second electrodes RME2 to face them, and a distance between the first electrode RME1 and each of the electrode branch parts RM_B1 and RM_B2 may be smaller than a distance between the bank patterns BP1 and BP2.

In addition, a width of the first electrode RME1 measured in the second direction DR2 may be greater than widths of the electrode stem part RM_S and the electrode branch parts RM_B1 and RM_B2 of the second electrode RME2. The first electrode RME1 may have a greater width than the first bank pattern BP1 to overlap both sides of the first bank pattern BP1, but the second electrode RME2 may have a relatively small width so that each of the electrode branch parts RM_B1 and RM_B2 overlaps only a side of the second bank pattern BP2.

The first electrode RME1 may contact a first conductive pattern CDP of a third conductive layer through a first electrode contact hole CTD in a part thereof overlapping a part of the bank layer BNL which extends in the second direction DR2. The second electrode RME2 may contact a second voltage line VL2 of the third conductive layer through a second electrode contact hole CTS in the electrode stem part RM_S. A part of the first electrode RME1 which is disposed in the sub-area SA may overlap a first contact part CT1, and the second electrode RME2 may include a part protruding from the electrode stem part RM_S in the second direction DR2 to lie in the sub-area SA and may overlap a second contact part CT2 in the protruding part.

The first electrode RME1 may be disposed up to separation parts ROP1 and ROP2 of the sub-areas SA, but the second electrode RME2 may not be separated in the sub-areas SA. A second electrode RME2 may include electrode stem parts RM_S and electrode branch parts RM_B1 and RM_B2 to extend in the first direction DR1 and may branch in the vicinity of the emission area EMA of each subpixel SPXn. The first electrode RME1 may be disposed between the separation parts ROP1 and ROP2 disposed in different sub-areas SA1 and SA2 of each subpixel SPXn and may be disposed across the emission area EMA.

According to an embodiment, the display device 10_5 may include a wiring connection electrode EP disposed in a first sub-area SA1 among sub-areas SA1 and SA2 and disposed between the first electrodes RME1 of different subpixels SPXn. The wiring connection electrode EP may not be disposed in a second sub-area SA2 of each subpixel SPXn, and the first electrodes RME1 of different subpixels SPXn adjacent to each other in the first direction DR1 may be spaced apart from each other in the second sub-area SA2. In the subpixel SPXn illustrated in FIG. 33 among subpixels SPXn, the first sub-area SA1 in which the wiring connection electrode EP is disposed may be disposed above the emission area EMA, and the second sub-area SA2 may be disposed below the emission area EMA. On the other hand, in a subpixel SPXn adjacent to the subpixel SPXn of FIG. 33 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced apart from the wiring connection electrode EP with a first separation part ROP1 interposed between them in the first sub-area SA1. Two first separation parts ROP1 may be disposed in a first sub-area SA1. The wiring connection electrode EP may be spaced apart from the first electrode RME1 disposed in a corresponding subpixel SPXn with a lower first separation part ROP1 interposed between them and may be spaced apart from the first electrode RME1 disposed in another subpixel SPXn with an upper first separation part ROP interposed between them. A second separation part ROP2 may be disposed in the second sub-area SA2, and different first electrodes RME1 may be spaced apart from each other in the first direction DR1.

In an embodiment, the wiring connection electrode EP may be electrically connected to a first voltage line VL1 of the third conductive layer through a third electrode contact hole CTA penetrating a via layer VIA. The first electrode RME1 may be formed to be electrically connected to the wiring connection electrode EP, and an electrical signal transmitted to place the light emitting elements ED may be transmitted from the first voltage line VL1 to the first electrode RME1 through the wiring connection electrode EP. In a process of placing the light emitting elements ED, signals may be transmitted to each of the first voltage line VL1 and the second voltage line VL2, and these signals may be transmitted to the first electrode RME1 and the second electrode RME2, respectively.

The relative position of the second electrode contact hole CTS may be different from that of the third electrode contact hole CTA to be described below. The second electrode contact hole CTS may be disposed in a part of the bank layer BNL which surrounds the second sub-area SA2, and the third electrode contact hole CTA may be disposed in the first sub-area SA1. For example, since the second electrode contact hole CTS and the third electrode contact hole CTA expose upper surfaces of different voltage lines VL1 and VL2, respectively, the position of each electrode contact hole may be determined accordingly.

The bank layer BNL may surround the emission area EMA and the sub-areas SA1 and SA2 as in the above-described embodiments. However, in an embodiment in which the display device 10_5 includes the sub-areas SA1 and SA2 separated from each other, the areas surrounded by the bank layer BNL may be separated from each other. The bank layer BNL is the same as those of the above-described embodiments except that it surrounds different sub-areas SA1 and SA2.

Light emitting elements ED may be disposed on different electrodes RME between different bank patterns BP1 and BP2. The light emitting elements ED may include first light emitting elements ED1 having both ends disposed on the first electrode RME1 and the second electrode branch part RM_B2 of the second electrode RME2 and second light emitting elements ED2 having both ends disposed on the first electrode RME1 and the first electrode branch part RM_B1 of another second electrode RME2. The first light emitting elements ED1 may be disposed on the right side of the first electrode RME1, and the second light emitting elements ED2 may be disposed on the left side of the first electrode RME1. The first light emitting elements ED1 may be disposed on the first electrode RME1 and the second electrode RME2, and the second light emitting elements ED2 may be disposed on the first electrode RME1 and the second electrode RME2.

Connection electrodes CNE (CNE1 to CNE3) may include a first connection electrode CNE1, a second connection electrode CNE2, and a third connection electrode CNE3.

The first connection electrode CNE1 may extend in the first direction DR1 and may be disposed on the first electrode RME1. A part of the first connection electrode CNE1 which is disposed on the first bank pattern BP1 may overlap (e.g., in a plan view) the first electrode RME1 and may extend in the first direction DR1 to the first sub-area SA1 located above the emission area EMA beyond the bank layer BNL. The first connection electrode CNE1 may contact the first electrode RME1 through the first contact part CT1 in the first sub-area SA1.

The second connection electrode CNE2 may extend in the first direction DR1 and may be disposed on the second electrode RME2. A part of the second connection electrode CNE2 which is disposed on the second bank pattern BP2 may overlap the second electrode RME2 and may extend in the first direction DR1 to the first sub-area SA1 located above the emission area EMA beyond the bank layer BNL. The second connection electrode CNE2 may contact the second electrode RME2 through the second contact part CT2 in the first sub-area SA1.

In a subpixel SPXn adjacent to the subpixel SPXn of FIG. 33 in the first direction DR1, the first connection electrode CNE1 and the second connection electrode CNE2 may respectively contact the first electrode RME1 and the second electrode RME2 through the contact parts CT1 and CT2 disposed in the second sub-area SA2.

The third connection electrode CNE3 may include extension parts CN_E1 and CN_E2 extending in the first direction DR1 and a first connection part CN_B1 connecting the extension parts CN_E1 and CN_E2 to each other. The first extension part CN_E1 faces the first connection electrode CNE1 in the emission area EMA and is disposed on the second electrode branch part RM_B2 of the second electrode RME2. The second extension part CN_E2 faces the second connection electrode CNE2 in the emission area EMA and is disposed on the first electrode RME1. The first connection part CN_B1 may extend in the second direction DR2 on the bank layer BNL disposed below the emission area EMA to connect the first extension part CN_E1 to the second extension part CN_E2. The third connection electrode CNE3 may be disposed in the emission area EMA and on the bank layer BNL and may not be directly electrically connected to the electrodes RME. The second electrode branch part RM_B2 disposed under the first extension part CN_E1 may be electrically connected to the second voltage line VL2, but a second power supply voltage applied to the second electrode branch part RM_B2 may not be transmitted to the third connection electrode CNE3.

A display device according to an embodiment may be fabricated by a process of separating connection electrodes by using layers, and the connection electrodes may be spaced apart from each other by a small distance beyond the process resolution of a patterning process using a mask. Accordingly, it is possible to prevent a contact failure between a connection electrode and a light emitting element due to an alignment error in a mask process.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode and a second electrode spaced apart from each other on a substrate;
   a first insulating layer disposed on the substrate and covering the first electrode and the second electrode;
   light emitting elements disposed on the first insulating layer and having ends disposed on the first electrode and the second electrode;
   a first connection electrode disposed on the first electrode and electrically contacting an end of each of the light emitting elements;
   a second connection electrode spaced apart from the first connection electrode, disposed on the second electrode, and electrically contacting another end of each of the light emitting elements;
   a second insulating layer disposed on the first insulating layer and at least partially covering the first connection electrode and the second connection electrode; and
   a third insulating layer disposed on part of the second insulating layer and comprising openings exposing other parts of the second insulating layer,
   wherein the second insulating layer comprises an opening overlapping in a plan view a part between the first connection electrode and the second connection electrode,
   wherein a width of the opening of the second insulating layer is greater than a distance between the first connection electrode and the second connection electrode, and
   wherein the third insulating layer covers areas of the first connection electrode and the second connection electrode exposed by the second insulating layer in the opening and side surfaces of the third insulating layer align with side surfaces of the first connection electrode and the second connection electrode in the opening.

2. The display device of claim 1, wherein
the opening of the second insulating layer overlaps in the plan view a side of the first connection electrode and a side of the second connection electrode that face each other.

3. The display device of claim 2, wherein
the opening of the second insulating layer overlaps the light emitting elements in the plan view, and
the width of the opening of the second insulating layer is smaller than a length of each of the light emitting elements.

4. The display device of claim 1, wherein
the first connection electrode electrically contacts the first electrode through a first contact part penetrating the first insulating layer, and
the second connection electrode electrically contacts the second electrode through a second contact part penetrating the first insulating layer.

5. The display device of claim 1, wherein
a center of the opening of the second insulating layer is side by side with a center of each of the light emitting elements,
the first connection electrode directly contacts end surfaces and part of a side surface of each of the light emitting elements, and
the second connection electrode directly contacts end surfaces and part of a side surface of each of the light emitting elements.

6. The display device of claim 1, wherein
a center of the opening of the second insulating layer is not side by side with a center of each of the light emitting elements,
the first connection electrode electrically contacts an end surface of each of the light emitting elements, and
the second connection electrode directly contacts another end surface and part of a side surface of each of the light emitting elements.

7. The display device of claim 1, wherein the third insulating layer comprises a first insulating pattern disposed on inner sidewalls of the opening of the second insulating layer.

8. The display device of claim 7, wherein a side of the first connection electrode which electrically contacts the light emitting elements and a side of the second connection electrode which electrically contacts the light emitting elements are side by side with sidewalls of the first insulating pattern, respectively.

9. The display device of claim 1, further comprising:
a first bank pattern disposed between the first electrode and the substrate; and
a second bank pattern disposed between the second electrode and the substrate, wherein
the first connection electrode overlaps the first bank pattern in the plan view, and
the second connection electrode overlaps the second bank pattern in the plan view.

10. The display device of claim 9, wherein the light emitting elements are disposed between the first bank pattern and the second bank pattern.

11. The display device of claim 9, wherein
the third insulating layer comprises second insulating patterns overlapping corresponding sidewalls of the first bank pattern and the second bank pattern in directions perpendicular to the corresponding sidewalls of the first bank pattern and the second bank pattern, and
the second insulating patterns are disposed on the second insulating layer.

12. The display device of claim 1, wherein
the first electrode and the second electrode extend in a first direction and are spaced apart from each other in a second direction different from the first direction,
the light emitting elements are arranged in the first direction, and
the opening of the second insulating layer extends in the first direction.

13. The display device of claim 12, further comprising:
a bank layer extending in the first direction and the second direction on the first insulating layer and surrounding a part where the light emitting elements are disposed,
wherein each of the first connection electrode and the second connection electrode extends in the first direction such that part of the first connection electrode and part of the second connection electrode are disposed on the bank layer.

14. The display device of claim 1, further comprising:
a first bank pattern disposed between the first electrode and the substrate; and
a second bank pattern disposed between the second electrode and the substrate, wherein
the other parts of the second insulating layer comprise:
a first other part overlapping the first bank pattern in a thickness direction of the substrate; and
a second other part overlapping the second bank pattern in the thickness direction, the second other part being spaced apart from the first other part, and
the openings in the third insulating layer comprise:
a first opening overlapping the first other part in the thickness direction; and
a second opening overlapping the second other part in the thickness direction.

15. The display device of claim 14, wherein
the first other part at least partially covers at least one end of the first connection electrode, and
the second other part at least partially covers at least one end of the second connection electrode.

16. An electronic device comprising:
a display device, the display device comprising:
a first bank pattern disposed on a surface of a substrate;
a second bank pattern disposed on the surface and spaced apart from the first bank pattern;
a first electrode at least partially overlapping the first bank pattern in a direction orthogonal to the surface;
a second electrode spaced apart from the first electrode and at least partially overlapping the second bank pattern in the direction;
a first insulating layer disposed on the surface, the first insulating layer covering the first electrode and the second electrode;
light emitting elements disposed on the first insulating layer between the first bank pattern and the second bank pattern, the light emitting elements having corresponding first ends and corresponding second ends respectively opposing the corresponding first ends;
a first connection electrode disposed on the first electrode and electrically contacting the corresponding first ends;
a second connection electrode spaced apart from the first connection electrode and disposed on the second electrode, the second connection electrode electrically contacting the corresponding second ends;

a second insulating layer disposed on the first insulating layer, the second insulating layer at least partially covering the first connection electrode and the second connection electrode; and a third insulating layer disposed on a first part of the second insulating layer, wherein the second insulating layer comprises an opening overlapping, in the direction, a part between the first connection electrode and the second connection electrode, a width of the opening of the second insulating layer is greater than a distance between the first connection electrode and the second connection electrode, the third insulating layer covers areas of the first connection electrode and the second connection electrode exposed by the second insulating layer in the opening and surfaces of the third insulating layer align with surfaces of the first connection electrode and the second connection electrode in the opening, and the third insulating layer comprises:
- a first opening overlapping both the first connection electrode and the first bank pattern in the direction; and
- a second opening overlapping both the second connection electrode and the second bank pattern in the direction.

17. The electronic device of claim 16, wherein
the first opening overlaps a first end of the first connection electrode in the direction, and
the second opening overlaps a second end of the second connection electrode in the direction.

18. The electronic device of claim 16, wherein
the first bank pattern comprises a first uppermost portion disposed furthest from the surface,
the second bank pattern comprises a second uppermost portion disposed furthest from the surface,
the first opening overlaps the first uppermost portion in the direction, and
the second opening overlaps the second uppermost portion in the direction.

19. The electronic device of claim 18, wherein
the first opening exposes a second part of the second insulating layer, and
the second opening exposes a third part of the second insulating layer, the third part being spaced apart from the second part.

20. The electronic device of claim 19, wherein
the second part overlaps the first uppermost portion in the direction, and
the third part overlaps the second uppermost portion in the direction.

* * * * *